US012167652B2

(12) United States Patent
Cho et al.

(10) Patent No.: US 12,167,652 B2
(45) Date of Patent: Dec. 10, 2024

(54) DISPLAY DEVICE

(71) Applicant: Samsung Display Co., LTD., Yongin-si (KR)

(72) Inventors: Seung Hwan Cho, Yongin-si (KR); Beom Yeol Park, Suwon-si (KR); Hyeon Woo Shin, Suwon-si (KR); Ji Seon Lee, Hwaseong-si (KR); Won Suk Choi, Seoul (KR); Yoon Sun Choi, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 458 days.

(21) Appl. No.: 17/689,084

(22) Filed: Mar. 8, 2022

(65) Prior Publication Data

US 2022/0406872 A1    Dec. 22, 2022

(30) Foreign Application Priority Data

Jun. 22, 2021    (KR) .......................... 10-2021-0080572

(51) Int. Cl.
  *H10K 59/131*    (2023.01)
  *H10K 59/126*    (2023.01)

(52) U.S. Cl.
  CPC ......... *H10K 59/131* (2023.02); *H10K 59/126* (2023.02)

(58) Field of Classification Search
  None
  See application file for complete search history.

(56) References Cited

U.S. PATENT DOCUMENTS

| | | | |
|---|---|---|---|
| 2013/0048990 A1* | 2/2013 | Park | H01L 27/1259 438/34 |
| 2020/0058723 A1* | 2/2020 | Lee | H10K 59/123 |
| 2020/0110497 A1* | 4/2020 | Jin | G06F 3/0446 |
| 2021/0183979 A1* | 6/2021 | Lee | H10K 59/1315 |
| 2022/0336563 A1* | 10/2022 | Cho | G09G 3/3241 |
| 2022/0406872 A1* | 12/2022 | Cho | H10K 59/131 |

FOREIGN PATENT DOCUMENTS

| CN | 115377165 A | * | 11/2022 |
|---|---|---|---|
| KR | 10-2019-0051513 | | 5/2019 |
| KR | 10-2022-0144451 | | 10/2022 |

* cited by examiner

*Primary Examiner* — Michael Lebentritt
(74) *Attorney, Agent, or Firm* — KILE PARK REED & HOUTTEMAN PLLC

(57) ABSTRACT

A display device includes a driving transistor; a transistor connected to the driving transistor; a first insulating layer; a first data conductive layer including a first connection pattern; a second insulating layer including a lower via hole; a second data conductive layer including a second connection pattern connected to the first connection pattern and a first conductive line; a third insulating layer including an intermediate via hole; a third data conductive layer including a third connection pattern connected to the second connection pattern, a second conductive line extending in a second direction, and a first data line which extends in the second direction; a fourth insulating layer including an upper via hole; and a light emitting element disposed including a first electrode, wherein at least two of the lower via hole, the intermediate via hole, and the upper via hole overlap each other in a third direction.

20 Claims, 36 Drawing Sheets

FIG. 7
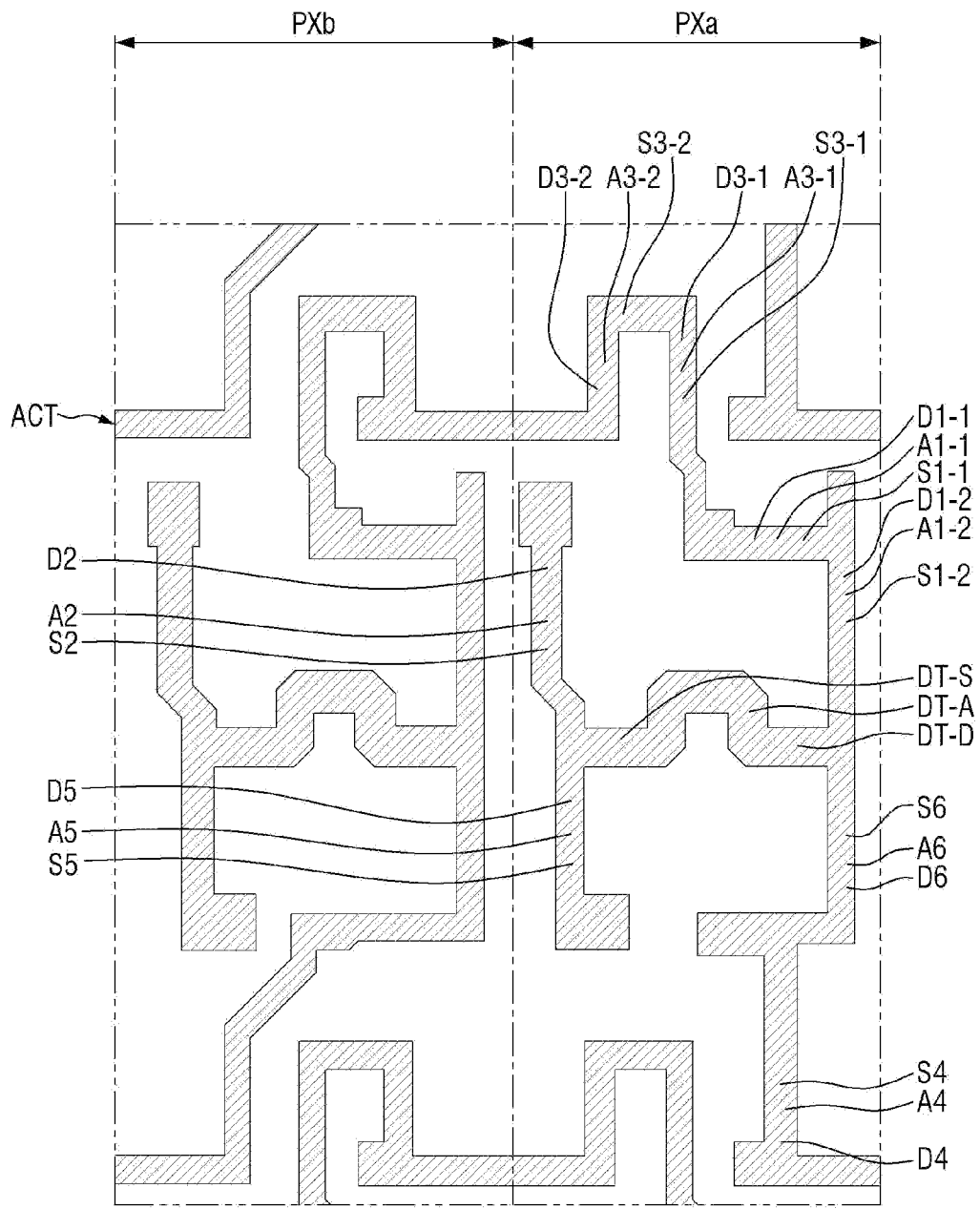
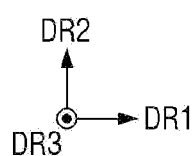

DISPLAY DEVICE

CROSS-REFERENCE TO RELATED APPLICATION(S)

This application claims priority to and the benefit of Korean Patent Application No. 10-2021-0080572 under 35 U.S.C. § 119, filed on Jun. 22, 2021, in the Korean Intellectual Property Office (KIPO), the entire contents of which are incorporated herein by reference.

BACKGROUND

1. Technical Field

The disclosure relates to a display device.

2. Description of the Related Art

In general, a display device including a self-light emitting element may include a self-light emitting element capable of emitting light by itself in a pixel, and the self-light emitting element may receive a data signal or a data voltage transferred from a driver positioned in a non-display area of the display device through a data line or the like.

A conventional display device has a problem that an area in which a driver is positioned is large or an area from the driver to a display area is large. As a result, an area of a dead space in which a self-light emitting element or the like is not disposed may increase.

SUMMARY

Aspects of the disclosure provide a display device capable of displaying a high-quality image while reducing an area of a dead space.

However, aspects of the disclosure are not restricted to those set forth herein. The above and other aspects of the disclosure will become more apparent to one of ordinary skill in the art to which the disclosure pertains by referencing the detailed description of the disclosure given below.

An embodiment of a display device may include a driving transistor disposed on a surface of a substrate; a transistor disposed on the surface of the substrate and electrically connected to the driving transistor; a first insulating layer disposed on a gate electrode of the driving transistor and a gate electrode of the transistor; a first data conductive layer disposed on the first insulating layer and including a first connection pattern electrically connected to the transistor; a second insulating layer disposed on the first data conductive layer and including a lower via hole which exposes the first connection pattern; a second data conductive layer disposed on the second insulating layer, the second data conductive layer including a second connection pattern electrically connected to the first connection pattern through the lower via hole and a first conductive line extending in a first direction; a third insulating layer disposed on the second data conductive layer and including an intermediate via hole which exposes the second connection pattern; a third data conductive layer disposed on the third insulating layer, the third data conductive layer including a third connection pattern electrically connected to the second connection pattern through the intermediate via hole, a second conductive line extending in a second direction intersecting the first direction, and a first data line which extends in the second direction and to which a data voltage provided to the gate electrode of the driving transistor is applied; a fourth insulating layer disposed on the third data conductive layer and including an upper via hole which exposes the third connection pattern; and a light emitting element disposed on the fourth insulating layer, the light emitting element including a first electrode electrically connected to the third connection pattern through the upper via hole. At least two of the lower via hole, the intermediate via hole, and the upper via hole may overlap each other in a third direction perpendicular to the surface of the substrate.

The lower via hole and the upper via hole may overlap each other in the third direction, and the intermediate via hole may not overlap the lower via hole and the upper via hole in the third direction.

A portion of the first connection pattern electrically contacting the second connection pattern may overlap a portion of the third connection pattern electrically contacting the first electrode of the light emitting element in the third direction.

One of the lower via hole and the upper via hole may completely surround the other of the lower via hole and the upper via hole in a plan view.

The intermediate via hole and the upper via hole may overlap each other in the third direction, and the lower via hole may not overlap the intermediate via hole and the upper via hole in the third direction.

A portion of the second connection pattern electrically contacting the third connection pattern may overlap a portion of the third connection pattern electrically contacting the first electrode of the light emitting element in the third direction.

One of the intermediate via hole and the upper via hole may completely surround the other of the intermediate via hole and the upper via hole in a plan view.

The lower via hole, the intermediate via hole, and the upper via hole may overlap each other in the third direction.

The first data conductive layer further may include a first voltage line which extends in the second direction and to which a first driving voltage provided to the driving transistor is applied, and the first data line may include a portion spaced apart from the first voltage line by a first distance in the first direction in a plan view The first distance may be about 1 μm to about 4 μm.

The display device may further comprise an initialization voltage line which is disposed between the substrate and the first insulating layer and to which an initialization voltage is applied. The initialization voltage line may extend in the first direction, and the first conductive line may overlap the initialization voltage line in the third direction.

The first conductive line may completely overlap the initialization voltage line in a plan view.

One of the first conductive line and the second conductive line may be electrically connected to a second data line, and a data voltage provided to the second data line may be applied to the one of the first conductive line and the second conductive line.

The other of the first conductive line and the second conductive line is a dummy line.

The first conductive line and the second conductive line may be electrically connected to each other.

An embodiment of a display device may include a driving transistor disposed on a surface of a substrate; a transistor disposed on the surface of the substrate and electrically connected to the driving transistor; a first data conductive layer disposed on a gate electrode of the transistor and including a first connection pattern electrically connected to the transistor; a second data conductive layer disposed on the first data conductive layer, the second data conductive layer including a second connection pattern electrically connected to the first connection pattern and a first conductive line which extends in a first direction and is insulated from the first data conductive layer; a third data conductive layer disposed on the second data conductive layer, the third data conductive layer including a third connection pattern electrically connected to the second connection pattern, a second conductive line extending in a second direction intersecting the first direction, and a first data line which extends along the second direction and to which a data voltage provided to a gate electrode of the driving transistor is applied; and a light emitting element disposed on the third data conductive layer and including a first electrode electrically connected to the third connection pattern. At least two of a first contact portion of the first connection pattern electrically contacting the second connection pattern, a second contact portion of the second connection pattern electrically contacting the third connection pattern, and a third contact portion of the third connection pattern electrically contacting the first electrode of the light emitting element may overlap each other in a third direction perpendicular to the surface of the substrate.

The first contact portion and the third contact portion may overlap each other in the third direction, and the second contact portion may not overlap the first contact portion and the third contact portion in the third direction.

One of the first contact portion and the third contact portion may completely overlap the other of the first contact portion and the third contact portion in the third direction.

The second contact portion and the third contact portion may overlap each other in the third direction.

All of the first contact portion, the second contact portion, and the third contact portion may overlap each other in the third direction.

Detailed contents of other embodiments are described in a detailed description and are illustrated in the drawings.

According to embodiments of the disclosure, a display device in which a dead space is reduced may be provided.

In addition, according to embodiments of the disclosure, some of via holes are disposed to overlap each other, such that a degree of freedom in a design of a display device may be improved, and deterioration of display quality may be prevented.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 7 is a schematic plan view illustrating only a semiconductor layer in the structure of the pixel illustrated in FIG. 6;

DETAILED DESCRIPTION OF THE EMBODIMENTS

Figure 1:
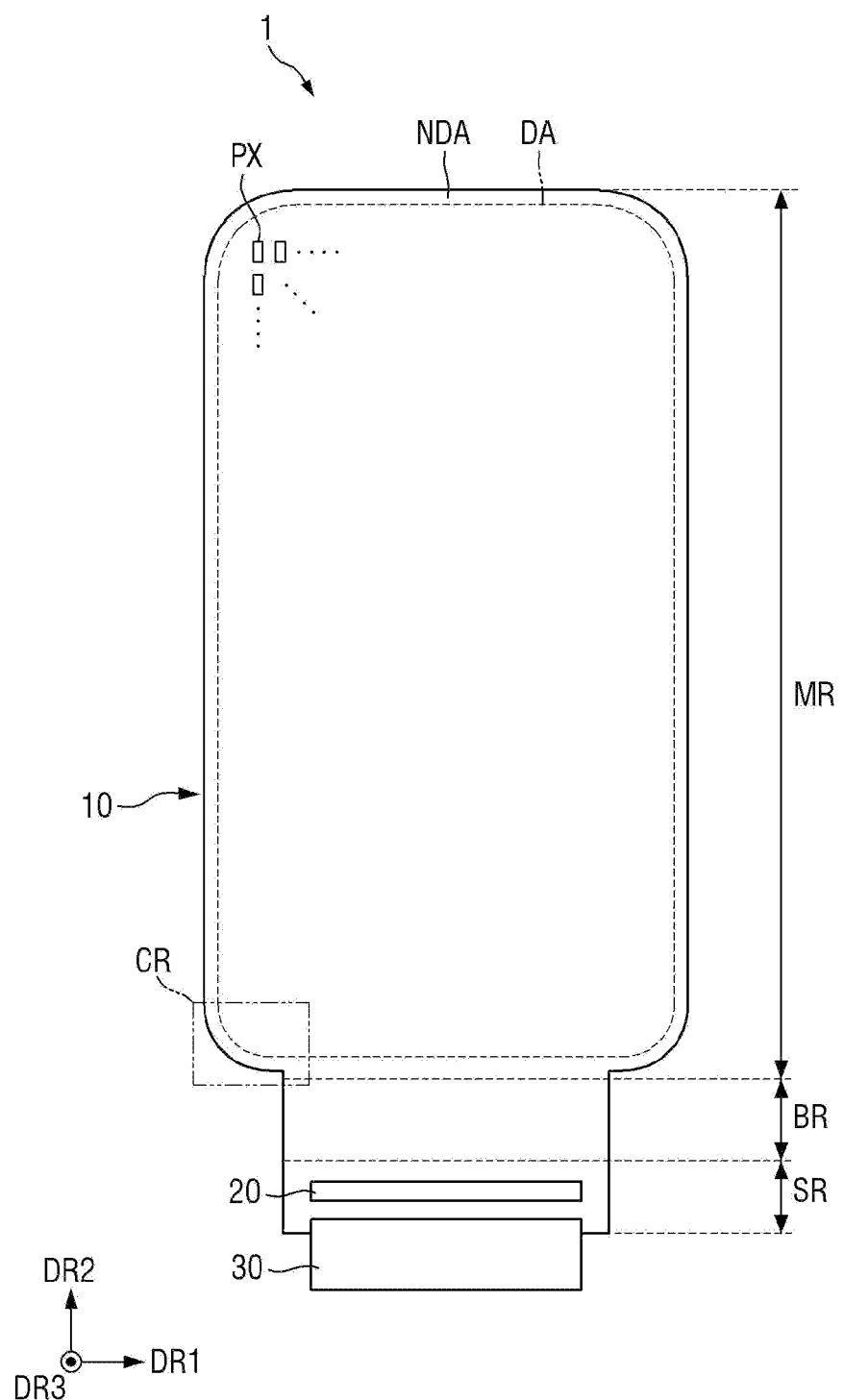
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will convey the scope of the disclosure to those skilled in the art. The same reference numbers indicate the same components throughout the specification. In the attached figures, the thickness of layers and regions may be exaggerated for clarity.

The terminology used herein is for the purpose of describing embodiments only and is not intended to be limiting of the disclosure. As used herein, the singular forms "a", "an" and "the" are intended to include the plural forms (or meanings) as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," and the like may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the disclosure.

Embodiments are described herein with reference to plan and cross-section illustrations that are schematic illustrations of idealized embodiments of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments of the disclosure will be described with reference to the accompanying drawings.

Figure 2:
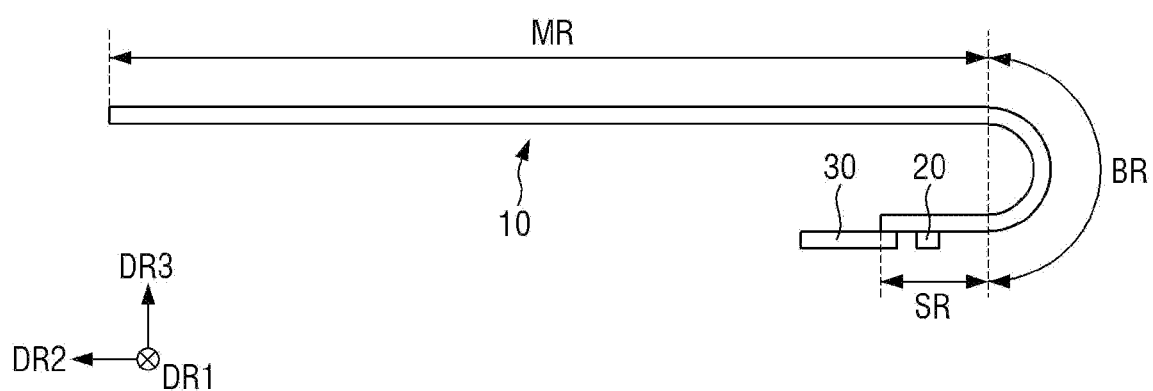
FIG. 2 is a schematic side view of the display device according to an embodiment illustrated in FIG. 1.

FIG. 1 is a schematic plan view of a display device according to an embodiment, and FIG. 2 is a schematic side view of the display device according to an embodiment illustrated in FIG. 1.

A display device according to the embodiment is partially folded or bent as illustrated in FIG. 2, but a state of the display device before being bent is illustrated in FIG. 1 for convenience.

Referring to FIGS. 1 and 2, a display device 1 is a device that displays a moving image or a still image and may be used as a display screen of each of various products such as televisions, laptop computers, monitors, billboards, and Internet of things (IoT) device as well as portable electronic devices such as mobile phones, smartphones, tablet personal computers (PCs), smartwatches, watch phones, mobile communication terminals, electronic organizers, electronic books, portable multimedia players (PMPs), navigation devices, and ultra-mobile PCs (UMPCs).

The display device 1 may include a display panel 10, and may further include a driving chip 20. The display device 1 may further include a printed circuit board 30 electrically connected to the display panel 10.

In some embodiments, the display panel 10 may include elements and circuits for displaying an image, for example, pixel circuits such as switching elements, and light emitting elements (or self-light emitting elements). In an embodiment, the self-light emitting element may include at least one of an organic light-emitting diode (LED), a quantum dot light emitting diode, an inorganic material-based micro light emitting diode (e.g., a micro LED), and an inorganic material-based light emitting diode (e.g., a nano LED) of which at least one of a width and a length has a nano size. Hereinafter, for convenience of explanation, a case where the self-light emitting element is an organic light emitting element will be described by way of example.

The display panel 10 includes a display area DA and a non-display area NDA. The display area DA is an area in which an image is displayed, and pixels PX may be disposed in the display area DA. The pixel PX is a minimum unit for displaying an image. The pixel PX may include the above-described self-light emitting element, a pixel circuit electrically connected to the self-light emitting element, and the like. In some embodiments, when viewed in a direction approximately perpendicular to the display panel 10, for example, a third direction DR3, the display area DA may have a rectangular shape in which a width in a second direction DR2 is greater than a width in a first direction DR1, and may have an approximately rectangular shape with rounded corners. However, the disclosure is not limited thereto, and the display area DA may also have various shapes such as a circular shape, an elliptical shape, a polygonal shape, or a specific shape.

The non-display area NDA is an area in which an image is not displayed, and may be disposed outside the display area DA. In some embodiments, the non-display area NDA may surround the display area DA.

In FIG. 1, a width, in the first direction DR1, of a portion of the non-display area NDA below the display area DA may be smaller than a width of the display area DA measured in the first direction DR1. A portion of the non-display area NDA described above may include a bending region BR and a sub-region SR.

The display panel 10 may include a main region MR, the bending region BR outside the main region MR, and the sub-region SR positioned on an opposite side to the main region MR with respect to the bending region BR. In some embodiments, the bending region BR may be a portion of the non-display area NDA. In the bending region BR, the display panel 10 may be bent as illustrated in FIG. 2. Accordingly, when the display panel 10 is viewed from an upper side of the display panel 10 or a front surface of the display panel 10 in the third direction DR3 in FIGS. 1 and 2, at least a portion of the sub-region SR may overlap the main region MR. However, the disclosure is not limited to the bent display device, and may also be applied to an unbent display device.

The sub-region SR may be a portion of the non-display area NDA as described below. The display panel 10 is bent in the bending region BR, such that an area of the non-display area NDA visually recognized when the display device 1 is viewed from the front surface may be reduced.

The driving chip 20 may be disposed in the sub-region SR of the display panel 10. The driving chip 20 may include an integrated circuit driving the display panel 10. Such an integrated circuit may be a data driving integrated circuit generating a data signal, but the disclosure is not limited thereto.

The driving chip 20 may be mounted in the sub-region SR of the display panel 10. The driving chip 20 is mounted on the same surface as a display surface of the display area DA, but the display panel 10 is bent in the bending region BR as described above, such that the driving chip 20 may be positioned on a rear surface of the display panel 10 in the main region MR.

In some embodiments, the printed circuit board 30 or the like may be attached to an end of the sub-region SR of the display panel 10. Such a printed circuit board 30 or the like may be electrically connected to the driving chip 20 or the like through a pad (not illustrated) on the printed circuit board.

Figure 3:
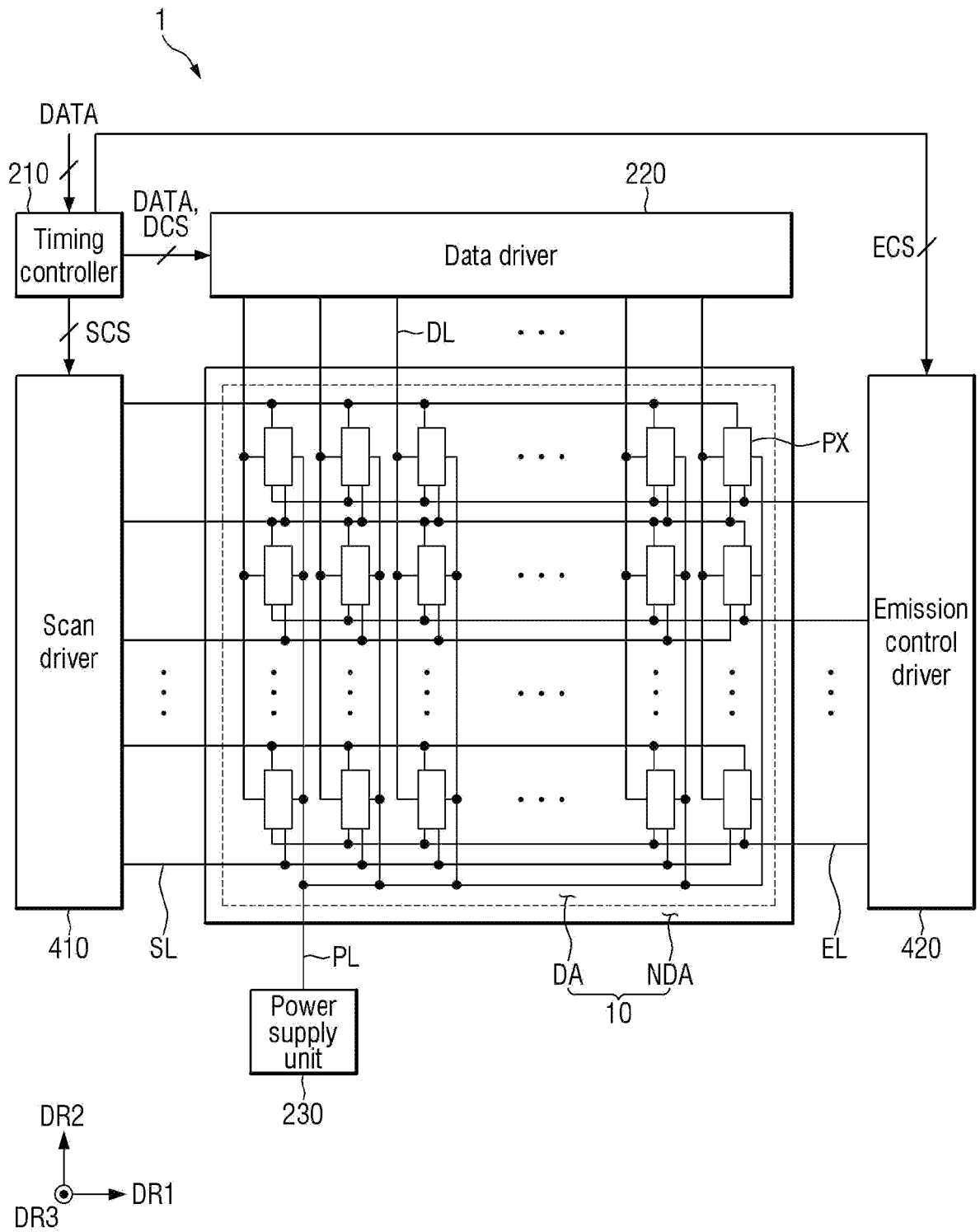
FIG. 3 is a block diagram illustrating a schematic configuration of the display device according to an embodiment illustrated in FIG. 1.

FIG. 3 is a schematic block diagram illustrating a schematic configuration of the display device according to the embodiment illustrated in FIG. 1.

Referring to FIGS. 1 and 3, not only the pixels PX but also scan lines SL, emission lines EL, data lines DL, and first driving voltage lines PL electrically connected to the pixels PX may be disposed in the display area DA of the display panel 10.

In some embodiments, the scan lines SL and the emission lines EL may extend in the first direction DR1. The data lines DL may extend in the second direction DR2 intersecting the first direction DR1.

In some embodiments, some of the first driving voltage lines PL may be formed side by side in the second direction (e.g., Y-axis direction) in the display area DA. The first driving voltage lines PL formed side by side in the second direction (e.g., Y-axis direction) in the display area DA may be electrically connected to each other in the non-display area NDA.

In some embodiments, the first driving voltage line PL may include first sub-driving voltage lines formed side by side in the second direction (e.g., Y-axis direction) in the display area DA and second sub-driving voltage lines formed side by side in the first direction (e.g., X-axis direction) in the display area DA.

Each of the pixels PX may be electrically connected to at least one of the scan lines SL, any of the data lines DL, at least one of the emission control lines EL, and the first driving voltage line PL. FIG. 3 illustrates that each of the pixels PX is electrically connected to two scan lines SL, a data line DL, an emission control line EL, and the first driving voltage line PL, but the disclosure is not limited thereto. For example, each of the pixels PX may also be electrically connected to three scan lines SL instead of the two scan lines SL.

Each of the pixels PX may include a driving transistor, at least one transistor, a self-light emitting element, and a capacitor. The driving transistor may be turned on in case that a scan signal is applied from the scan line SL thereto, and thus, a data voltage of the data line DL may be applied to a gate electrode of the driving transistor. The driving transistor may cause the self-light emitting element to emit light by supplying a driving current to the self-light emitting element according to the data voltage applied to the gate electrode thereof. The driving transistor and the at least one transistor may be thin-film transistors. The self-light emitting element may emit light according to the driving current of the driving transistor. In some embodiments, the self-light emitting element may be an organic light emitting element including a first electrode, an organic emission layer, and a second electrode. The capacitor may serve to maintain the data voltage applied to the gate electrode of the driving transistor DT for a predetermined period.

A scan driving member for applying scan signals to the scan lines SL may be positioned in the non-display area NDA of the display panel 10.

The scan driving member may receive a scan control signal SCS and an emission control signal ECS from the driving chip 20 (see FIG. 1).

The scan driving member may include a scan driver 410 and an emission control driver 420 as illustrated in FIG. 3. The scan driver 410 may generate scan signals according to the scan control signal SCS and sequentially output the scan signals to the scan lines SL. The emission control driver 420 may generate emission signals according to the emission control signal ECS and sequentially output the emission signals to the emission control lines EL.

In some embodiments, the scan driving member may include thin-film transistors. The scan driving member and thin-film transistors of the pixels PX may be formed on a same layer. As another example, the scan driving member and the thin-film transistors of the pixels PX may be formed on different layers.

In some embodiments, the driving chip 20 (see FIG. 1) may include a timing controller 210, a data driver 220, and a power supply unit (or power supply part) 230 illustrated in FIG. 3.

The timing controller 210 receives digital video data DATA and timing signals from the printed circuit board 30 (see FIG. 1). The timing controller 210 may generate the scan control signal SCS for controlling an operation timing of the scan driver 410, generate the emission control signal ECS for controlling an operation timing of the emission control driver 420, and generate a data control signal DCS for controlling an operation timing of the data driver 220, according to the timing signals. The timing controller 210 may output the scan control signal SCS to the scan driver 410 and output the emission control signal ECS to the emission control driver 420. The timing controller 210 may output the digital video data DATA and the data control signal DCS to the data driver 220.

The data driver 220 converts the digital video data DATA into analog positive/negative data voltages and outputs the analog positive/negative data voltages to the data lines DL. The pixels PX are selected by the scan signals of the scan driving member, and the data voltages are supplied to the selected pixels PX.

The power supply part 230 may generate a first driving voltage and supply the first driving voltage to the first driving voltage line PL. The power supply part 230 may generate a second driving voltage and supply the second driving voltage to a cathode electrode of an organic light emitting element of each of the pixels PXs. In some embodiments, the first driving voltage may be a high-potential voltage for driving the organic light emitting element, and the second driving voltage may be a low-potential voltage for driving the organic light emitting element. That is, the first driving voltage may have a higher potential than the second driving voltage.

The printed circuit board 30 (see FIG. 1) may be attached to a pad provided on the display panel 10 using an anisotropic conductive film or the like. As another example, the printed circuit board 30 (see FIG. 1) may be directly coupled or attached to the pad provided on the display panel 10 by ultrasonic bonding or the like without using a separate anisotropic conductive film. In some embodiments, the printed circuit board 30 (see FIG. 1) may be a flexible printed circuit board.

Figure 4:
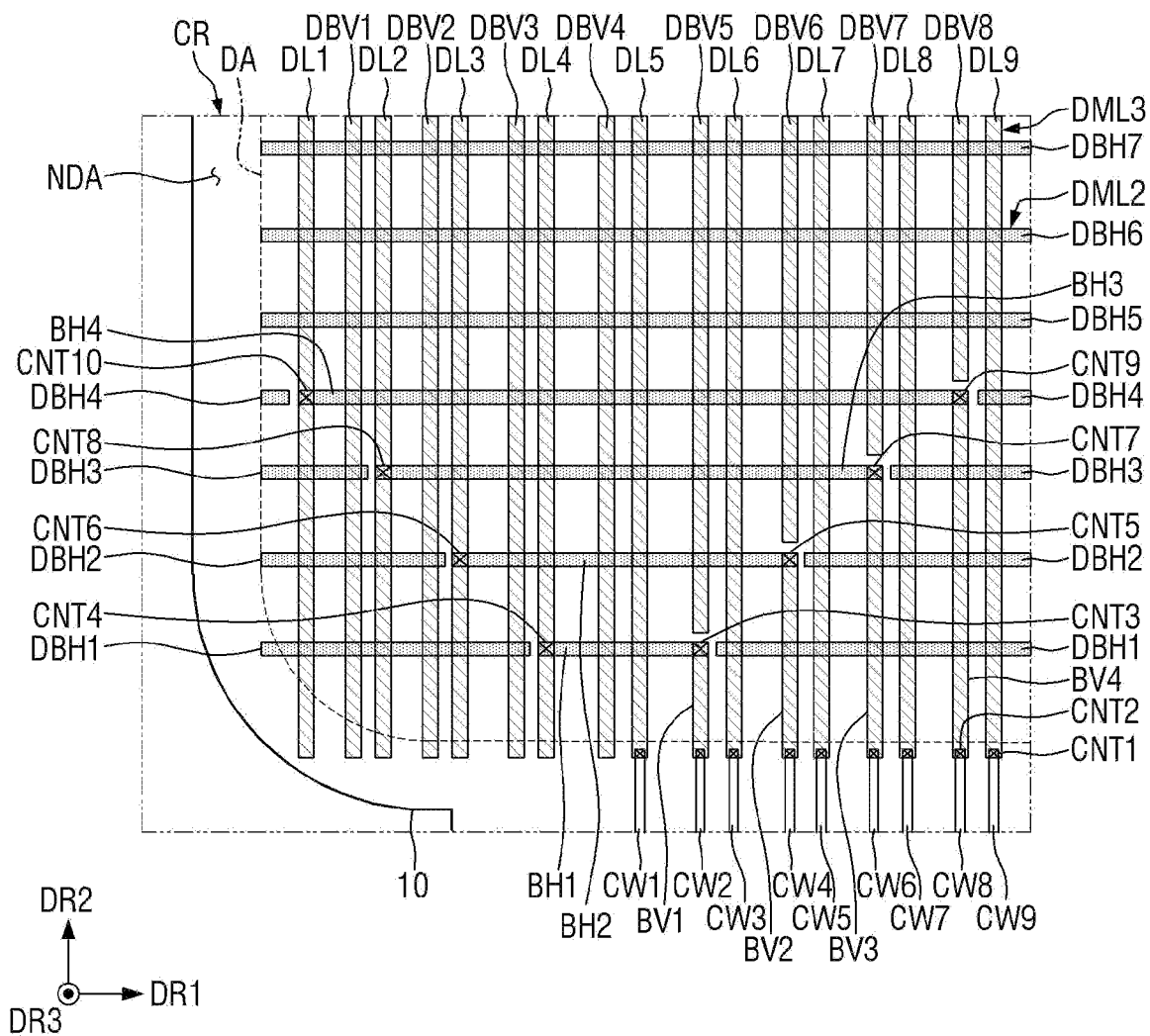
FIG. 4 is a schematic enlarged plan view of portion CR illustrated in FIG. 1.

FIG. 4 is a schematic enlarged plan view of portion CR illustrated in FIG. 1.

Various signals may be applied to the display area DA. For example, a data signal for adjusting brightness of each pixel may be applied to the display area DA. To this end, as illustrated in FIG. 4, data lines arranged in the first direction DR1 so as to be approximately parallel to each other and extending in the second direction DR2 may be positioned in the display area DA. In some embodiments, some of the data lines may extend to the non-display area NDA.

In FIG. 4, as an example, nine data lines, that is, a first data line DL1, a second data line DL2, a third data line DL3, a fourth data line DL4, a fifth data line DL5, a sixth data line DL6, a seventh data line DL7, an eighth data line DL8, and a ninth data line DL9 are illustrated. In some embodiments, the first data line DL1, the second data line DL2, the third data line DL3, the fourth data line DL4, the fifth data line DL5, the sixth data line DL6, the seventh data line DL7, the eighth data line DL8, and the ninth data line DL9 may be included in a third data conductive layer DML3 to be described below.

In some embodiments, input lines may be positioned in the non-display area NDA. Each input line may be electrically connected to each data line to transfer a data signal (or a data voltage) to the display area DA. In some embodiments, the respective input lines may extend in the second direction DR2 and may be disposed to be spaced apart from each other in the first direction DR1. In FIG. 4, as an example, a first input line CW1, a second input line CW2, a third input line CW3, a fourth input line CW4, a fifth input line CW5, a sixth input line CW6, a seventh input line CW7, an eighth input line CW8, and a ninth input line CW9 are illustrated.

In FIG. 4, nine input lines and nine data lines are illustrated for convenience of explanation. However, the disclosure is not limited thereto, and each of the numbers of input lines and data lines may be less than 9 or more than 9.

In some embodiments, as illustrated in FIG. 4, one ends of the fifth data line DL5, the sixth data line DL6, the seventh data line DL7, the eighth data line DL8, and the ninth data line DL9 may be electrically connected to the corresponding first input line CW1, third input line CW3, fifth input line CW5, seventh input line CW7, and ninth input line CW9 through first contact holes CNT1, respectively. As another example, although not illustrated in FIG. 4, the fifth data line DL5, the sixth data line DL6, the seventh data line DL7, the eighth data line DL8, and the ninth data line DL9 may be formed integrally with (or may be integral with) corresponding ones of the first input line CW1, the third input line CW3, the fifth input line CW5, the seventh input line CW7, and the ninth input line CW9, respectively. In case that the data lines are electrically connected to the input lines through the first contact holes CNT1, an insulating layer may be positioned on the first input line CW1, the third input line CW3, the fifth input line CW5, the seventh input line CW7, and the ninth input line CW9, and the fifth data line DL5, the sixth data line DL6, the seventh data line DL7, the eighth data line DL8, and the ninth data line DL9 may be positioned on the insulating layer.

Vertical connection lines arranged in the first direction DR1 so as to be approximately parallel to each other and extending in the second direction DR2 may be positioned in the display area DA. In FIG. 4, as an example, four vertical connection lines, that is, a first vertical connection line BV1, a second vertical connection line BV2, a third vertical connection line BV3, and a fourth vertical connection line BV4 are illustrated. In some embodiments, the first vertical connection line BV1, the second vertical connection line BV2, the third vertical connection line BV3, and the fourth vertical connection line BV4 and the data lines may be included in a same conductive layer. The first vertical connection line BV1, the second vertical connection line BV2, the third vertical connection line BV3, and the fourth vertical connection line BV4 may be included in the third data conductive layer DML3 to be described below. For reference, the meaning that certain components are included in a same layer may be that these components are simultaneously formed using a same material and by a same mask process. In this case, these components include a same material.

In some embodiments, the first vertical connection line BV1 may be positioned between the fifth data line DL5 and the sixth data line DL6, the second vertical connection line BV2 may be positioned between the sixth data line DL6 and the seventh data line DL7, the third vertical connection line BV3 may be positioned between the seventh data line DL7 and the eighth data line DL8, and the fourth vertical connection line BV4 may be positioned between the eighth data line DL8 and the ninth data line DL9.

The first vertical connection line BV1 may be electrically connected to the second input line CW2, the second vertical connection line BV2 may be electrically connected to the fourth input line CW4, the third vertical connection line BV3 may be electrically connected to the sixth input line CW6, and the fourth vertical connection line BV4 may be electrically connected to the eighth input line CW8. In some embodiments, as illustrated in FIG. 4, first ends of the first vertical connection line BV1, the second vertical connection line BV2, the third vertical connection line BV3, and the fourth vertical connection line BV4 may be electrically connected to the corresponding second input line CW2, fourth input line CW4, sixth input line CW6, and eighth input line CW8 through second contact holes CNT2, respectively. As another example, although not illustrated in FIG. 4, the first vertical connection line BV1, the second vertical connection line BV2, the third vertical connection line BV3, and the fourth vertical connection line BV4 may be integral with corresponding ones of the second input line CW2, the fourth input line CW4, the sixth input line CW6, and the eighth input line CW8, respectively. In case that the vertical connection lines are electrically connected to the corresponding input lines through the second contact holes CNT2, an insulating layer may be positioned on the second input line CW2, the fourth input line CW4, the sixth input line CW6, and the eighth input line CW8, and the first vertical connection line BV1, the second vertical connection line BV2, the third vertical connection line BV3, and the fourth vertical connection line BV4 may be positioned on the insulating layer.

Horizontal connection lines arranged in the second direction DR2 so as to be approximately parallel to each other and extending in the first direction DR1 may be positioned in the display area DA.

In FIG. 4, as an example, the number of horizontal connection lines is equal to the number of vertical connection lines, that is, a first horizontal connection line BH1, a second horizontal connection line BH2, a third horizontal connection line BH3, and a fourth horizontal connection line BH4. In some embodiments, the first horizontal connection line BH1, the second horizontal connection line BH2, the third horizontal connection line BH3, and the fourth horizontal connection line BH4 may be included in a different conductive layer from the data lines. The first horizontal connection line BH1, the second horizontal connection line BH2, the third horizontal connection line BH3, and the fourth horizontal connection line BH4 may be included in a second data conductive layer DML2 to be described below, and an insulating layer may be positioned between the second data conductive layer DML2 and the third data conductive layer DML3.

The first horizontal connection line BH1 may be electrically connected to the first vertical connection line BV1 through a third contact hole CNT3, and be electrically connected to the fourth data line DL4 through a fourth contact hole CNT4. Accordingly, a data signal (or data voltage) provided to the second input line CW2 may be provided to the fourth data line DL4 via the first vertical connection line BV1 and the first horizontal connection line BH1.

The second horizontal connection line BH2 may be electrically connected to the second vertical connection line BV2 through a fifth contact hole CNT5, and be electrically connected to the third data line DL3 through a sixth contact hole CNT6. Accordingly, a data signal (or data voltage) provided to the fourth input line CW4 may be provided to the third data line DL3 via the second vertical connection line BV2 and the second horizontal connection line BH2.

The third horizontal connection line BH3 may be electrically connected to the third vertical connection line BV3 through a seventh contact hole CNT7, and be electrically connected to the second data line DL2 through an eighth contact hole CNT8. Accordingly, a data signal (or data voltage) provided to the sixth input line CW6 may be provided to the second data line DL2 via the third vertical connection line BV3 and the third horizontal connection line BH3.

The fourth horizontal connection line BH4 may be electrically connected to the fourth vertical connection line BV4 through a ninth contact hole CNT9, and be electrically connected to the first data line DL1 through a tenth contact hole CNT10. Accordingly, a data signal (or data voltage) provided to the eighth input line CW8 may be provided to the first data line DL1 via the fourth vertical connection line BV4 and the fourth horizontal connection line BH4.

The data signals are transferred to the first data line DL1, the second data line DL2, the third data line DL3, and the fourth data line DL4 through the horizontal connection lines and the vertical connection lines passing through the display area DA. Accordingly, an additional dead space required to electrically connect the first data line DL1, the second data line DL2, the third data line DL3, and the fourth data line DL4 to the driving chip or the like may be omitted, and therefore, an advantage of reducing the dead space of the display device may be provided.

In some embodiments, the horizontal connection lines positioned in the display area DA may intersect and overlap the data lines, and the overlapping data lines may not be electrically connected to the corresponding horizontal connection lines. For example, as illustrated in FIG. 4, the first horizontal connection line BH1 may intersect and overlap the fifth data line DL5 of data lines that are not electrically connected to the first horizontal connection line BH1, and the second horizontal connection line BH2 may intersect and overlap the fourth data line DL4 and the fifth data line DL5. The third horizontal connection line BH3 may intersect and overlap the third data line DL3, the fourth data line DL4, the fifth data line DL5, and the sixth data line DL6. The fourth horizontal connection line BH4 may intersect and overlap the second data line DL2, the third data line DL3, the fourth data line DL4, the fifth data line DL5, the sixth data line DL6, the seventh data line DL7, and the eighth data line DL8.

In some embodiments, vertical dummy lines may be further positioned in the display area DA of the display device.

For example, as illustrated in FIG. 4, a fifth vertical dummy line DBV5, a sixth vertical dummy line DBV6, a seventh vertical dummy line DBV7, and an eighth vertical dummy line DBV8 may be positioned in the display area DA.

The fifth vertical dummy line DBV5 may be spaced apart from the first vertical connection line BV1 in the second direction DR2, and may be electrically insulated from the first vertical connection line BV1, and the fifth vertical dummy line DBV5 and the first vertical connection line BV1 may have a same extension axis. Similar to the fifth vertical dummy line DBV5, the sixth vertical dummy line DBV6 may be spaced apart from the second vertical connection line BV2 in the second direction DR2, and the sixth vertical dummy line DBV6 and the second vertical connection line BV2 may have a same extension axis, the seventh vertical dummy line DBV7 may be spaced apart from the third vertical connection line BV3 in the second direction DR2, and the seventh vertical dummy line DBV7 and the third vertical connection line BV3 may have a same extension axis, and the eighth vertical dummy line DBV8 may be spaced apart from the fourth vertical connection line BV4 in the second direction DR2, and the eighth vertical dummy line DBV8 and the fourth vertical connection line BV4 may have a same extension axis.

In some embodiments, a first vertical dummy line DBV1, a second vertical dummy line DBV2, a third vertical dummy line DBV3, and a fourth vertical dummy line DBV4 may be further positioned in the display area DA. In some embodiments, the first vertical dummy line DBV1 may be positioned between the first data line DL1 and the second data line DL2, the second vertical dummy line DBV2 may be positioned between the second data line DL2 and the third data line DL3, the third vertical dummy line DBV3 may be positioned between the third data line DL3 and the fourth data line DL4, and the fourth vertical dummy line DBV4 may be positioned between the fourth data line DL5 and the fifth data line DL5. The above-described vertical dummy lines may be electrically insulated from the vertical connection lines, the horizontal connection lines, and the data lines.

In some embodiments, the above-described vertical dummy lines may be included in the third data conductive layer DML3.

In some embodiments, horizontal dummy lines may be further positioned in the display area DA of the display device.

For example, as illustrated in FIG. 4, a first horizontal dummy line DBH1, a second horizontal dummy line DBH2, a third horizontal dummy line DBH3, and a fourth horizontal dummy line DBH4 may be positioned in the display area DA, and a fifth horizontal dummy line DBH5, a sixth horizontal dummy line DBH6, and a seventh horizontal dummy line DBH7 may be further positioned in the display area DA. In some embodiments, all of the above-described horizontal dummy lines may be positioned on a same layer and may be included in a different conductive layer from the vertical dummy lines. In some embodiments, all of the horizontal dummy lines may be included in the second data conductive layer DML2.

The first horizontal dummy line DBH1 may be spaced apart from the first horizontal connection line BH1 in the first direction DR1, and may be electrically insulated from the first horizontal connection line BH1, and the first horizontal dummy line DBH1 and the first horizontal connection line BH1 may have a same extension axis. In some embodiments, the first horizontal dummy lines DBH1 may be each positioned on a side and the other side of the first horizontal connection line BH1 in the first direction DR1. Similar to the first horizontal dummy line DBH1, the second horizontal dummy line DBH2 may be spaced apart from the second horizontal connection line BH2 in the first direction DR1, and the second horizontal dummy line DBH2 and the second horizontal connection line BH2 may have a same extension axis, the third horizontal dummy line DBH3 may be spaced apart from the third horizontal connection line BH3 in the first direction DR1, and the third horizontal dummy line DBH3 and the third horizontal connection line BH3 may have a same extension axis, and the fourth horizontal dummy line DBH4 may be spaced apart from the fourth horizontal connection line BH4 in the first direction DR1, and the fourth horizontal dummy line DBH4 and the fourth horizontal connection line BH4 may have a same extension axis.

In some embodiments, the third horizontal dummy line DBH3, the second horizontal dummy line DBH2, and the first horizontal dummy line DBH1 described above may be sequentially positioned on a side of the fourth horizontal connection line BH4 in the second direction DR2, and the fifth horizontal dummy line DBH5, the sixth horizontal dummy line DBH6, and the seventh horizontal dummy line DBH7 may be positioned on the other side of the fourth horizontal connection line BH4 in the second direction DR2.

In some embodiments, the horizontal dummy lines may intersect and overlap the data lines positioned in the display area DA, similar to the horizontal connection lines. For example, as illustrated in FIG. 4, the first horizontal dummy line DBH1, positioned on the left side of the first horizontal connection line BH1, of the first horizontal dummy lines DBH1 may intersect and overlap the first data line DL1, the second data line DL2, the third data line DL3, and the like.

The above-described vertical dummy lines and horizontal dummy lines are positioned in the display area DA, such that a structural difference between pixels through which the vertical connection lines and the horizontal connection lines do not pass and pixels through which the vertical connection lines and the horizontal connection lines pass may be minimized. Accordingly, a display device capable of preventing deterioration of display quality by minimizing a difference in luminance provided in the pixels in case that a same electrical signal is applied to the pixels, may be provided. The vertical dummy lines and the horizontal dummy lines are provided, such that it is possible to keep a deviation of external light reflectivity for each pixel relatively uniform and it is possible to prevent the vertical connection lines and the horizontal connection lines from being relatively prominent and visually recognized.

Figure 5:
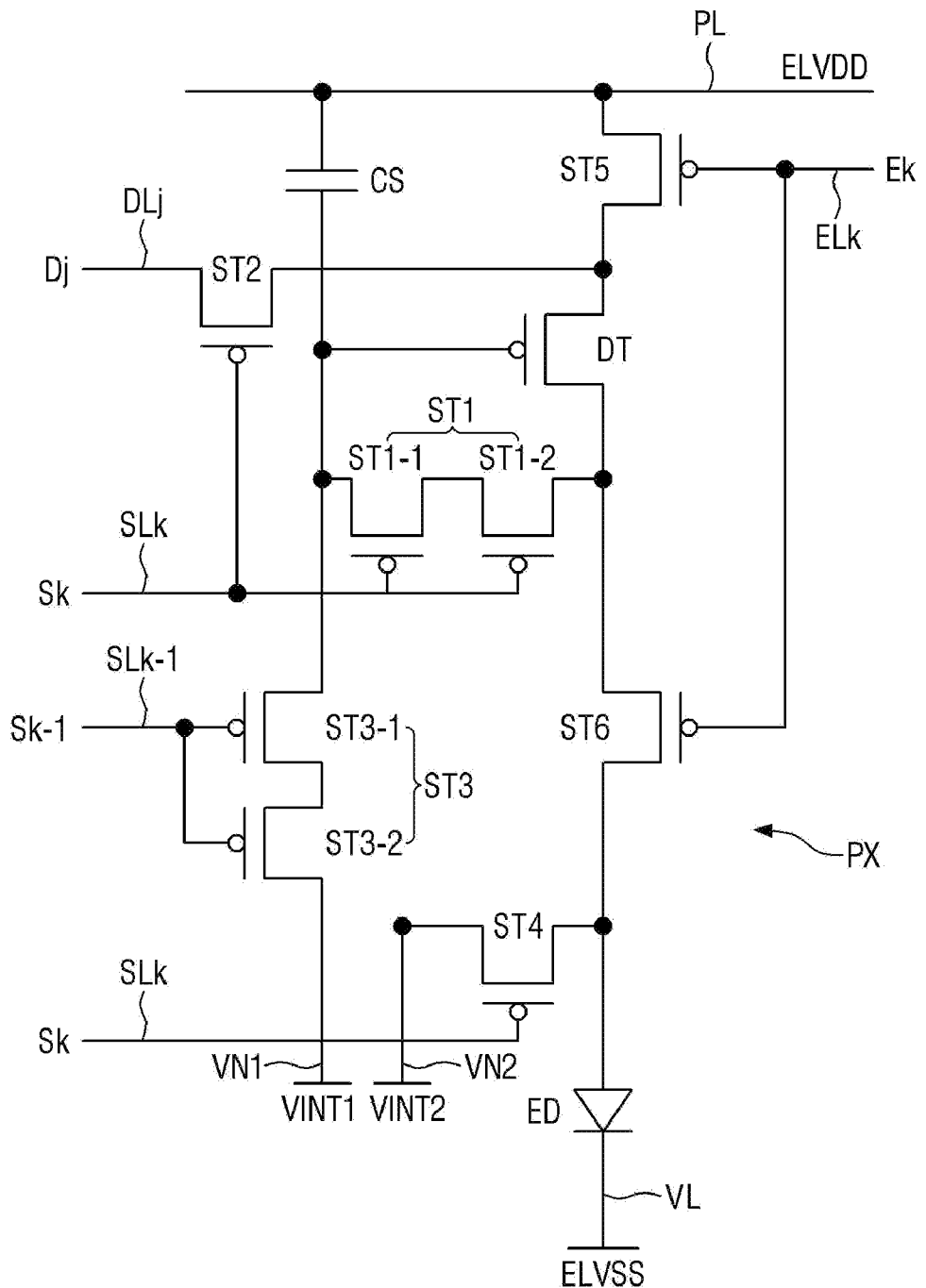
FIG. 5 is a schematic diagram of equivalent circuit of a pixel according to an embodiment illustrated in FIG. 1.

FIG. 5 is a schematic diagram of an equivalent circuit of a pixel according to the embodiment illustrated in FIG. 1.

Referring to FIG. 5, the pixel PX may be electrically connected to a k−1-th scan line SLk−1 to which a k−1-th scan signal Sk−1 (where k is a positive integer of 2 or more) is provided, a k-th scan line SLk to which a k-th scan signal Sk is provided, and a j-th data line DLj to which a j-th data signal Dj (where j is a positive integer of 2 or more) is provided. The pixel PX may be electrically connected to a first driving voltage line PL to which a first driving voltage ELVDD is supplied, a first initialization voltage line VN1 to which a first initialization voltage VINT1 is supplied, a second initialization voltage line VN2 to which a second initialization voltage VINT2 is supplied, and a second driving voltage line VL to which a second driving voltage ELVSS is supplied.

The pixel PX may include a pixel circuit including a driving transistor DT, switch elements, and a capacitor CS, and a self-light emitting element ED. The switch elements may include a first transistor ST1, a second transistor ST2, a third transistor ST3, a fourth transistor ST4, a fifth transistor ST5, and a sixth transistor ST6. In some embodiments, the above-described transistors may be thin-film transistors.

The driving transistor DT may include a gate electrode, a first electrode, and a second electrode. The driving transistor DT controls a drain-source current Ids (hereinafter referred to as a "driving current") flowing between the first electrode and the second electrode according to a data voltage applied to the gate electrode. The driving current Ids flowing through a channel of the driving transistor DT is proportional to the square of a difference between a voltage Vgs between the gate electrode and a source electrode and a threshold voltage of the driving transistor DT as in Equation 1.

$$Ids = k' \times (Vgs - Vth)^2 \qquad \text{[Equation 1]}$$

In Equation 1, k' is a proportional coefficient determined by a structure and physical characteristics of the driving transistor, Vgs is a gate-source voltage of the driving transistor, and Vth is the threshold voltage of the driving transistor.

The self-light emitting element ED emits light according to the driving current Ids. An amount of the light emitted from the self-light emitting element ED may be proportional to the driving current Ids.

The self-light emitting element ED may be an organic light emitting element including an anode electrode, a cathode electrode, and an organic emission layer disposed between the anode electrode and the cathode electrode. However, the disclosure is not limited thereto, and the self-light emitting element ED may be an inorganic material-based self-light emitting element including an anode electrode, a cathode electrode, and an inorganic semiconductor disposed between the anode electrode and the cathode electrode. As another example, the self-light emitting element ED may be a quantum dot light emitting element including an anode electrode, a cathode electrode, and a quantum dot emission layer disposed between the anode electrode and the cathode electrode. As another example, the self-light emitting element ED may be a micro light emitting diode or an inorganic material-based light emitting diode.

The anode electrode of the self-light emitting element ED may be electrically connected to a first electrode of the fourth transistor ST4 and a second electrode of the sixth transistor ST6, and the cathode electrode of the self-light emitting element ED may be electrically connected to the second driving voltage line VL.

In some embodiments, the first transistor ST1 may be a dual transistor including a 1-1-th transistor ST1-1 and a 1-2-th transistor ST1-2. The 1-1-th transistor ST1-1 and the 1-2-th transistor ST1-2 are turned on by the scan signal of the k-th scan line SLk to electrically connect a gate electrode and a second electrode of the driving transistor DT to each other. For example, in case that the 1-1-th transistor ST1-1 and the 1-2-th transistor ST1-2 are turned on, the gate electrode and the second electrode of the driving transistor DT are electrically connected to each other, and thus, the driving transistor DT is driven as a diode. A gate electrode of the 1-1-th transistor ST1-1 may be electrically connected to the k-th scan line SLk, a first electrode of the 1-1-th transistor ST1-1 may be electrically connected to a second electrode of the 1-2-th transistor ST1-2, and a second electrode of the 1-1-th transistor ST1-1 may be electrically connected to the gate electrode of the driving transistor DT. A gate electrode of the 1-2-th transistor ST1-2 may be electrically connected to the k-th scan line SLk, a first electrode of the 1-2-th transistor ST1-2 may be electrically connected to the second electrode of the driving transistor DT, and the second electrode of the 1-2-th transistor ST1-2 may be electrically connected to the first electrode of the 1-1-th transistor ST1-1.

The second transistor ST2 is turned on by the scan signal of the k-th scan line SLk to electrically connect a first electrode of the driving transistor DT and the j-th data line DLj to each other. A gate electrode of the second transistor ST2 may be electrically connected to the k-th scan line SLk, a first electrode of the second transistor ST2 may be electrically connected to the first electrode of the driving transistor DT, and a second electrode of the second transistor ST2 may be electrically connected to the j-th data line DLj.

In some embodiments, the third transistor ST3 may be a dual transistor including a 3-1-th transistor ST3-1 and a 3-2-th transistor ST3-2. The 3-1-th transistor ST3-1 and the 3-2-th transistor ST3-2 are turned on by the scan signal of the k–1-th scan line SLk–1 to electrically connect the gate electrode of the driving transistor DT and the first initialization voltage line VN1 to each other. The gate electrode of the driving transistor DT may be discharged at the first initialization voltage VINT1 provided to the first initialization voltage line VN1. A gate electrode of the 3-1-th transistor ST3-1 may be electrically connected to the k–1-th scan line SLk–1, a first electrode of the 3-1-th transistor ST3-1 may be electrically connected to the gate electrode of the driving transistor DT, and a second electrode of the 3-1-th transistor ST3-1 may be electrically connected to a first electrode of the 3-2-th transistor ST3-2. A gate electrode of the 3-2-th transistor ST3-2 may be electrically connected to the k–1-th scan line SLk–1, the first electrode of the 3-2-th transistor ST3-2 may be electrically connected to the second electrode of the 3-1-th transistor ST3-1, and a second electrode of the 3-2-th transistor ST3-2 may be electrically connected to the first initialization voltage line VN1.

The fourth transistor ST4 is turned on by the scan signal of the k-th scan line SLk to electrically connect the anode electrode of the self-light emitting element ED and the second initialization voltage line VN2 to each other. The anode electrode of the self-light emitting element ED may be discharged at the second initialization voltage VINT2 provided to the second initialization voltage line VN2. A gate electrode of the fourth transistor ST4 may be electrically connected to the k-th scan line SLk, the first electrode of the fourth transistor ST4 may be electrically connected to the anode electrode of the self-light emitting element ED, and a second electrode of the fourth transistor ST4 may be electrically connected to the second initialization voltage line VN2. In some embodiments, the second initialization voltage VINT2 provided to the second initialization voltage line VN2 may have a voltage level different from that of the first initialization voltage VINT1 provided to the first initialization voltage line VN1.

The fifth transistor ST5 is turned on by an emission control signal of a k-th emission control line ELk to electrically connect the first electrode of the driving transistor DT and the first driving voltage line PL to each other. A gate electrode of the fifth transistor ST5 may be electrically connected to the k-th emission control line Elk that sends or receives emission signals Ek, a first electrode of the fifth transistor ST5 may be electrically connected to the first driving voltage line PL, and a second electrode of the fifth transistor ST5 may be electrically connected to a source electrode of the driving transistor DT.

The sixth transistor ST6 is electrically connected between the second electrode of the driving transistor DT and the anode electrode of the self-light emitting element ED. The sixth transistor ST6 is turned on by the emission control signal of the k-th emission control line ELk to electrically connect the second electrode of the driving transistor DT and the anode electrode of the self-light emitting element ED to each other. A gate electrode of the sixth transistor ST6 is electrically connected to the k-th emission control line ELk, a first electrode of the sixth transistor ST6 is electrically connected to the second electrode of the driving transistor DT, and the second electrode of the sixth transistor ST6 is electrically connected to the anode electrode of the self-light emitting element ED. In case that both the fifth transistor ST5 and the sixth transistor ST6 are turned on, the driving current Ids may be supplied to the self-light emitting element ED.

The capacitor CS is formed between the gate electrode of the driving transistor DT and the first driving voltage line PL. One electrode of the capacitor CS may be electrically connected to the gate electrode of the driving transistor DT, and the other electrode of the capacitor CS may be electrically connected to the first driving voltage line PL. Electric charges corresponding to a difference between a driving gate electrode voltage of the driving transistor DT and the first driving voltage ELVDD may be stored in the capacitor CS.

In case that the first electrode of each of the first transistor ST1, the second transistor ST2, the third transistor ST3, the fourth transistor ST4, the fifth transistor ST5, the sixth transistor ST6, and the driving transistor DT is a source electrode, the second electrode thereof may be a drain electrode. As another example, in case that the first electrode of each of the first transistor ST1, the second transistor ST2, the third transistor ST3, the fourth transistor ST4, the fifth transistor ST5, the sixth transistor ST6, and the driving transistor DT is a drain electrode, the second electrode thereof may be a source electrode.

A semiconductor layer of each of the first transistor ST1, the second transistor ST2, the third transistor ST3, the fourth transistor ST4, the fifth transistor ST5, the sixth transistor ST6, and the driving transistor DT may be formed of at least one of polysilicon, amorphous silicon, and an oxide semiconductor. In case that the semiconductor layer of each of the first transistor ST1, the second transistor ST2, the third transistor ST3, the fourth transistor ST4, the fifth transistor ST5, the sixth transistor ST6, and the driving transistor DT is formed of polysilicon, a process for forming the semiconductor layer may be a low-temperature polycrystalline silicon (LTPS) process.

It has been mainly described with reference to FIG. 5 that the first transistor ST1, the second transistor ST2, the third transistor ST3, the fourth transistor ST4, the fifth transistor ST5, the sixth transistor ST6, and the driving transistor DT are formed as p-type thin-film transistors, but the disclosure is not limited thereto, and these transistors may also be formed as n-type thin-film transistors.

The first driving voltage ELVDD of the first driving voltage line PL, the second driving voltage ELVSS of the second driving voltage line VL, the first initialization voltage VINT1 of the first initialization voltage line VN1, and the second initialization voltage VINT2 of the second initialization voltage line VN2 may be set in consideration of characteristics of the driving transistor DT, characteristics of the self-light emitting element ED, and the like. For example, each of a voltage difference between the first initialization voltage VINT1 and the data voltage supplied to the source electrode of the driving transistor DT and a voltage difference between the second initialization voltage VINT2 and the data voltage supplied to the source electrode of the driving transistor DT may be set to be smaller than the threshold voltage of the driving transistor DT.

Figure 6:
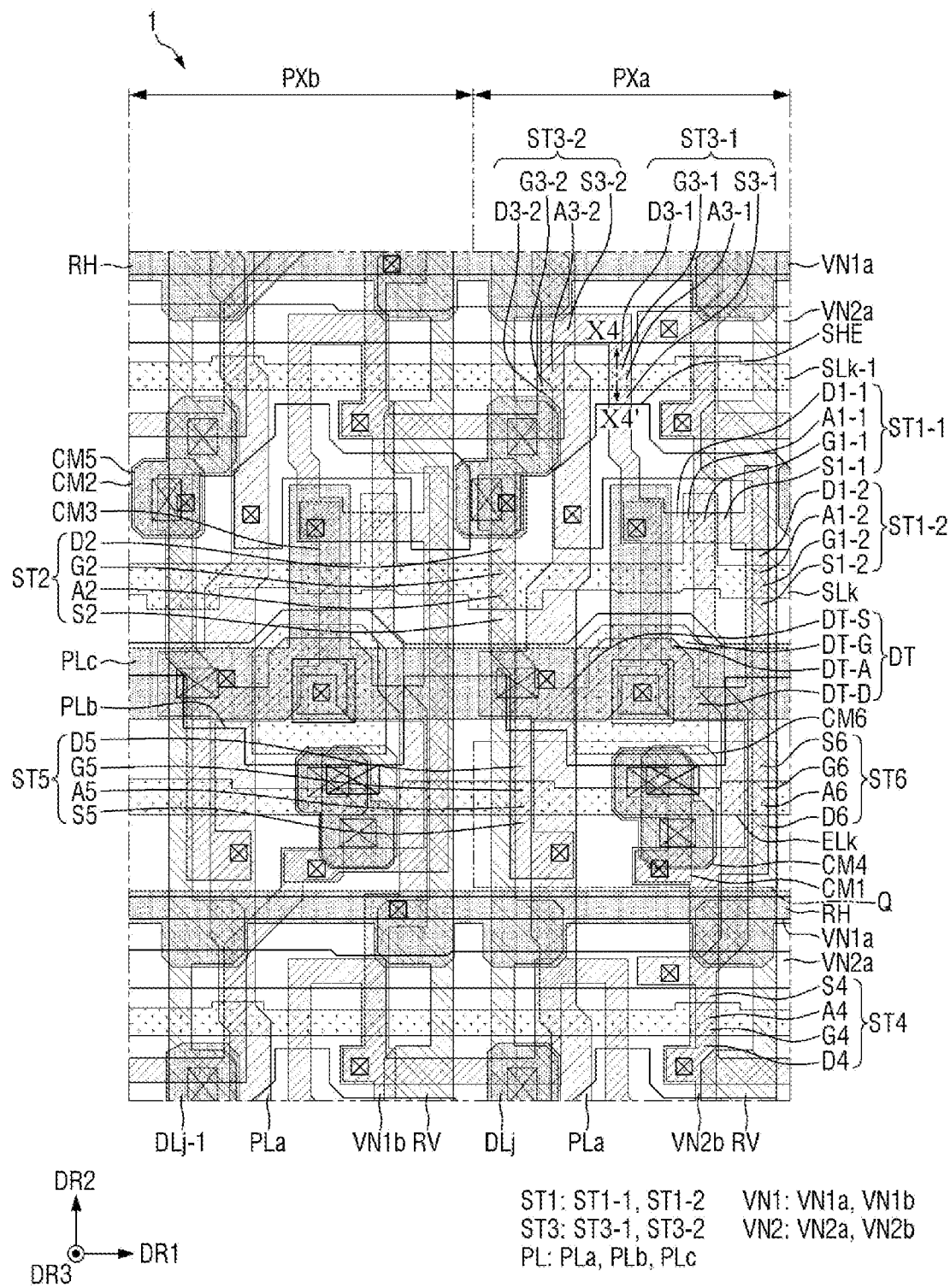
FIG. 6 is a schematic plan view (or layout view) illustrating a structure of the pixel according to an embodiment illustrated in FIG. 5.
Figure 8:
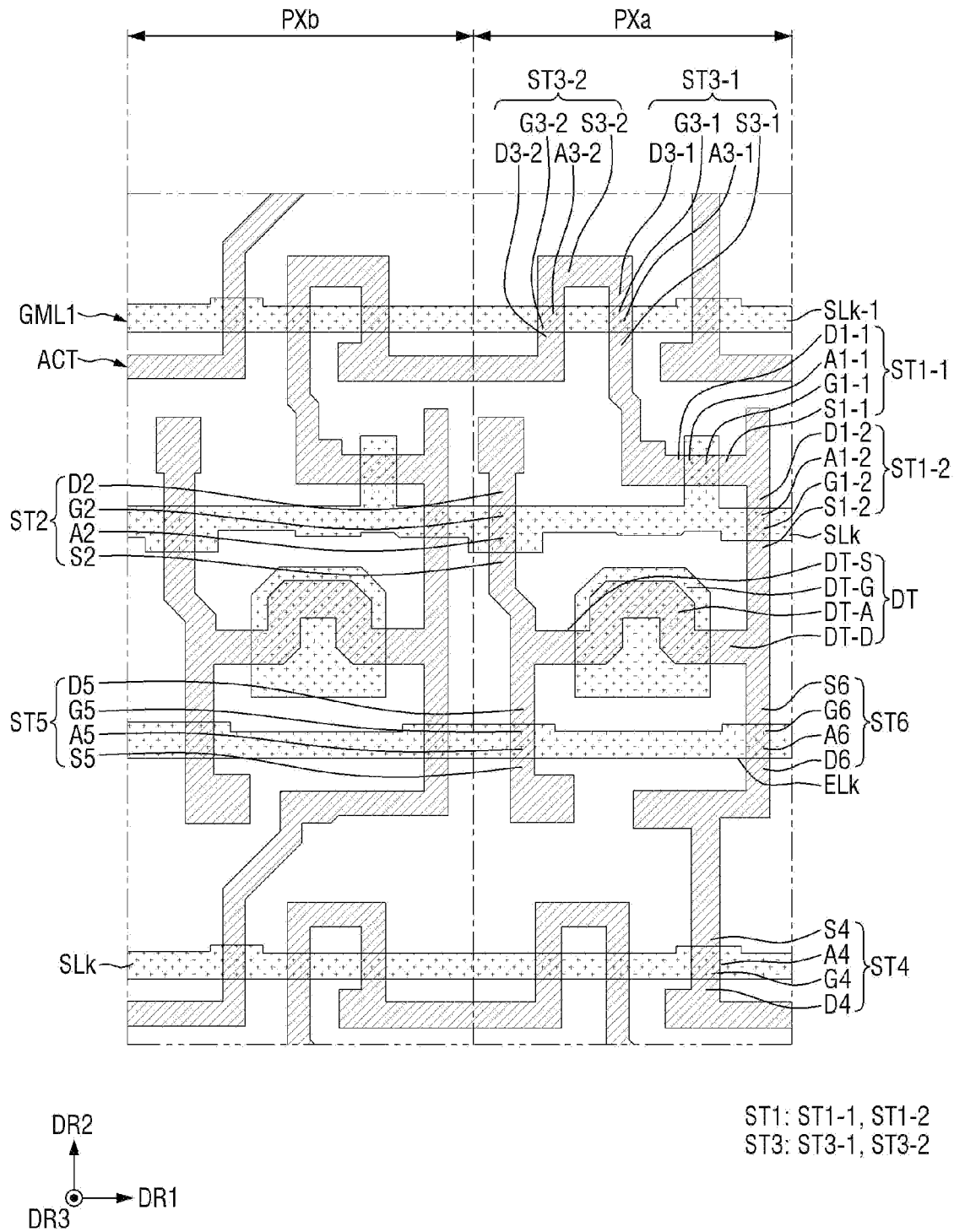
FIG. 8 is a schematic plan view further illustrating a first gate conductive layer of FIG. 6 in addition to FIG. 7.
Figure 9:
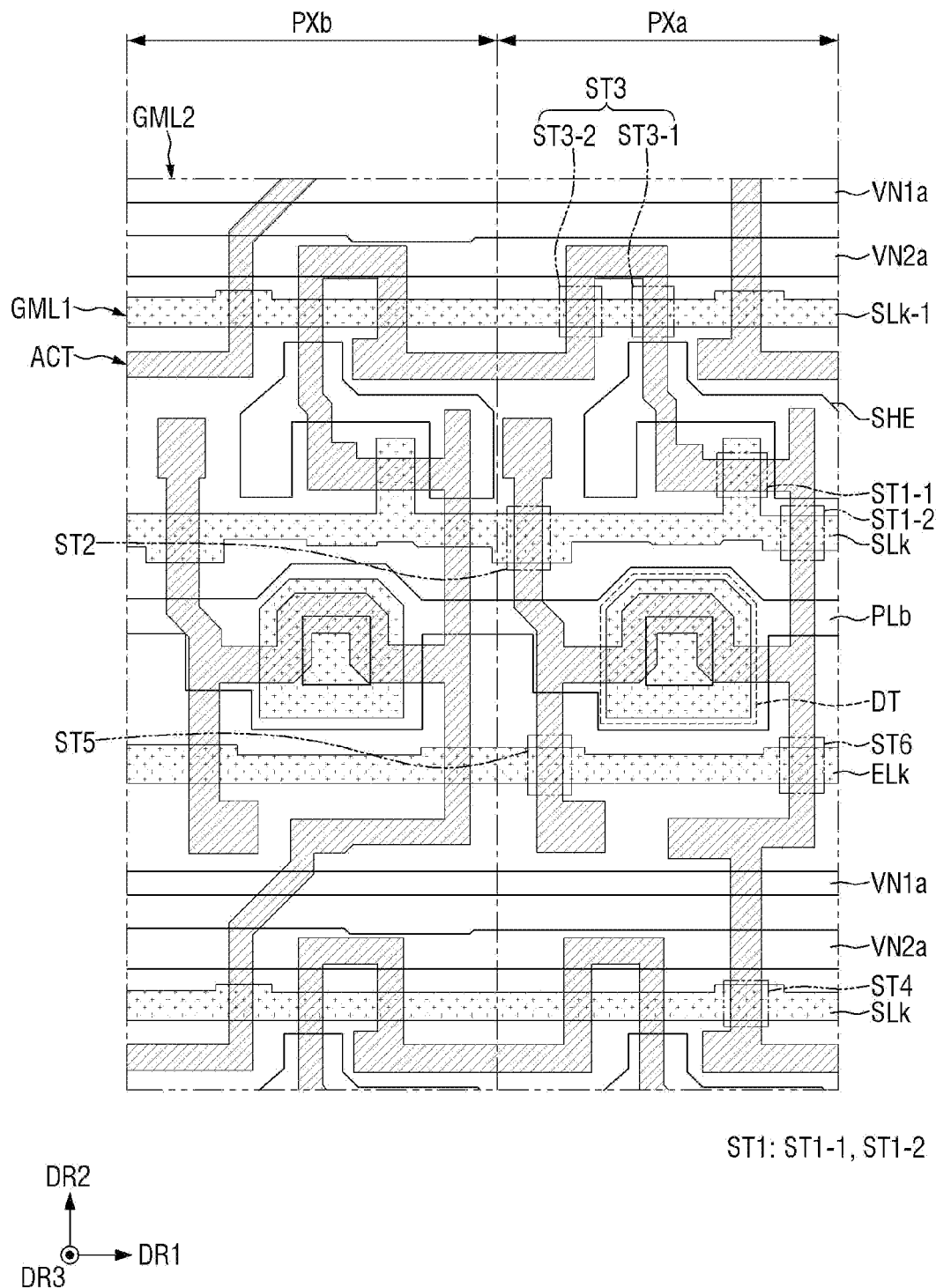
FIG. 9 is a schematic plan view further illustrating a second gate conductive layer of FIG. 6 in addition to FIG. 8.
Figure 10:
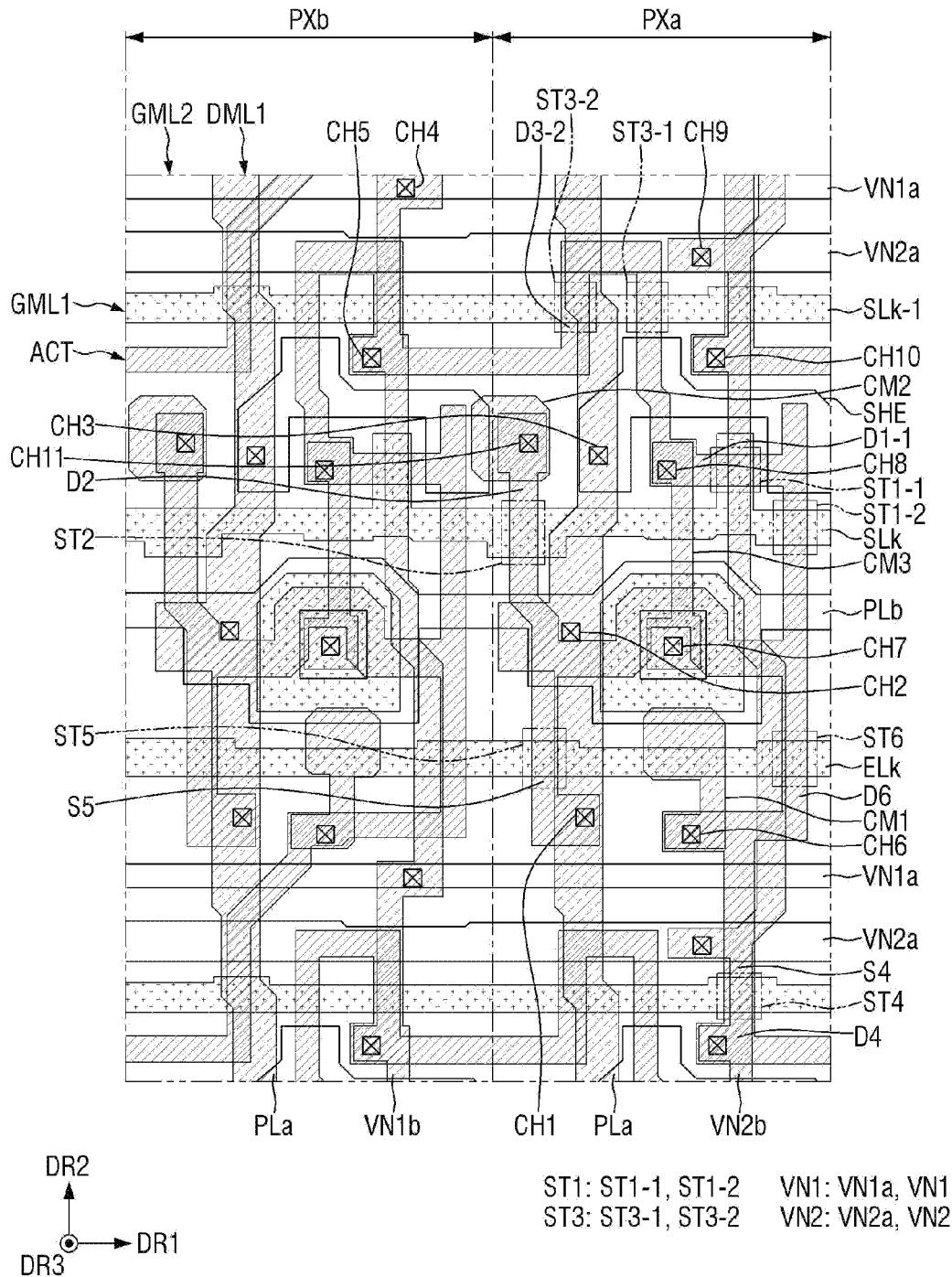
FIG. 10 is a schematic plan view further illustrating a first data conductive layer and contact holes of FIG. 6 in addition to FIG. 9.
Figure 11:
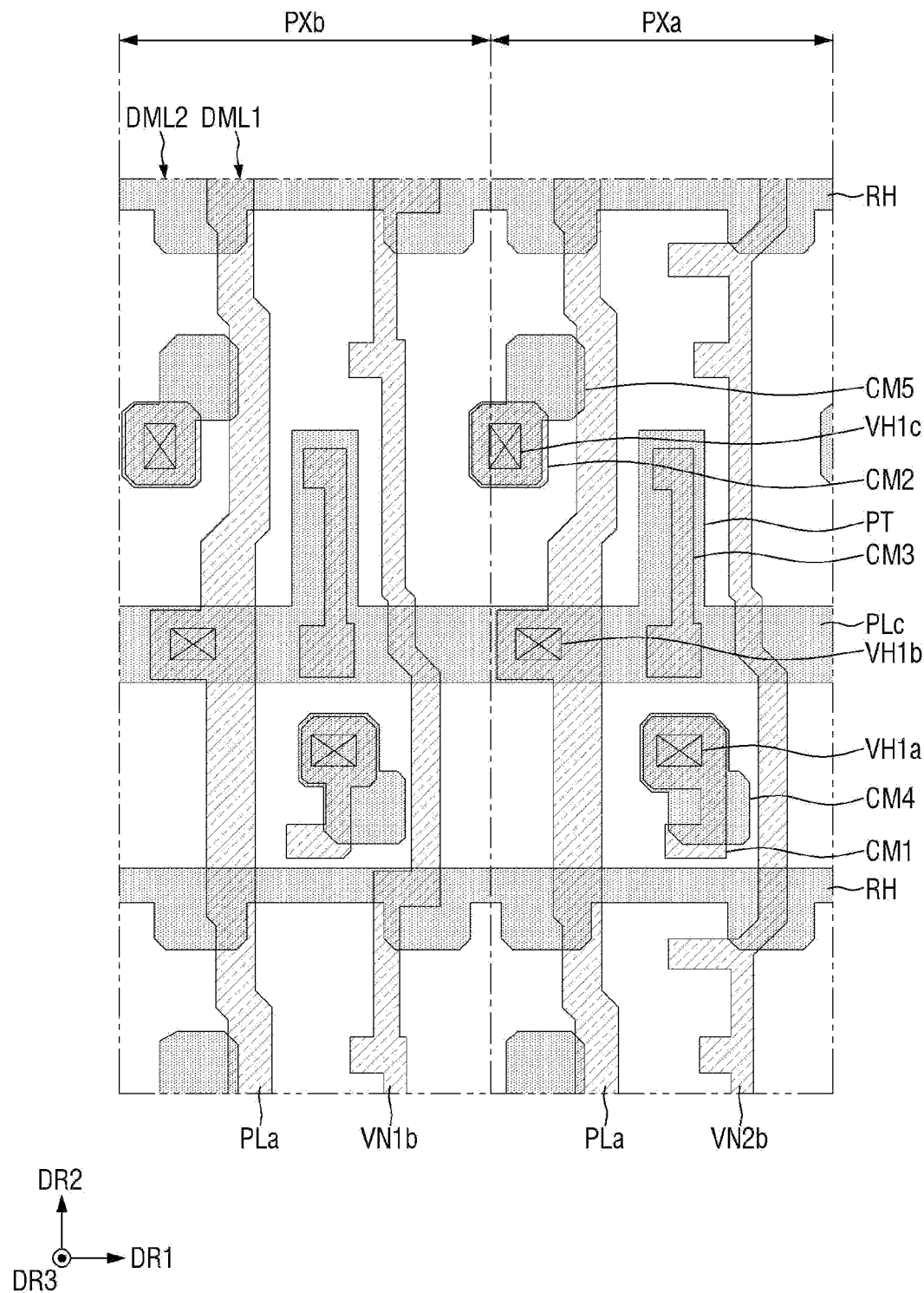
FIG. 11 is a schematic plan view illustrating a first data conductive layer, a second data conductive layer, and via holes illustrated in FIG. 6.
Figure 12:
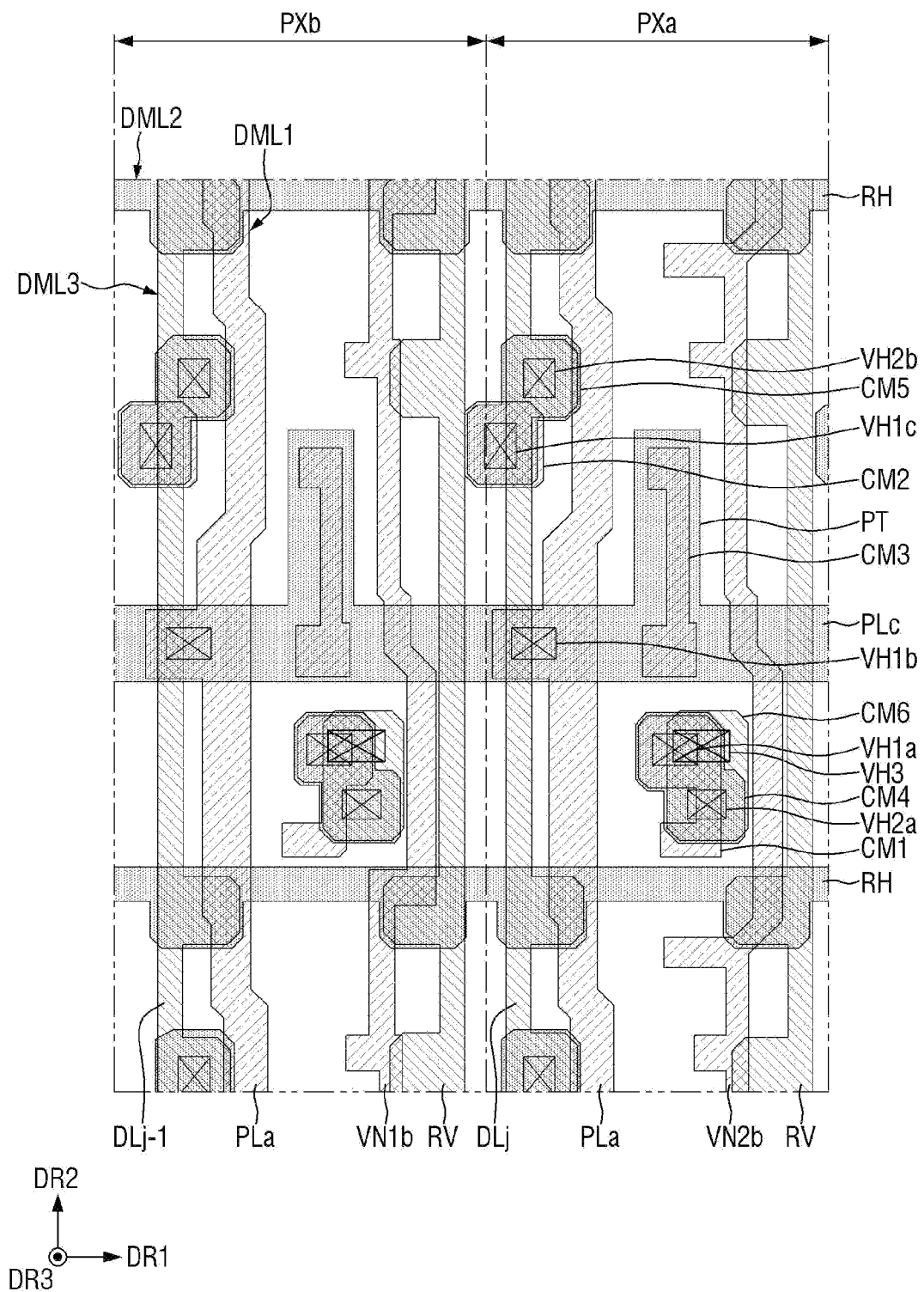
FIG. 12 is a schematic plan view further illustrating a third data conductive layer and via holes of FIG. 6 in addition to FIG. 11.
Figure 13:
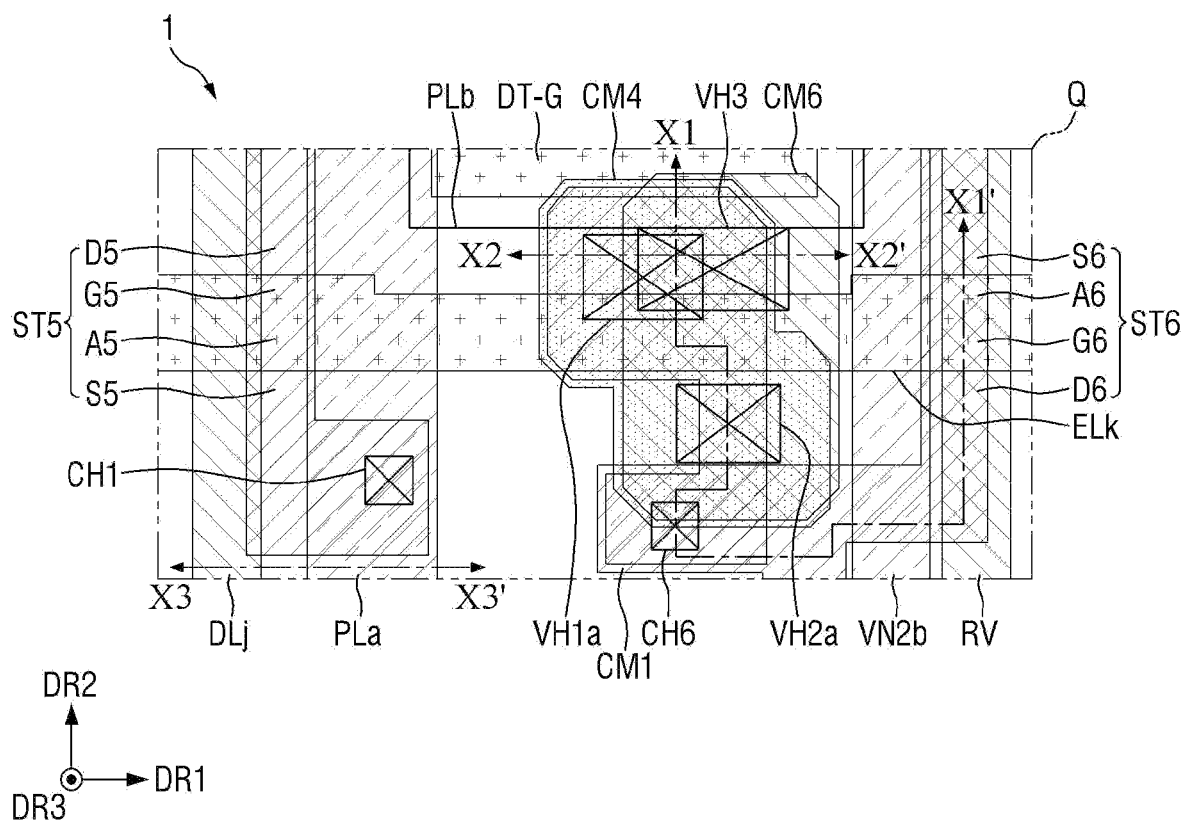
FIG. 13 is a schematic plan view of the display device according to an embodiment in which portion Q of FIG. 6 is enlarged.
Figure 14:
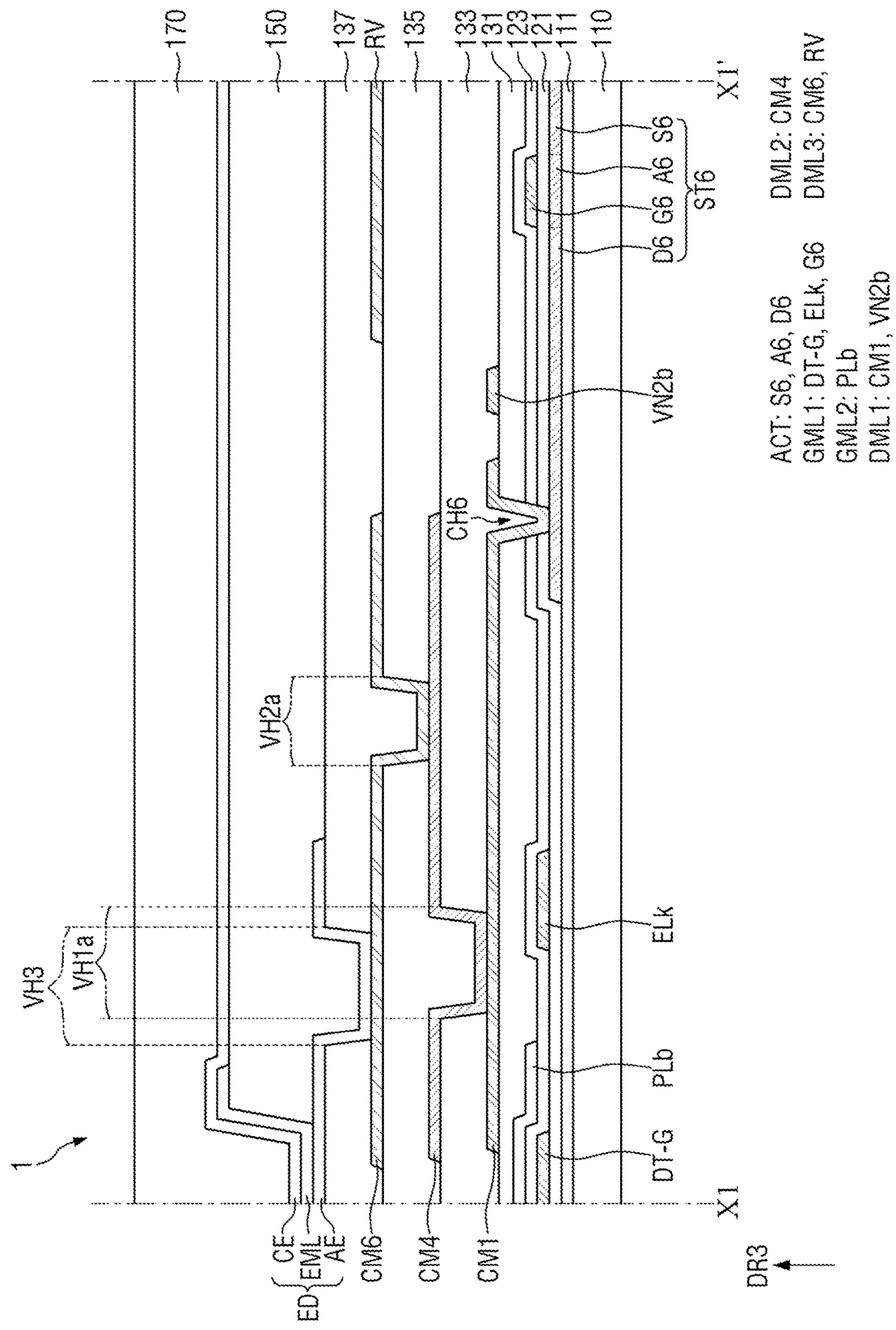
FIG. 14 is a schematic cross-sectional view taken along line X1-X1' of FIG. 13.
Figure 15:
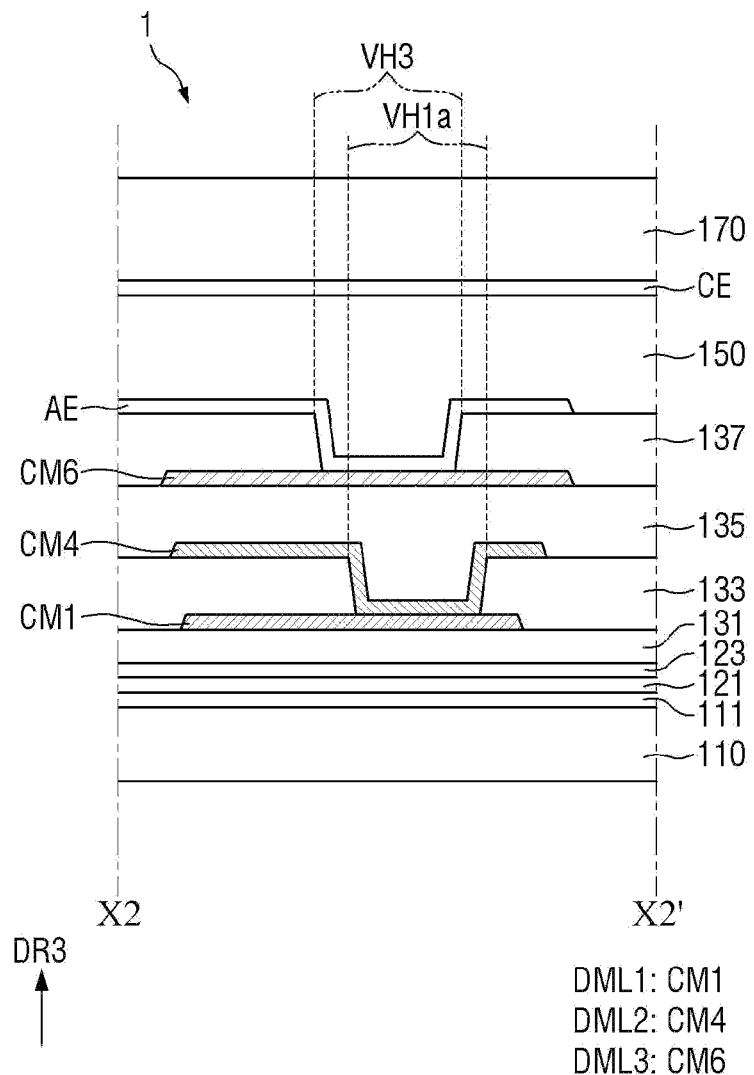
FIG. 15 is a schematic cross-sectional view taken along line X2-X2' of FIG. 13.
Figure 16:
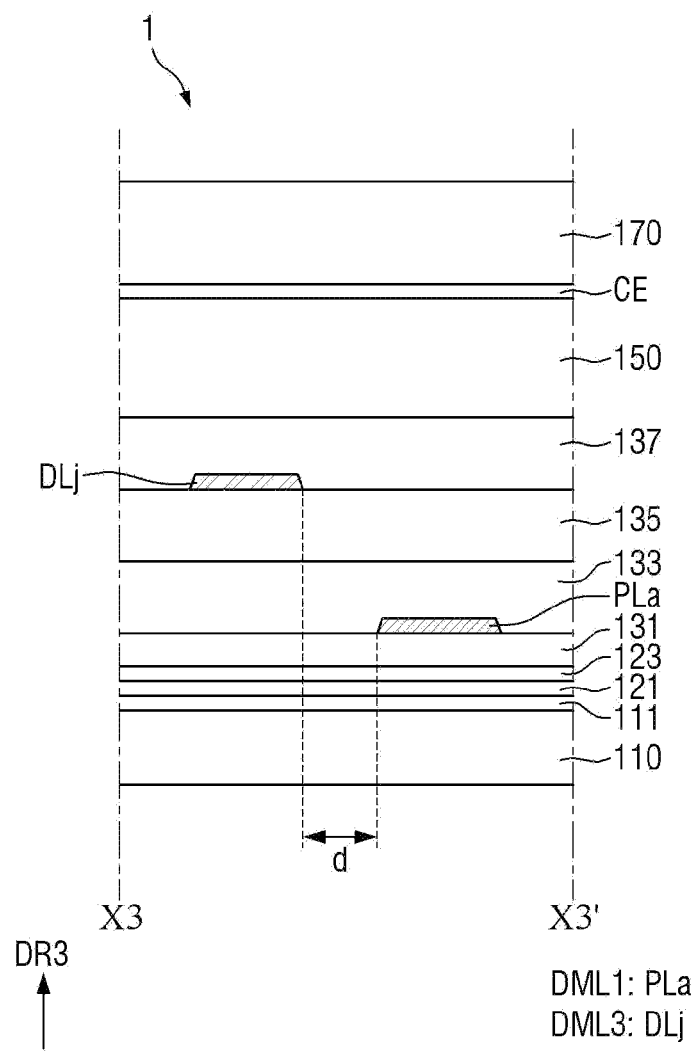
FIG. 16 is a schematic cross-sectional view taken along line X3-X3' of FIG. 13.
Figure 17:
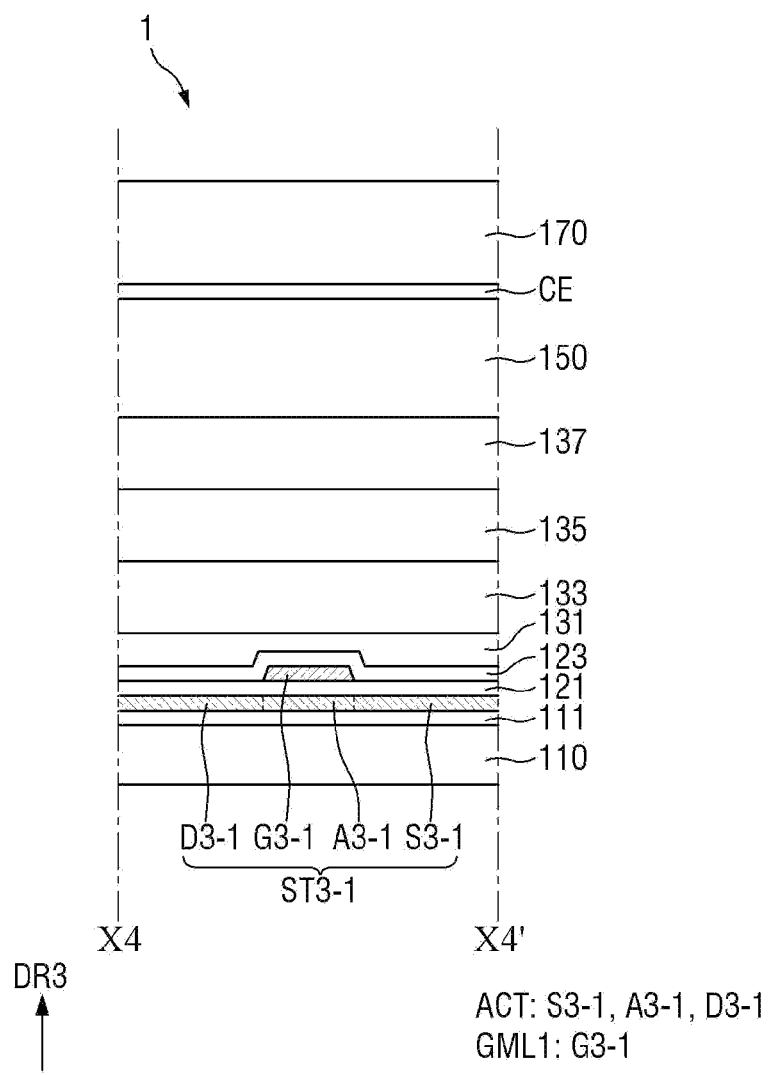
FIG. 17 is a schematic cross-sectional view taken along line X4-X4' of FIG. 6.

FIG. 6 is a schematic plan view illustrating a structure of the pixel according to an embodiment illustrated in FIG. 5, FIG. 7 is a schematic plan view illustrating only a semiconductor layer in the structure of the pixel illustrated in FIG. 6, FIG. 8 is a schematic plan view further illustrating a first gate conductive layer of FIG. 6 in addition to FIG. 7, FIG. 9 is a schematic plan view further illustrating a second gate conductive layer of FIG. 6 in addition to FIG. 8, FIG. 10 is a schematic plan view further illustrating a first data conductive layer and contact holes of FIG. 6 in addition to FIG. 9, FIG. 11 is a schematic plan view illustrating a first data conductive layer, a second data conductive layer, and via holes illustrated in FIG. 6, FIG. 12 is a schematic plan view further illustrating a third data conductive layer and via holes of FIG. 6 in addition to FIG. 11, FIG. 13 is a schematic plan view of the display device according to an embodiment in which portion Q of FIG. 6 is enlarged, FIG. 14 is a schematic cross-sectional view taken along line X1-X1' of FIG. 13, FIG. 15 is a schematic cross-sectional view taken along line X2-X2' of FIG. 13, FIG. 16 is a schematic cross-sectional view taken along line X3-X3' of FIG. 13, and FIG. 17 is a schematic cross-sectional view taken along line X4-X4' of FIG. 6.

In FIGS. 6 to 12, two pixels and their surrounding structures are illustrated. In case that a right pixel of the two pixels illustrated in FIGS. 6 to 12 is referred to as a first pixel PXa and a left pixel of the two pixels is referred to as a second pixel PXb, a circuit structure of each of the first pixel PXa and the second pixel PXb may be the same as illustrated in FIG. 5. Hereinafter, for convenience of description, the first pixel PXa will be mainly described.

Referring to FIGS. 6 to 17, a buffer layer 111 may be positioned on a base part 110 as illustrated in FIGS. 14 to 17.

The base part 110 may be made of (or include) a transmissive material. In some embodiments, the base part 110 may be a glass substrate or a plastic substrate. In case that the base part 110 is a plastic substrate, the base part 110 may have flexibility. Hereinafter, in the specification, the base part 110 and a substrate may be used interchangeably as a same meaning. For example, the base part 110 in a detailed description may be referred to as a substrate in the claims.

The buffer layer 111 may prevent a phenomenon in which metal atoms, impurities, or the like, are diffused from the base part 110 to a semiconductor layer ACT positioned on the buffer layer 111. The buffer layer 111 may cause the semiconductor layer ACT to be uniformly crystallized by adjusting a heat feeding rate during a crystallization process for forming the semiconductor layer ACT. The buffer layer 111 may be formed as multiple films in which one or more inorganic films of a silicon nitride layer, a silicon oxynitride layer, a silicon oxide layer, a titanium oxide layer, and an aluminum oxide layer are alternately stacked. In some embodiments, the buffer layer 111 may be omitted.

As illustrated in FIG. 14, the semiconductor layer ACT may be positioned on the buffer layer 111. The semiconductor layer ACT may include a silicon semiconductor. In some embodiments, the semiconductor layer ACT may include at least one of polycrystalline silicon, single crystal (or monocrystalline) silicon, low-temperature polycrystalline silicon, and amorphous silicon. In some embodiments, the semiconductor layer ACT may include polycrystalline silicon crystallized at a low temperature.

In some embodiments, a portion of the semiconductor layer ACT may be doped with ions. The semiconductor layer ACT doped with ions may have conductivity. Therefore, the semiconductor layer ACT may include first electrodes DT-S, S1-1, S1-2, S2, S3-1, S3-2, S4, S5, and S6 and second electrodes DT-D, D1-1, D1-2, D2, D3-1, D3-2, D4, D5, and D6 as well as active layers DT-A, A1-1, A1-2, A2, A3-1, A3-2, A4, A5, and A6 of the driving transistor DT and the first to sixth transistors ST1, ST2, ST3, ST4, ST5, and ST6, as illustrated in FIGS. 6 and 7.

In some embodiments, a shape of a portion of the semiconductor layer ACT positioned in the first pixel PXa and a shape of a portion of the semiconductor layer ACT positioned in the second pixel PXb may be partially different from each other as illustrated in FIG. 7.

As illustrated in FIG. 14, a first gate insulating layer 121 may be positioned on the semiconductor layer ACT. The first gate insulating layer 121 may include an insulating material. In some embodiments, the first gate insulating layer 121 may include an inorganic insulating material such as silicon oxide, silicon nitride, titanium oxide, silicon oxynitride, or aluminum oxide.

In some embodiments, a shape of a portion of a first gate conductive layer GML1 positioned in the first pixel PXa and a shape of a portion of the first gate conductive layer GML1 positioned in the second pixel PXb may be substantially the same as each other as illustrated in FIG. 8.

As illustrated in FIG. 14, the first gate conductive layer GML1 may be positioned on the first gate insulating layer 121.

The first gate conductive layer GML1 may include gate electrodes DT-G, G1-1, G1-2, G2, G3-1, G3-2, G4, G5, and G6 of the driving transistor DT and the first to sixth transistors ST1, ST2, ST3, ST4, ST5, and ST6, a k−1-th scan line SLk−1, a k-th scan line SLk, and a k-th emission control line ELk, as illustrated in FIG. 8.

The k−1-th scan line SLk−1, the k-th scan line SLk, and the k-th emission control line ELk may extend in the first direction DR1, as illustrated in FIGS. 6 and 8, and overlap the semiconductor layer ACT. Portions of the k−1-th scan line SLk−1, the k-th scan line SLk, and the k-th emission control line ELk overlapping the semiconductor layer ACT may be the gate electrodes G1-1, G1-2, G2, G3-1, G3-2, G4, G5, and G6 of the first to sixth transistors ST, ST2, ST3, ST4, ST5, and ST6.

The driving transistor DT may include the active layer DT-A, the gate electrode DT-G, the first electrode DT-S, and the second electrode DT-D. The active layer DT-A of the driving transistor DT may overlap the gate electrode DT-G of the driving transistor DT. The gate electrode DT-G may be disposed on the active layer DT-A of the driving transistor DT.

The gate electrode DT-G of the driving transistor DT may be disposed on the first gate conductive layer GML1 to be spaced apart from the k−1-th scan line SLk−1, the k-th scan line SLk, and the k-th emission control line ELk, and may overlap the active layer DT-A of the driving transistor DT. In some embodiments, the gate electrode DT-G of the driving transistor DT may have an isolated shape.

The gate electrode DT-G of the driving transistor DT may be electrically connected to a third connection pattern CM3 (see FIGS. 6 and 10) through a seventh contact hole CH7 (see FIG. 10) to be described below.

The first electrode DT-S of the driving transistor DT may be electrically connected to the first electrode S2 of the second transistor ST2. The second electrode DT-D of the driving transistor DT may be electrically connected to the first electrode S1-2 of the 1-2-th transistor ST1-2 and the first electrode S6 of the sixth transistor ST6.

The first transistor ST1 may be formed as a dual transistor. The first transistor ST1 may include a 1-1-th transistor ST1-1 and a 1-2-th transistor ST1-2.

The 1-1-th transistor ST1-1 may include the active layer A1-1, the gate electrode G1-1, the first electrode S1-1, and the second electrode D1-1. The first electrode S1-1 of the 1-1-th transistor ST1-1 may be electrically connected to the second electrode D1-2 of the 1-2-th transistor ST1-2. The second electrode D1-1 of the 1-1-th transistor ST1-1 may be electrically connected to a third connection pattern CM3 (see FIGS. 6 and 10) through an eighth contact hole CH8 (see FIG. 10) to be described below.

The gate electrode G1-1 of the 1-1-th transistor ST1-1 may be a portion of the k-th scan line SLk, and may be a portion of the k-th scan line SLk overlapping the active layer A1-1 of the 1-1-th transistor ST1-1 when viewed in a plan view or in the third direction DR3.

The first electrode S1-2 of the 1-2-th transistor ST1-2 may be electrically connected to the second electrode DT-D of the driving transistor DT. The second electrode D1-2 of the 1-2-th transistor ST1-2 may be electrically connected to the first electrode S1-1 of the 1-1-th transistor ST1-1.

The gate electrode G1-2 of the 1-2-th transistor ST1-2 may be a portion of the k-th scan line SLk, and may be a portion of the k-th scan line SLk overlapping the active layer A1-2 of the 1-2-th transistor ST1-2 when viewed in a plan view or in the third direction DR3.

The second transistor ST2 may include the active layer A2, the gate electrode G2, the first electrode S2, and the second electrode D2. The gate electrode G2 of the second transistor ST2 may be a portion of the k-th scan line SLk, and may be a portion of the k-th scan line SLk overlapping the active layer A2 of the second transistor ST2. The first electrode S2 of the second transistor ST2 may be electrically connected to the first electrode DT-S of the driving transistor DT. The second electrode D2 of the second transistor ST2 may be electrically connected to a second connection pattern CM2 (see FIGS. 6 and 10) through an eleventh contact hole CH11 (see FIG. 10) to be described below. The second connection pattern CM2 (see FIGS. 6 and 10) may be electrically connected to a j-th data line DLj (see FIG. 6) to be described below.

The third transistor ST3 may be formed as a dual transistor. The third transistor ST3 may include a 3-1-th transistor ST3-1 and a 3-2-th transistor ST3-2.

The 3-1-th transistor ST3-1 may include the active layer A3-1, the gate electrode G3-1, the first electrode S3-1, and the second electrode D3-1. The gate electrode G3-1 of the 3-1-th transistor ST3-1 may be a portion of the k−1-th scan line SLk−1, and may be a portion of the k−1-th scan line SLk−1 overlapping the active layer A3-1 of the 3-1-th transistor ST3-1. The first electrode S3-1 of the 3-1-th transistor ST3-1 may be electrically connected to the third connection pattern CM3 (see FIGS. 6 and 10) through the eighth contact hole CH8 (see FIG. 10) to be described below, and may be electrically connected to the gate electrode DT-G of the driving transistor DT through the medium of the third connection pattern CM3 (see FIGS. 6 and 10).

The 3-2-th transistor ST3-2 may include the active layer A3-2, the gate electrode G3-2, the first electrode S3-2, and the second electrode D3-2. The gate electrode G3-2 of the 3-2-th transistor ST3-2 may be a portion of the k−1-th scan line SLk−1, and may be a portion of the k−1-th scan line SLk−1 overlapping the active layer A3-2 of the 3-2-th transistor ST3-2. The first electrode S3-2 of the 3-2-th transistor ST3-2 may be electrically connected to the second electrode D3-1 of the 3-1-th transistor ST3-1. The second electrode D3-2 of the 3-2-th transistor ST3-2 may be electrically connected to a first upper initialization voltage line VN1b (see FIGS. 6 and 10) of a first initialization voltage line VN1 (see FIG. 6) through a fifth contact hole CH5 (see FIG. 10) to be described below.

The fourth transistor ST4 may include the active layer A4, the gate electrode G4, the first electrode S4, and the second electrode D4. The gate electrode G4 of the fourth transistor ST4 may be a portion of the k-th scan line SLk, and may be a portion of the k-th scan line SLk overlapping the active layer A4 of the fourth transistor ST4. The first electrode S4 of the fourth transistor ST4 may be electrically connected to the second electrode D6 of the sixth transistor ST6. The first electrode S4 of the fourth transistor ST4 or the second electrode D6 of the sixth transistor ST6 may be electrically connected to a first connection pattern CM1 (see FIGS. 10 and 14) through a sixth contact hole CH6 (see FIGS. 10 and 14) to be described below.

The second electrode D4 of the fourth transistor ST4 may be electrically connected to a second upper initialization voltage line VN2b (see FIGS. 6 and 10) of a second initialization voltage line VN2 through a ninth contact hole CH9 (see FIG. 10) to be described below.

The fifth transistor ST5 may include the active layer A5, the gate electrode G5, the first electrode S5, and the second electrode D5. The gate electrode G5 of the fifth transistor ST5 may be a portion of the k-th emission control line ELk, and may be a portion of the k-th emission control line ELk overlapping the active layer A5 of the fifth transistor ST5. The first electrode S5 of the fifth transistor ST5 may be electrically connected to a first voltage line PLa (see FIGS. 6 and 10) of a first driving voltage line PL (see FIG. 6) through a first contact hole CH1 (see FIG. 10) to be described below. The second electrode D5 of the fifth transistor ST5 may be electrically connected to the first electrode DT-S of the driving transistor DT.

The sixth transistor ST6 may include the active layer A6, the gate electrode G6, the first electrode S6, and the second electrode D6. The gate electrode G6 of the sixth transistor ST6 may be a portion of the k-th emission control line ELk, and may be a portion of the k-th emission control line ELk overlapping the active layer A6 of the sixth transistor ST6. The first electrode S6 of the sixth transistor ST6 may be electrically connected to the second electrode DT-D of the driving transistor DT. The second electrode D6 of the sixth transistor ST6 may be electrically connected to the first connection pattern CM1 (see FIGS. 6 and 10) through a sixth contact hole CH6 to be described below.

In some embodiments, the first gate conductive layer GML1 may include a metal, an alloy, a conductive metal oxide, a transparent conductive material, or the like. For example, the first gate conductive layer GML1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. Such a first gate conductive layer GML1 may have a multilayer structure, for example, a two-layer structure of Mo/Al or a three-layer structure of Mo/Al/Mo.

As illustrated in FIG. 14, a second gate insulating layer 123 may be positioned on the first gate conductive layer GML1. In some embodiments, the second gate insulating layer 123 may include an insulating material and may include an insulating material that is the same as or similar to that of the first gate insulating layer 121.

As illustrated in FIG. 14, a second gate conductive layer GML2 may be positioned on the second gate insulating layer 123.

On a second gate conductive layer GML2, as illustrated in FIGS. 6 and 9, a first lower initialization voltage line VN1a of the first initialization voltage line VN1, a second lower initialization voltage line VN2a of the second initialization voltage line VN2, a second voltage line PLb of the first driving voltage line PL, and a shielding pattern SHE may be positioned.

The first lower initialization voltage line VN1a, the second lower initialization voltage line VN2a, and the second voltage line PLb may extend in the first direction DR1 as illustrated in FIGS. 6 and 9.

In some embodiments, the second voltage line PLb may include a portion overlapping the gate electrode DT-G of the driving transistor DT. The gate electrode DT-G of the driving transistor DT may be the first electrode of the capacitor CS illustrated in FIG. 5, and a portion of the second voltage line PLb overlapping the gate electrode DT-G of the driving transistor DT may be the second electrode of the capacitor CS illustrated in FIG. 5.

In some embodiments, the second voltage line PLb may have an opening defined in the portion thereof overlapping the gate electrode DT-G of the driving transistor DT. The opening defined in the second voltage line PLb may provide a path through which a third connection pattern CM3 (see FIG. 10) to be described below and the gate electrodes DT-G of the driving transistor DT are electrically connected to each other.

The shielding pattern SHE may overlap at least a portion of the first transistor ST1 in a plan view. The first transistor ST1 may be disposed most adjacent to a j+1-th data line (not illustrated) among the first to sixth transistors ST1 to ST6.

The first electrode S1-1 of the 1-1-th transistor ST1-1 and the second electrode S1-2 of the 1-2-th transistor ST1-2 may be disposed adjacent to the j+1-th data line. In this case, a parasitic capacitance may be formed between the first electrode S1-1 of the 1-1-th transistor ST1-1 and the j+1-th data line and between the second electrode S1-2 of the 1-2-th transistor ST1-2 and the j+1-th data line. The parasitic capacitance may be a fringe capacitance. Due to the parasitic capacitance, the first electrode S1-1 of the 1-1-th transistor ST1-1 and the second electrode S1-2 of the 1-2-th transistor ST1-2 may be affected by a data voltage transition of the j+1-th data line.

The shielding pattern SHE may overlap the first electrode S1-1 of the 1-1-th transistor ST1-1 and the second electrode S1-2 of the 1-2-th transistor ST1-2 in a plan view. Accordingly, the shielding pattern SHE may block and reduce a fringe field formed between the first electrode S1-1 of the 1-1-th transistor ST1-1 and the j+1-th data line and between the second electrode S1-2 of the 1-2-th transistor ST1-2 and the j+1-th data line, and resultantly, the above-described parasitic capacitance may be reduced. Therefore, a phenomenon in which the first electrode S1-1 of the 1-1-th transistor ST1-1 and the second electrode S1-2 of the 1-2-th transistor ST1-2 are affected by the data voltage transition of the j+1-th data line may be reduced.

In some embodiments, the shielding pattern SHE may be electrically connected to the first voltage line PLa of the first driving voltage line PL through a third contact hole CH3 (see FIG. 10) to be described below.

The second gate conductive layer GML2 may include a metal, an alloy, a conductive metal oxide, a transparent conductive material, or the like. For example, the second gate conductive layer GML2 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. Such a second gate conductive layer GML2 may have a multilayer structure, for example, a two-layer structure of Mo/Al or a three-layer structure of Mo/Al/Mo.

As illustrated in FIGS. 14 to 17, a first insulating layer 131 may be positioned on the second gate insulating layer 123. The first insulating layer 131 may cover the second gate conductive layer GML2 as illustrated in FIGS. 14 and 17.

In some embodiments, the first insulating layer 131 may include an inorganic insulating material. For example, the first insulating layer 131 may include an inorganic insulating material such as silicon oxide, silicon nitride, titanium oxide, silicon oxynitride, or aluminum oxide. In some embodiments, the first insulating layer 131 may have a single-layer structure or a multilayer structure. For example, the first insulating layer 131 may have a double-layer structure of silicon nitride/silicon oxide.

As another example, in some other embodiments, the first insulating layer 131 may include an organic insulating material. For example, the first insulating layer 131 may include a photoresist, benzocyclobutene (BCB), polyimide, hexamethyldisiloxane (HMDSO), polymethylmethacrylate (PMMA), polystyrene, a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, or mixtures thereof.

As another example, in some other embodiments, the first insulating layer 131 may have a multilayer structure of an inorganic layer made of an inorganic insulating material and an organic layer made of an organic insulating material.

In some embodiments, a first contact hole CH1, a second contact hole CH2, a third contact hole CH3, a fourth contact hole CH4, a fifth contact hole CH5, a sixth contact hole CH6, a seventh contact hole CH7, an eighth contact hole CH8, a ninth contact hole CH9, a tenth contact hole CH10, and an eleventh contact hole CH11 illustrated in FIG. 10 may be defined in the first insulating layer 131. Some of the above-described contact holes may be further defined in the first gate insulating layer 121 and the second gate insulating layer 123 or may not be further defined in the first gate insulating layer 121 and may be further defined only in the second gate insulating layer 123.

In some embodiments, the first contact hole CH1 may be defined in the first insulating layer 131, the first gate insulating layer 121, and the second gate insulating layer 123 to partially expose the first electrode S5 of the fifth transistor ST5.

In some embodiments, the second contact hole CH2 may be defined in the first insulating layer 131 to expose a portion of the second voltage line PLb.

In some embodiments, the third contact hole CH3 may be defined in the first insulating layer 131 to expose a portion of the shielding pattern SHE.

In some embodiments, the fourth contact hole CH4 may be defined in the first insulating layer 131 to expose a portion of the first lower initialization voltage line VN1a.

In some embodiments, the fifth contact hole CH5 may be defined in the first insulating layer 131, the first gate insulating layer 121, and the second gate insulating layer 123 to partially expose the second electrode D3-2 of the 3-2-th transistor ST3-2.

In some embodiments, the sixth contact hole CH6 may be defined in the first insulating layer 131, the first gate insulating layer 121, and the second gate insulating layer 123 to partially expose the second electrode D6 of the sixth transistor ST6.

In some embodiments, the seventh contact hole CH7 may be defined in the first insulating layer 131 and the second gate insulating layer 123 to partially expose the gate electrodes DT-G of the driving transistor DT.

In some embodiments, the eighth contact hole CH8 may be defined in the first insulating layer 131, the first gate insulating layer 121, and the second gate insulating layer 123 to partially expose the second electrode D1-1 of the 1-1-th transistor ST1-1 or the first electrode S3-1 of the 3-1-th transistor ST3-1.

In some embodiments, the ninth contact hole CH9 may be defined in the first insulating layer 131 to expose a portion of the second lower initialization voltage line VN2a.

In some embodiments, the tenth contact hole CH10 may be defined in the first insulating layer 131, the first gate insulating layer 121, and the second gate insulating layer 123 to partially expose the second electrode D4 of the fourth transistor ST4.

In some embodiments, the eleventh contact hole CH11 may be defined in the first insulating layer 131, the first gate insulating layer 121, and the second gate insulating layer 123 to partially expose the second electrode D2 of the second transistor ST2.

As illustrated in FIGS. 14 to 17, a first data conductive layer DML1 may be positioned on the first insulating layer 131.

The first data conductive layer DML1 may include the first voltage line PLa of the first driving voltage line PL, the first upper initialization voltage line VN1b of the first initialization voltage line VN1, the second upper initialization voltage line VN2b of the second initialization voltage line VN2, the first connection pattern CM1, the second connection pattern CM2, and the third connection pattern CM3, as illustrated in FIGS. 6 and 10.

The first voltage line PLa may extend in the second direction DR2.

The first voltage line PLa may be electrically connected to the first electrode S5 of the fifth transistor ST5 through the first contact hole CH1. The first voltage line PLa may be electrically connected to the second voltage line PLb of the first gate conductive layer GML1 through the second contact hole CH2, and may be electrically connected to the shielding pattern SHE of the first gate conductive layer GML1 through the third contact hole CH3. Accordingly, the first driving voltage ELVDD (see FIG. 5) may be provided to the first voltage line PLa, the second voltage line PLb, the first electrode S5 of the fifth transistor ST5, and the shielding pattern SHE.

The first upper initialization voltage line VN1b of the first initialization voltage line VN1 and the second upper initialization voltage line VN2b of the second initialization voltage line VN2 may extend in the second direction DR2.

The first upper initialization voltage line VN1b may be electrically connected to the first lower initialization voltage line VN1a through the fourth contact hole CH4, and may be electrically connected to the second electrode D3-2 of the 3-2-th transistor ST3-2 through the fifth contact hole CH5. Accordingly, the first initialization voltage VINT1 (see FIG. 5) may be provided to the first upper initialization voltage line VN1b, the first lower initialization voltage line VN1a, and the second electrode D3-2 of the 3-2-th transistor ST3-2.

The second upper initialization voltage line VN2b may be electrically connected to the second lower initialization voltage line VN2a through the ninth contact hole CH9, and may be electrically connected to the second electrode D4 of the fourth transistor ST4 through the tenth contact hole CH10. Accordingly, the second initialization voltage VINT2 (see FIG. 5) may be provided to the second upper initialization voltage line VN2b, the second lower initialization voltage line VN2a, and the second electrode D4 of the fourth transistor ST4.

The first connection pattern CM1, the second connection pattern CM2, and the third connection pattern CM3 may be disposed to be spaced apart from each other.

The first connection pattern CM1 may be electrically connected to the second electrode D6 of the sixth transistor ST6 through the sixth contact hole CH6, and may be electrically connected to a self-light emitting element ED (see FIG. 14) to be described below.

The second connection pattern CM2 may be electrically connected to the second electrode D2 of the second transistor ST2 through the eleventh contact hole CH11, and may be electrically connected to a j-th data line DLj to be described below.

The third connection pattern CM3 may be electrically connected to the gate electrode DT-G of the driving transistor DT through the seventh contact hole CH7, and may be electrically connected to the first electrode S3-1 of the 3-1-th transistor ST3-1 or the second electrode D1-1 of the 1-1-th transistor ST1-1 through the eighth contact hole CH8. Accordingly, the first electrode S3-1 of the 3-1-th transistor ST3-1 or the second electrode D1-1 of the 1-1-th transistor ST1-1 may be electrically connected to the gate electrode DT-G of the driving transistor DT through the medium of the third connection pattern CM3.

In some embodiments, the first data conductive layer DML1 may include a metal, an alloy, a conductive metal oxide, a transparent conductive material, or the like. For example, the first data conductive layer DML1 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide (ITO), indium zinc oxide (IZO), or the like. Such a first data conductive layer DML1 may have a multilayer structure, for example, a two-layer structure of Ti/Al or a three-layer structure of Ti/Al/Ti.

As illustrated in FIGS. 14 to 16, a second insulating layer 133 may be positioned on the first data conductive layer DML1.

In some embodiments, the second insulating layer 133 may be a planarization layer. In some embodiments, the second insulating layer 133 may include an organic insulating material and may include at least one of the organic insulating materials described above in the description of the first insulating layer 131.

In some embodiments, portions of the second insulating layer 133 may fill inner portions of the contact holes defined in the first insulating layer 131.

In some embodiments, a first lower via hole VH1a, a second lower via hole VH1b, and a third lower via hole VH1c illustrated in FIG. 11 may be defined in the second insulating layer 133.

In some embodiments, the first lower via hole VH1a may expose a portion of the first connection pattern CM1, the second lower via hole VH1b may expose a portion of the first voltage line PLa, and the third lower via hole VH1c may expose a portion of the second connection pattern CM2.

As illustrated in FIGS. 14 and 15, a second data conductive layer DML2 may be positioned on the second insulating layer 133.

The second data conductive layer DML2 may include a third voltage line PLc of the first driving voltage line PL, a first conductive line RH, a fourth connection pattern CM4, and a fifth connection pattern CM5, as illustrated in FIGS. 6 and 11.

The third voltage line PLc may extend in the second direction DR2.

The third voltage line PLc may be electrically connected to the first voltage line PLa through the second lower via hole VH1b. Accordingly, the first driving voltage ELVDD (see FIG. 5) may be provided to the third voltage line PLc.

In some embodiments, the third voltage line PLc may include a protrusion part PT protruding in the second direction DR2. The protrusion part PT may overlap the third connection pattern CM3 as illustrated in FIGS. 6 and 12. In some embodiments, the protrusion part PT may completely cover the third connection pattern CM3 in a plan view. The protrusion part PT covers the third connection pattern CM3, such that a phenomenon in which a gate signal provided to the gate electrodes DT-G of the driving transistor DT is affected by a voltage provided to other components (the data line and the driving voltage line) may be prevented or minimized, and thus, display quality of the display device may be improved. For example, the protrusion part PT may function as a barrier or a shielding electrode.

The first conductive line RH may extend in the first direction DR1. In some embodiments, the first conductive line RH may overlap the first lower initialization voltage line VN1a of the first initialization voltage line VN1 as illustrated in FIG. 6. In some embodiments, the first conductive line RH may completely cover the first lower initialization voltage line VN1a in a plan view.

In some embodiments, the first conductive line RH may intersect and partially overlap a j-th data line DLj and a j-1-th data line DLj-1 to be described below.

In some embodiments, the first conductive line RH may be any of the horizontal connection lines or any of the horizontal dummy lines illustrated in FIG. 4. In case that the first conductive line RH is any of the horizontal connection lines illustrated in FIG. 4, the data voltage may be provided to the first conductive line RH, and the first conductive line RH may be electrically connected to a data line different from the j-th data line DLj and the j-1-th data line DLj-1. As another example, in case that the first conductive line RH is any of the horizontal dummy lines illustrated in FIG. 4, the first conductive line RH may not be electrically connected to the data lines and other components. In other words, in case that the first conductive line RH is any of the horizontal dummy lines, a separate voltage or signal may not be provided to the first conductive line RH.

The fourth connection pattern CM4 and the fifth connection pattern CM5 may be spaced apart from each other.

The fourth connection pattern CM4 may be disposed to overlap the first connection pattern CM1, and may be electrically connected to the first connection pattern CM1 through the first lower via hole VH1a.

The fifth connection pattern CM5 may be disposed to overlap the second connection pattern CM2, and may be electrically connected to the second connection pattern CM2 through the third lower via hole VH1c.

The second data conductive layer DML2 may include a metal, an alloy, a conductive metal oxide, a transparent conductive material, or the like. For example, the second data conductive layer DML2 may include at least one of the materials mentioned as the example of the materials of the first data conductive layer DML1. The second data conductive layer DML2 may have a multilayer structure, for example, a two-layer structure of Ti/Al or a three-layer structure of Ti/Al/Ti.

As illustrated in FIGS. 14 and 15, a third insulating layer 135 may be positioned on the second data conductive layer DML2.

In some embodiments, the third insulating layer 135 may be a planarization layer. In some embodiments, the third insulating layer 135 may include an organic insulating material and may include at least one of the organic insulating materials described above in the description of the first insulating layer 131.

In some embodiments, portions of the third insulating layer 135 may be positioned in the first lower via hole VH1a, the second lower via hole VH1b, and the third lower via hole VH1c to fill the remaining spaces except for portions occupied by the second data conductive layer DML2 in internal spaces of the first lower via hole VH1a, the second lower via hole VH1b, and the third lower via hole VH1c.

In some embodiments, a first intermediate via hole VH2a and a second intermediate via hole VH2b illustrated in FIG. 12 may be defined in the third insulating layer 135.

In some embodiments, the first intermediate via hole VH2a may expose a portion of the fourth connection pattern CM4, and the second intermediate via hole VH2b may expose a portion of the fifth connection pattern CM5.

As illustrated in FIGS. 14 to 16, a third data conductive layer DML3 may be positioned on the third insulating layer 135.

The third data conductive layer DML3 may include a j−1-th data line DLj−1, a j-th data line DLj, a second conductive line RV, and a sixth connection pattern CM6, as illustrated in FIGS. 6 and 12.

The j-th data line DLj and the j−1-th data line DLj−1 may be electrically connected to the fifth connection patterns CM5 through the second intermediate via holes VH2b, respectively. Accordingly, the data voltage (or data signal) may be provided to the second electrode D2 of the second transistor ST2 via the fifth connection pattern CM5 and the second connection pattern CM2.

In some embodiments, the j-th data line DLj and the j−1-th data line DLj−1 may not overlap the first voltage lines PLa in the vicinity of the second transistor ST2 and the fifth transistor ST5, respectively. Since the j-th data line DLj and the j−1-th data line DLj−1 do not overlap the first voltage lines PLa in the vicinity of the second transistor ST2 and the fifth transistor ST5, a parasitic capacitance generated between the j-th data line DLj and the first voltage line PLa and a parasitic capacitance generated between the j−1-th data line DLj−1 and the first voltage line PLa may be reduced, and deterioration of display quality due to the above-described parasitic capacitances may be prevented or minimized. In some embodiments, a horizontal spaced distance (or horizontal distance) d (see FIG. 16) between the j-th data line DLj and the first voltage line PLa may be about 1 μm to about 4 μm. In case that the horizontal distance d (see FIG. 16) is 1 μm or more, the generation of the parasitic capacitance described above may be prevented or minimized. The horizontal distance d (see FIG. 16) may be within 4 μm in consideration of a degree of integration of conductors in the pixel.

The second conductive line RV may extend in the second direction DR2.

In some embodiments, the second conductive line RV may be any of the vertical connection lines or any of the vertical dummy lines illustrated in FIG. 4. In case that the second conductive line RV is any of the vertical connection lines illustrated in FIG. 4, the data voltage may be provided to the second conductive line RV, and the second conductive line RV may be electrically connected to a different data line from the j-th data line DLj and the j−1-th data line DLj−1. As another example, in case that the second conductive line RV is any of the vertical dummy lines illustrated in FIG. 4, the second conductive line RV may not be electrically connected to the data lines and other components. In other words, in case that the second conductive line RV is any of the vertical dummy lines, a separate voltage or signal may not be provided to the second conductive line RV.

In some embodiments, the j-th data line DLj may be any of the second to ninth data lines DL2 to DL9 illustrated in FIG. 4, and the j−1-th data line DLj−1 may be any of the first to eighth data lines DL1 to DL8 illustrated in FIG. 4.

For example, in case that the j−1-th data line DLj−1 is the first data line DL1 illustrated in FIG. 4 and the j-th data line DLj is the second data line DL2 illustrated in FIG. 4, the first conductive line RH positioned on the upper side of FIG. 6 may be any of the first horizontal dummy line DBH1, the second horizontal dummy line DBH2, the fifth horizontal dummy line DBH5, the sixth horizontal dummy line DBH6, and the seventh horizontal dummy line DBH7 illustrated in FIG. 4. The second conductive line RV positioned on the right side of the j-th data line DLj in FIG. 6 may be the second vertical dummy line DBV2 illustrated in FIG. 4.

As another example, in case that the j−1-th data line DLj−1 is the fourth data line DL4 illustrated in FIG. 4 and the j-th data line DLj is the fifth data line DL5 illustrated in FIG. 4, the first conductive line RH positioned on the upper side of FIG. 6 may be any of the third and fourth horizontal connection lines BH3 and BH4 illustrated in FIG. 4 or any of the fifth to seventh horizontal dummy lines DBH5, DBH6, and DBH7 illustrated in FIG. 4, and the second conductive line RV positioned on the right side of the j-th data line DLj in FIG. 6 may be the fifth vertical dummy line DBV5 illustrated in FIG. 4.

For example, from the viewpoint of only the first pixel PXa, the j-th data line DLj may be the eighth data line DL8 illustrated in FIG. 4, the first conductive line RH positioned on the upper side of FIG. 6 may be the second horizontal dummy line DBH2 illustrated in FIG. 4, and the second conductive line RV positioned on the right side of the j-th data line DLj in FIG. 6 may be the fourth vertical connection line BV4 illustrated in FIG. 4.

As another example, in case that an intermediate via hole (or the fifth contact hole CNT5 of FIG. 4) through which the first conductive line RH and the second conductive line RV are electrically connected to each other is further provided in a structure of the first pixel PXa illustrated in FIG. 6, the j-th data line DLj may be the sixth data line DL6 illustrated in FIG. 4, the first conductive line RH positioned on the upper side of FIG. 6 may be the second horizontal connection line BH2 illustrated in FIG. 4, and the second conductive line RV positioned on the right side of the j-th data line DLj in FIG. 6 may be the second vertical connection line BV2 illustrated in FIG. 4.

The j-th data line DLj, the j−1-th data line DLj−1, the first conductive line RH, and the second conductive line RV and the structure of FIG. 4 may be variously matched within a possible range.

The sixth connection pattern CM6 may overlap the fourth connection pattern CM4 and may be electrically connected to the fourth connection pattern CM4 through the second intermediate via hole VH2b.

The third data conductive layer DML3 may include a metal, an alloy, a conductive metal oxide, a transparent conductive material, or the like. For example, the third data conductive layer DML3 may include at least one of the materials mentioned as the example of the materials of the first data conductive layer DML1. The third data conductive layer DML3 may have a multilayer structure, for example, a two-layer structure of Ti/Al or a three-layer structure of Ti/Al/Ti.

As illustrated in FIGS. 14 and 15, a fourth insulating layer 137 may be positioned on the third data conductive layer DML3.

In some embodiments, the fourth insulating layer 137 may be a planarization layer. In some embodiments, the fourth insulating layer 137 may include an organic insulating material and may include at least one of the organic insulating materials described above in the description of the first insulating layer 131.

In some embodiments, portions of the fourth insulating layer 137 may be positioned in the first intermediate via hole VH2a and the second intermediate via hole VH2b and may fill the remaining spaces except for portions occupied by the third data conductive layer DML3 in internal spaces of the first intermediate via hole VH2a and the second intermediate via hole VH2b.

In some embodiments, an upper via hole VH3 illustrated in FIGS. 12 to 15 may be defined in the fourth insulating layer 137.

In some embodiments, the upper via hole VH3 may expose a portion of the sixth connection pattern CM6.

A self-light emitting element ED may be positioned on the fourth insulating layer 137, as illustrated in FIG. 14. The self-light emitting element ED may include a first electrode AE, an emission layer EML, and a second electrode CE.

The first electrode AE may be positioned on the fourth insulating layer 137 and may be electrically connected to the sixth connection pattern CM6 through the upper via hole VH3.

The first electrode AE may be a (semi) transmissive electrode or a reflective electrode. In some embodiments, in a case of a top emission structure in which light is emitted from the emission layer EML toward the second electrode CE, the first electrode AE may be formed of a metal material having high reflectivity, such as a stacked structure (Ti/Al/Ti) of aluminum and titanium, a stacked structure (ITO/Al/ITO) of aluminum and indium tin oxide (ITO), an APC alloy, and a stacked structure (ITO/APC/ITO) of an APC alloy and ITO. The APC alloy is an alloy of silver (Ag), palladium (Pd), and copper (Cu).

A pixel defining film 150 may be positioned on the fourth insulating layer 137. The pixel defining film 150 may define an emission area. In some embodiments, the pixel defining film 150 may be formed to cover an edge of the first electrode AE. In some embodiments, the pixel defining film 150 may be formed of an organic insulating material such as an acryl resin, an epoxy resin, a phenolic resin, a polyamide resin, or a polyimide resin.

At least a portion of the emission layer EML may be positioned in an opening defined by the pixel defining layer 150. In case that the self-light emitting element ED is an organic light emitting element, the emission layer may include an organic material to emit a predetermined color. In some embodiments, the emission layer EML may be a low molecular weight organic material or a high molecular weight organic material and may further include functional layers such as a hole transport layer (HTL), a hole injection layer (HIL), an electron transport layer (ETL), and an electron injection layer (EIL).

In some embodiments, the emission layer EML may have a patterned shape corresponding to the first electrode AE as illustrated in FIG. 14. However, the disclosure is not limited thereto, and unlike the example illustrated in FIG. 14, the emission layer EML may also have a structure in which it is disposed integrally over the pixels and the pixel defining film 150, rather than the patterned shape.

The second electrode CE is positioned on the emission layer EML. The second electrode CE may be formed to cover the emission layer EML and may be formed as a common layer formed in common in the pixels.

In some embodiments, in case that the self-light emitting element ED has the top emission structure, the second electrode CE may be formed of a transparent conductive oxide material such as ITO or IZO capable of transmitting light therethrough or a semi-transmissive conductive material such as magnesium (Mg), silver (Ag), or an alloy of magnesium (Mg) and silver (Ag). In case that the second electrode CE is formed of a semi-transmissive conductive material, emission efficiency may be increased by a microcavity.

An encapsulation layer 170 may be positioned on the self-light emitting element ED. The encapsulation layer 170 may cover the self-light emitting element ED to prevent oxygen or moisture from permeating into the self-light emitting element ED. In some embodiments, the encapsulation layer 170 may include at least one inorganic film. In addition, the encapsulation layer 170 may include at least one organic film in order to protect the self-light emitting element ED from foreign materials such as dust.

As another example, a separate encapsulation substrate may be disposed on the self-light emitting element ED instead of the encapsulation layer 170, and a space between the encapsulation substrate and the self-light emitting element ED may be filled with a filler.

In the embodiment, describing a portion where the self-light emitting element ED and a transistor disposed under the self-light emitting element ED, for example, the sixth transistor ST6 are connected to each other in detail, at least two of three via holes may overlap each other.

Referring to FIGS. 13 to 15, the first lower via hole VH1a and the upper via hole VH3 of the first lower via hole VH1a, the first intermediate via hole VH2a, and the upper via hole VH3 of the display device 1 may partially overlap each other. The first intermediate via hole VH2a may not overlap both the first lower via hole VH1a and the upper via hole VH3. In order to form via holes in insulating layers, a margin needs to be secured. Due to the margin that needs to be secured, there may be restrictions on a degree of freedom in a design of a pixel, and there may be restrictions in disposing conductors (data lines, driving voltage lines, etc.) within a limited space. According to the embodiment, the first lower via hole VH1a and the upper via hole VH3 are formed to partially overlap each other, such that the degree of freedom in the design of the pixel may be improved. Since the first lower via hole VH1a and the upper via hole VH3 are formed to partially overlap each other, as illustrated in FIG. 16, the j-th data line DLj and the first voltage line PLa may be disposed so as not to overlap each other, and a horizontal distance d between the j-th data line DLj and the first voltage line PLa may be secured.

The first connection pattern CM1 and the fourth connection pattern CM4 directly contact each other and may be electrically connected to each other, in the first lower via hole VH1a. The first electrode AE of the self-light emitting element ED and the sixth connection pattern CM6 directly contact each other and may be electrically connected to each other, in the upper via hole VH3.

Since the first lower via hole VH1a and the upper via hole VH3 partially overlap each other, a portion of the first connection pattern CM1 directly contacting the fourth connection pattern CM4 (hereinafter, referred to as a "first contact portion") and a portion of the sixth connection pattern CM6 directly contacting the first electrode AE (hereinafter, referred to as a "third contact portion") may overlap each other as illustrated in FIGS. 14 and 15. A portion of the fourth connection pattern CM4 contacting the sixth connection pattern CM6 (hereinafter referred to as a "second contact portion") may not overlap the first contact portion of the first connection pattern CM1 directly contacting the fourth connection pattern CM4, and the second contact portion may not overlap the third contact portion of the sixth connection pattern CM6 directly contacting the first electrode AE.

Figure 18:
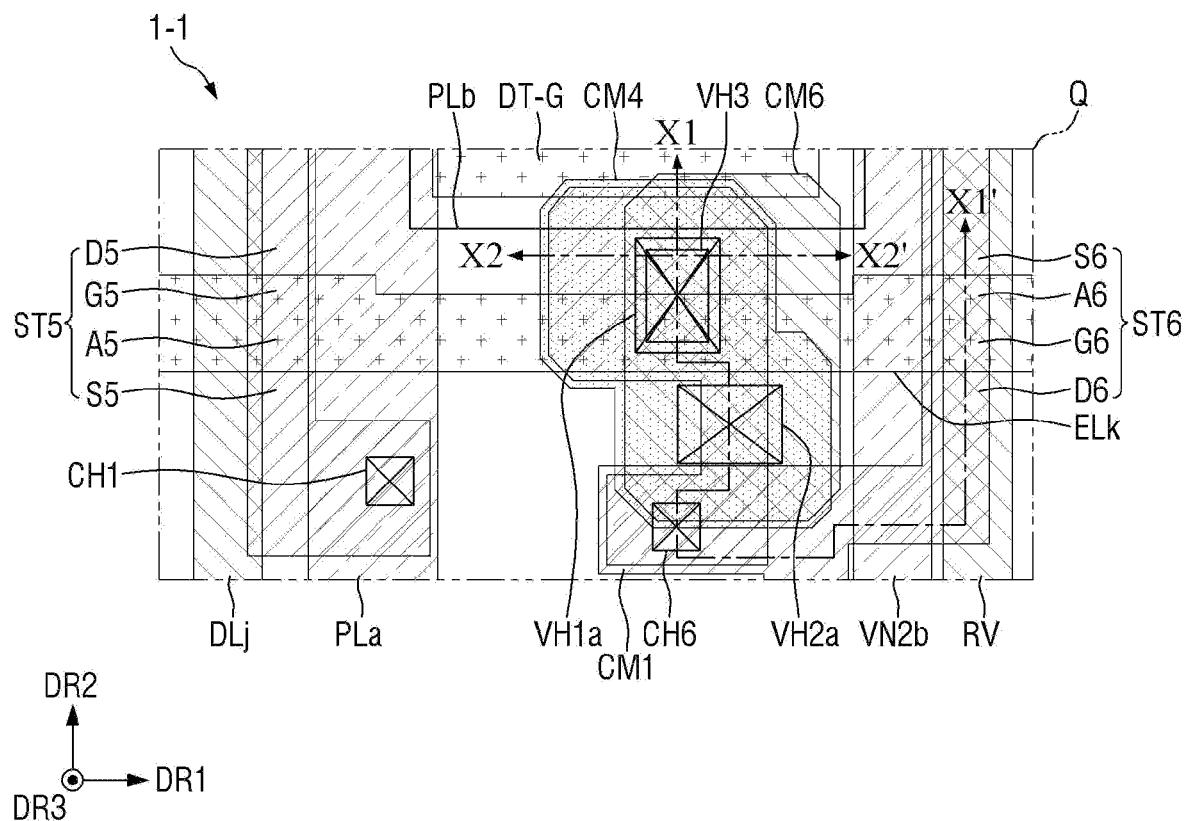
FIG. 18 is a schematic plan view illustrating a modified example of the display device illustrated in FIG. 13.
Figure 19:
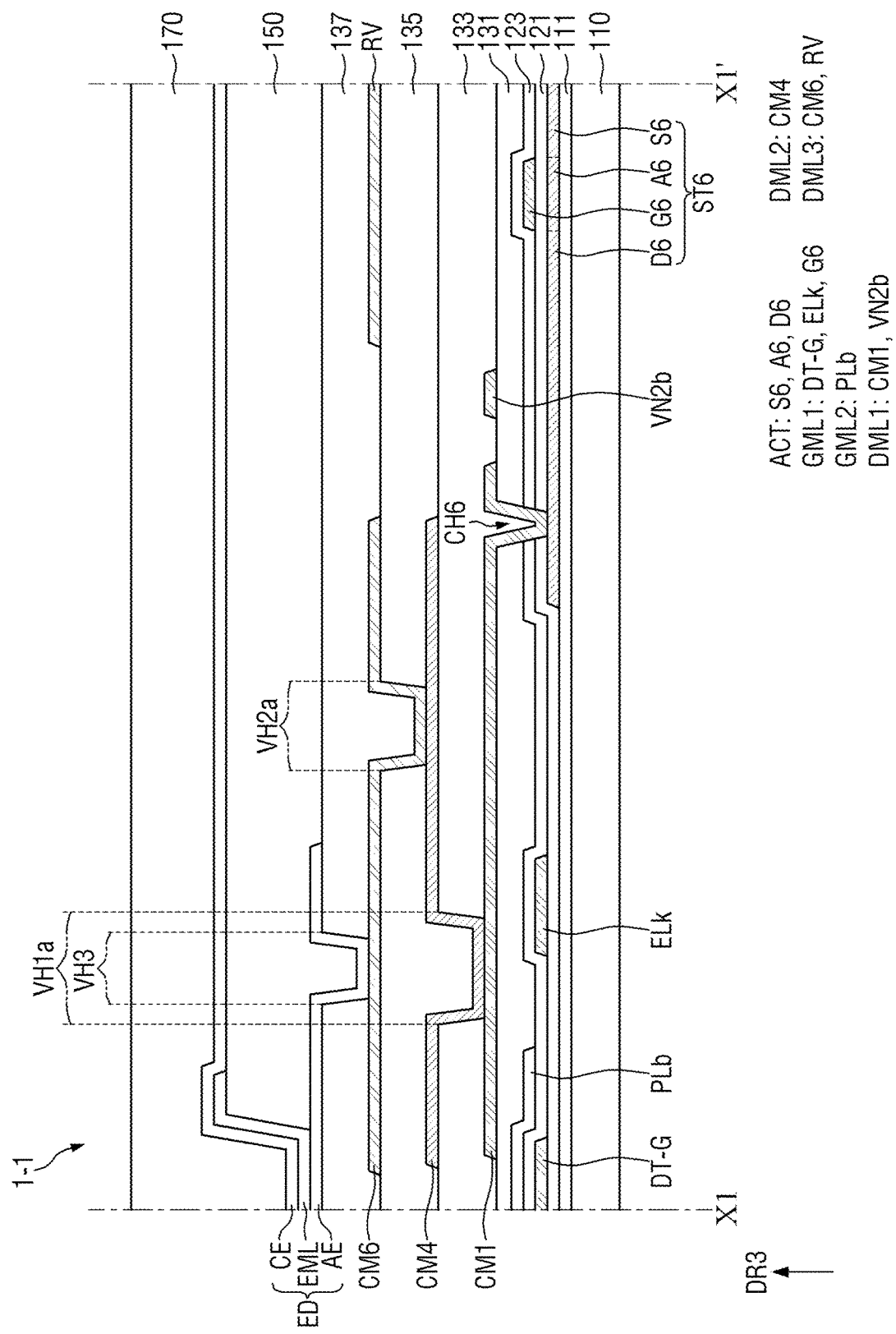
FIG. 19 is a schematic cross-sectional view taken along line X1-X1' of FIG. 18.
Figure 20:
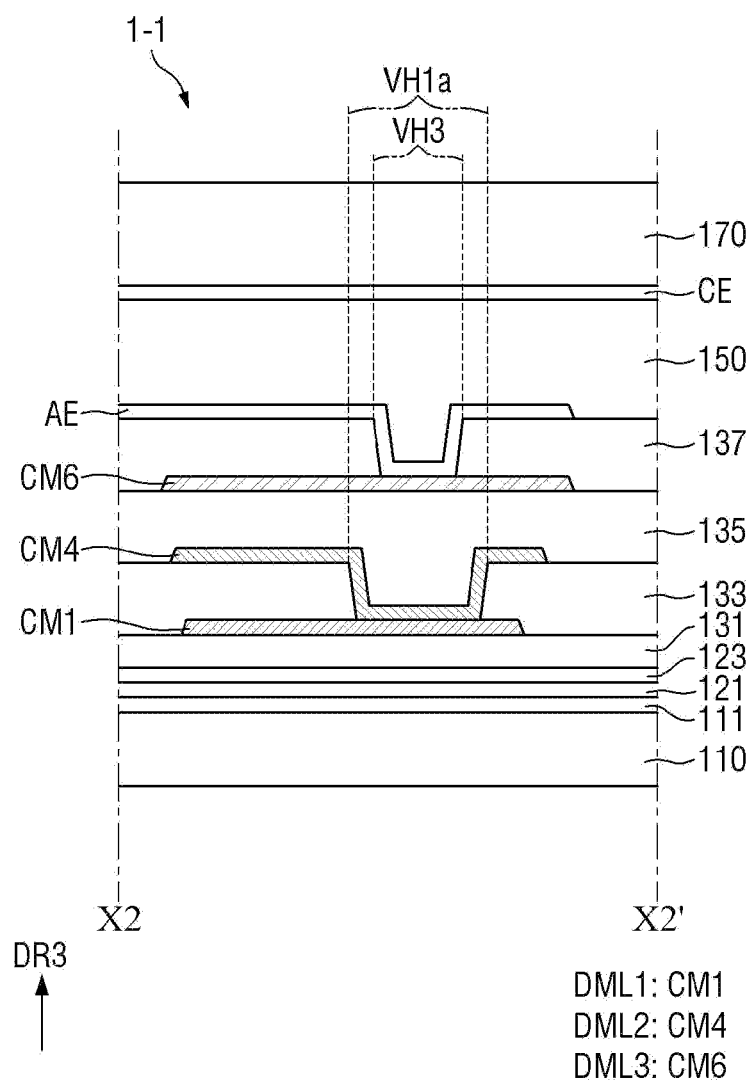
FIG. 20 is a schematic cross-sectional view taken along line X2-X2' of FIG. 18.

FIG. 18 is a schematic plan view illustrating a modified example of the display device illustrated in FIG. 13, FIG. 19 is a schematic cross-sectional view taken along line X1-X1' of FIG. 18, and FIG. 20 is a schematic cross-sectional view taken along line X2-X2' of FIG. 18.

Referring to FIGS. 18 to 20, a display device 1-1 according to an embodiment is different from the display device described above with reference to FIGS. 1 to 17 only in a relative disposition relationship between the first lower via hole VH1a defined in the second insulating layer 133 and the upper via hole VH3 defined in the fourth insulating layer 137, and is substantially the same as the display device described above in other configurations. Therefore, a difference between the display device 1-1 according to the embodiment and the display device described above will be mainly described below.

The first lower via hole VH1a and the upper via hole VH3 may overlap each other.

In some embodiments, in a plan view, the first lower via hole VH1a may completely surround the upper via hole VH3. In some embodiments, in a plan view, an area of the first lower via hole VH1a may be greater than an area of the upper via hole VH3.

In some embodiments, the upper via hole VH3 may completely overlap the first lower via hole VH1a, and the entirety of a portion of the sixth connection pattern CM6 directly contacting the first electrode AE may completely overlap a portion of the first connection pattern CM1 directly contacting the fourth connection pattern CM4. In other words, the third contact portion of the sixth connection pattern CM6 directly contacting the first electrode AE may not include a portion that does not overlap the first contact portion of the first connection pattern CM1 directly contacting the fourth connection pattern CM4.

Figure 21:
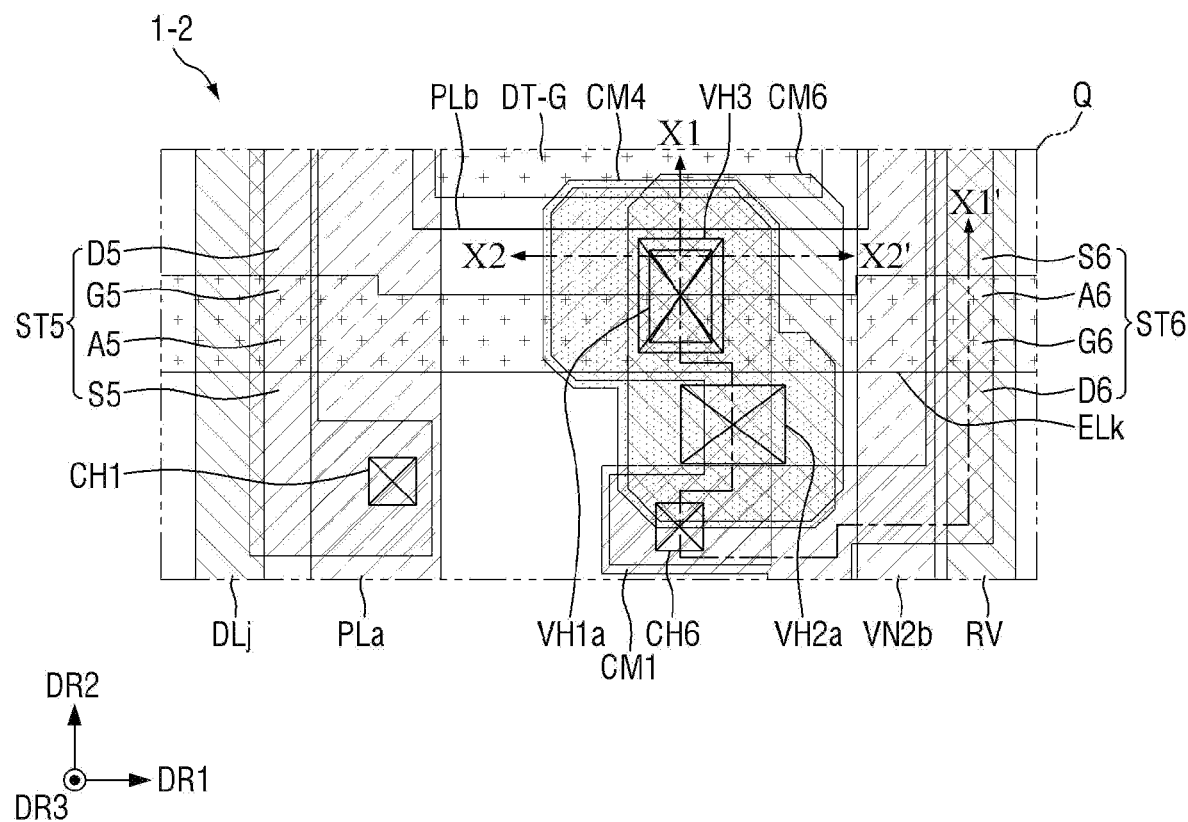
FIG. 21 is a schematic plan view illustrating another modified example of the display device illustrated in FIG. 13.
Figure 22:
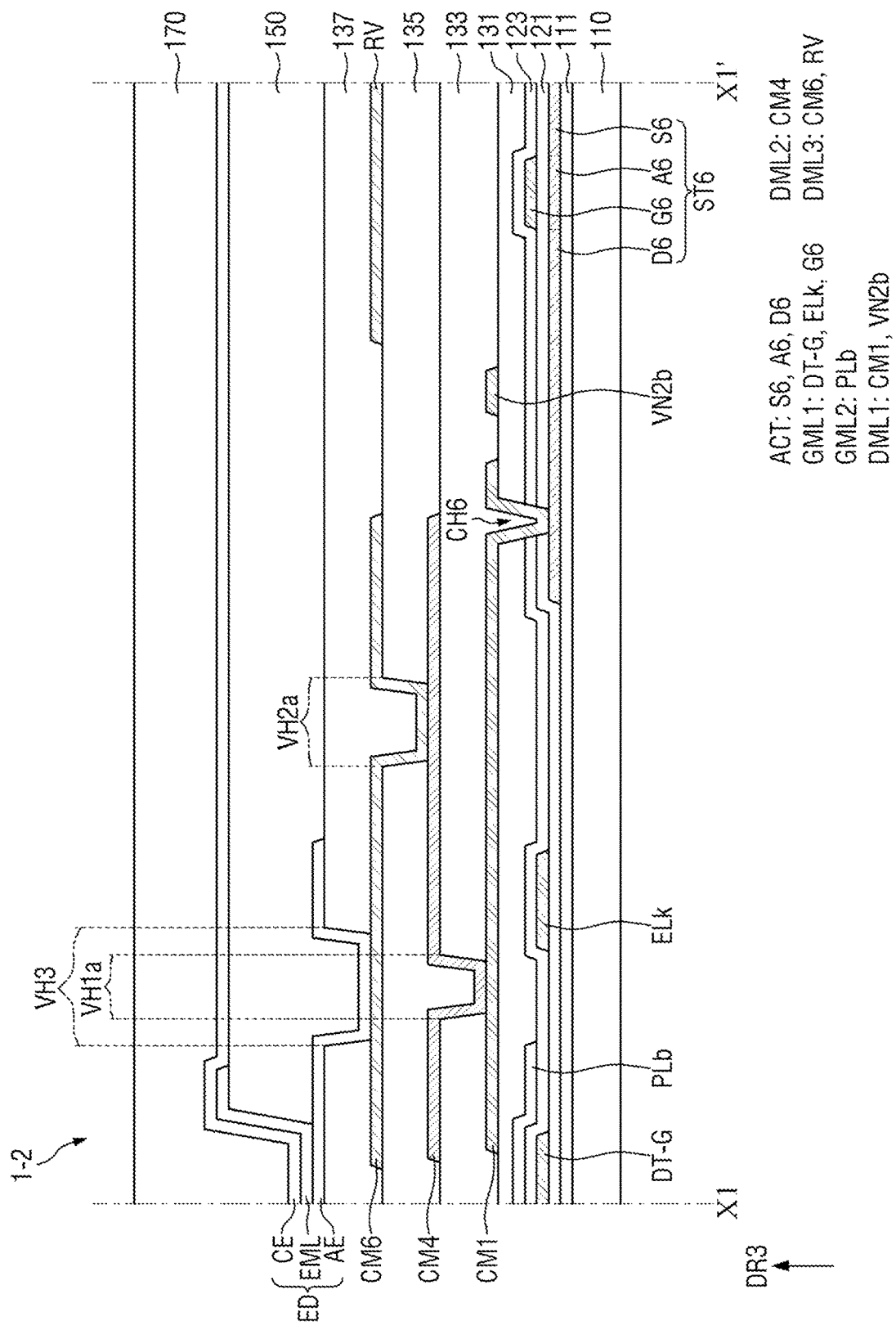
FIG. 22 is a schematic cross-sectional view taken along line X1-X1' of FIG. 21.
Figure 23:
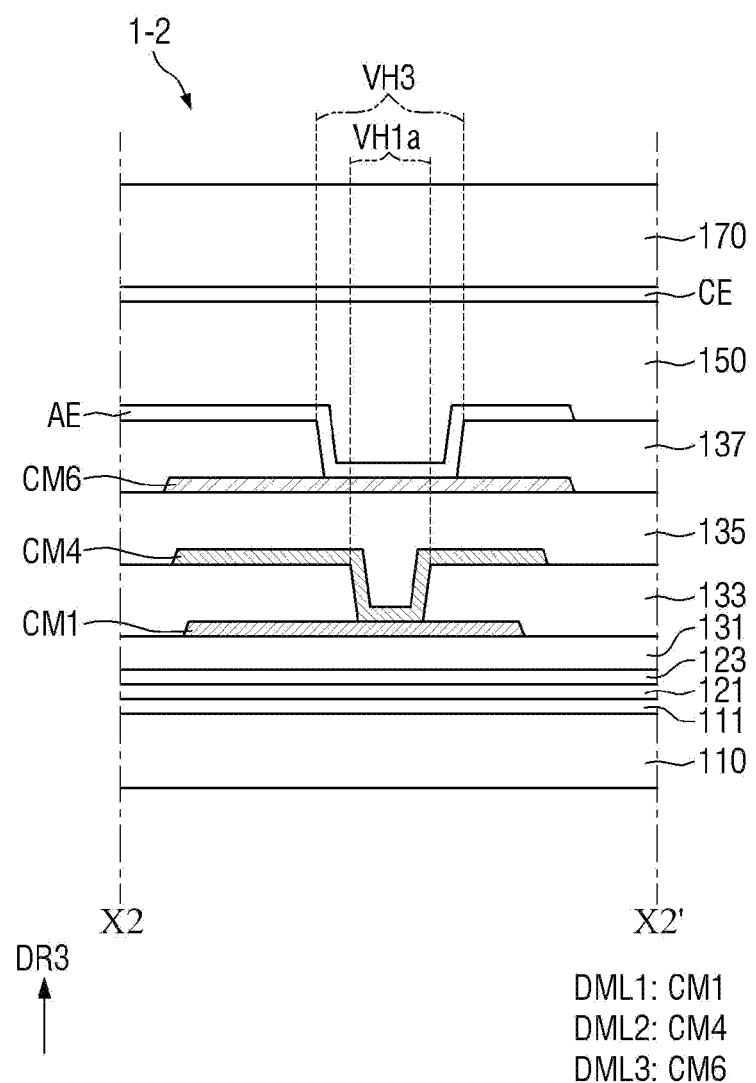
FIG. 23 is a schematic cross-sectional view taken along line X2-X2' of FIG. 21.

FIG. 21 is a schematic plan view illustrating another modified example of the display device illustrated in FIG. 13, FIG. 22 is a schematic cross-sectional view taken along line X1-X1' of FIG. 21, and FIG. 23 is a schematic cross-sectional view taken along line X2-X2' of FIG. 21.

Referring to FIGS. 21 to 23, in a display device 1-2 according to an embodiment, the first lower via hole VH1a and the upper via hole VH3 may overlap each other.

In a plan view, the upper via hole VH3 may completely surround the first lower via hole VH1a. In some embodiments, in a plan view, an area of the first lower via hole VH1a may be smaller than an area of the upper via hole VH3.

In some embodiments, the first lower via hole VH1a may completely overlap the upper via hole VH3, and the entirety of the first contact portion of the first connection pattern CM1 directly contacting the fourth connection pattern CM4 may completely overlap the third contact portion of the sixth connection pattern CM6 directly contacting the first electrode AE.

Figure 24:
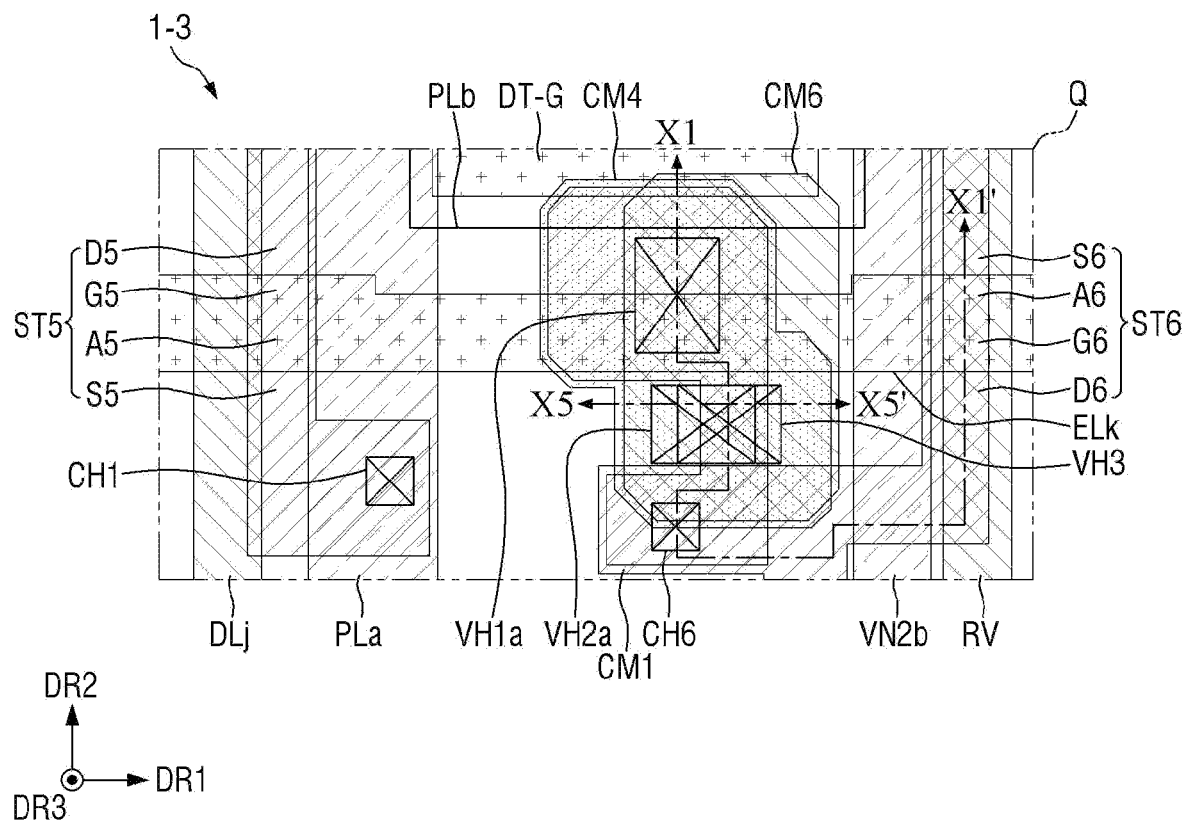
FIG. 24 is a schematic plan view illustrating still another modified example of the display device illustrated in FIG. 13.
Figure 25:
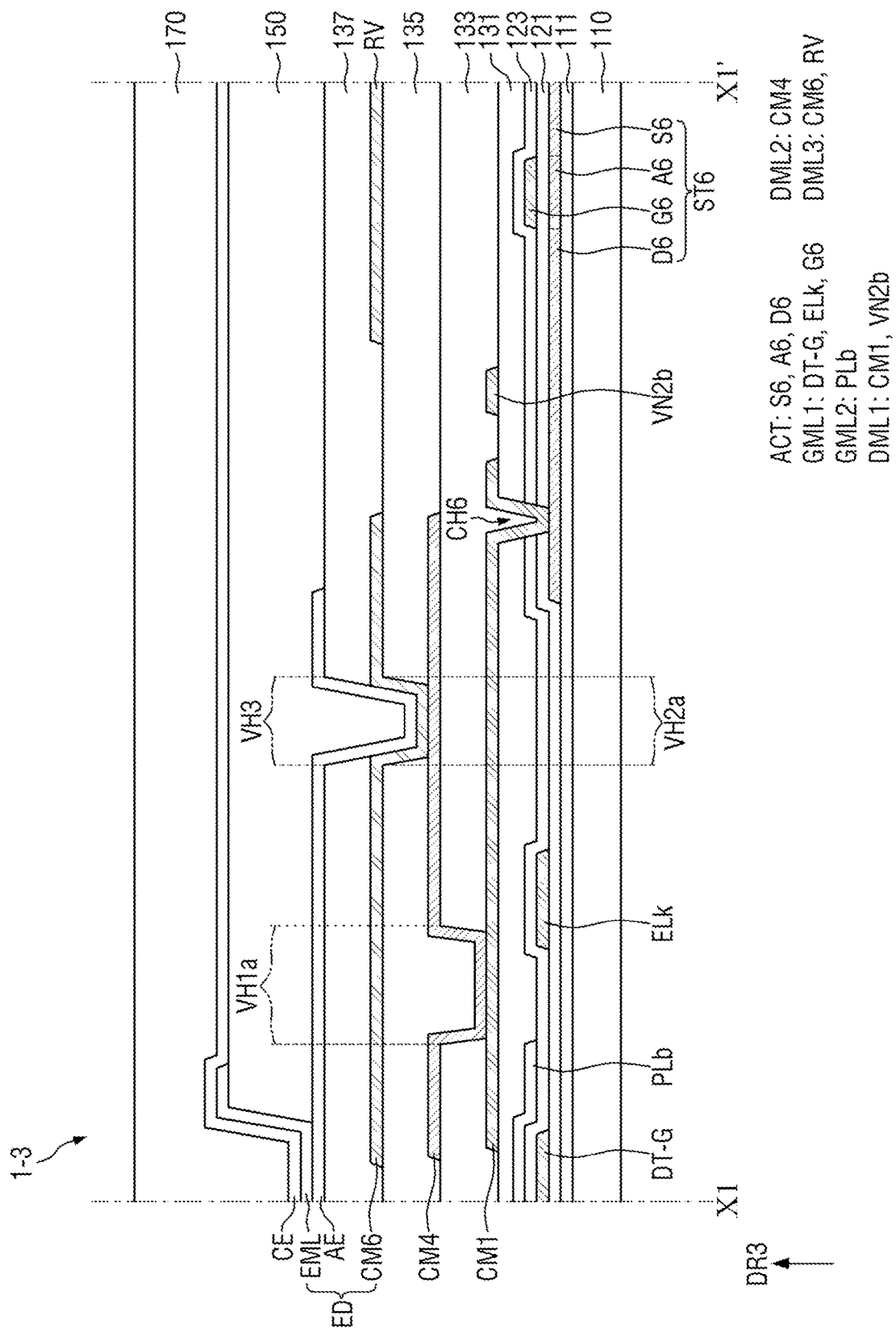
FIG. 25 is a schematic cross-sectional view taken along line X1-X1' of FIG. 24.
Figure 26:
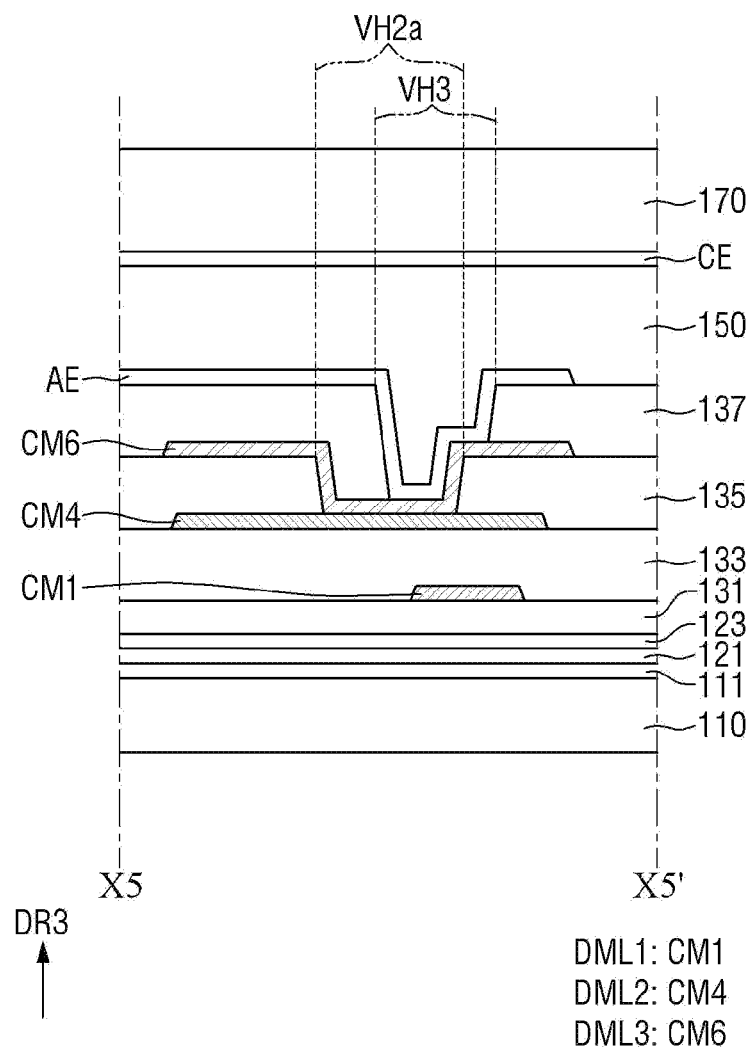
FIG. 26 is a schematic cross-sectional view taken along line X5-X5' of FIG. 24.

FIG. 24 is a schematic plan view illustrating still another modified example of the display device illustrated in FIG. 13, FIG. 25 is a schematic cross-sectional view taken along line X1-X1' of FIG. 24, and FIG. 26 is a schematic cross-sectional view taken along line X5-X5' of FIG. 24.

Referring to FIGS. 24 to 26, in a display device 1-3 according to an embodiment, the first intermediate via hole VH2a and the upper via hole VH3 may partially overlap each other, and the first lower via hole VH1a may not overlap the first intermediate via hole VH2a and may not overlap the upper via hole VH3.

Describing a relationship between connection patterns, the second contact portion of the fourth connection pattern CM4 contacting the sixth connection pattern CM6 may overlap the third contact portion of the sixth connection pattern CM6 directly contacting the first electrode AE. The first contact portion of the first connection pattern CM1 contacting the fourth connection pattern CM4 may not overlap the second contact portion of the fourth connection pattern CM4 contacting the sixth connection pattern CM6, and may not overlap the third contact portion of the sixth connection pattern CM6 directly contacting the first electrode AE.

Figure 27:
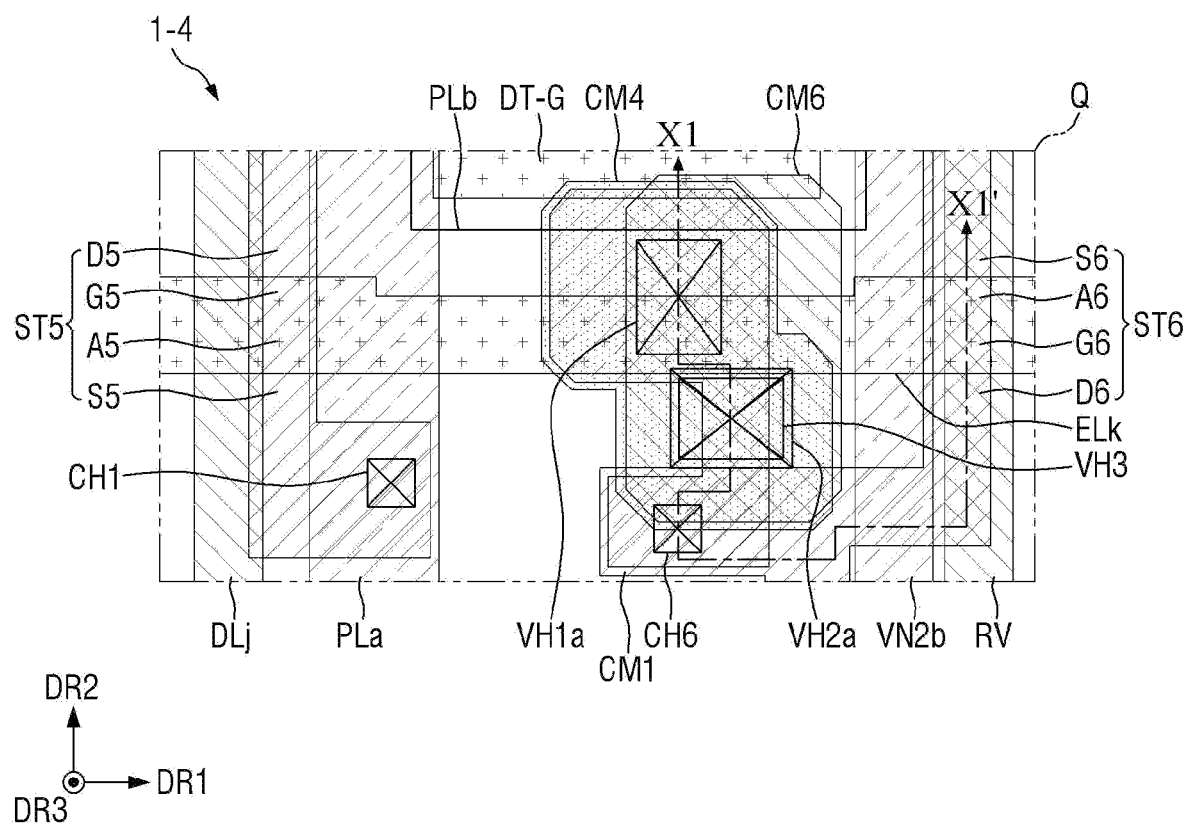
FIG. 27 is a schematic plan view illustrating still another modified example of the display device illustrated in FIG. 13.
Figure 28:
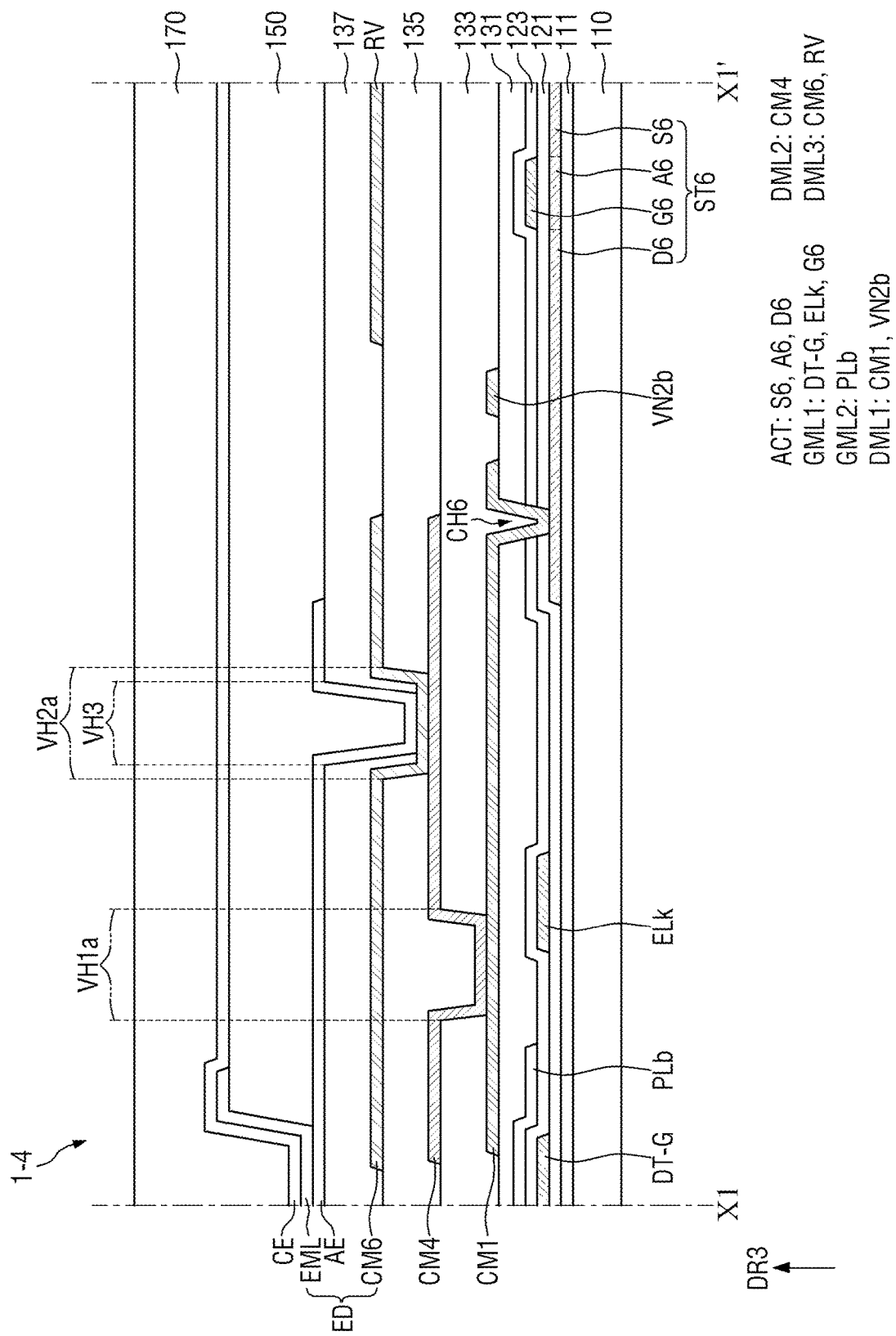
FIG. 28 is a schematic cross-sectional view taken along line X1-X1' of FIG. 27.

FIG. 27 is a schematic plan view illustrating still another modified example of the display device illustrated in FIG. 13, and FIG. 28 is a schematic cross-sectional view taken along line X1-X1' of FIG. 27.

Referring to FIGS. 27 and 28, in a display device 1-4 according to an embodiment, the first intermediate via hole VH2a and the upper via hole VH3 may overlap each other, and the first lower via hole VH1a may not overlap the first intermediate via hole VH2a and may not overlap the upper via hole VH3.

In a plan view, the first intermediate via hole VH2a may completely surround the upper via hole VH3. In some embodiments, in a plan view, an area of the first intermediate via hole VH2a may be greater than an area of the upper via hole VH3.

In some embodiments, the upper via hole VH3 may completely overlap the first intermediate via hole VH2a.

In some embodiments, the entirety of the third contact portion of the sixth connection pattern CM6 directly contacting with the first electrode AE may completely overlap the second contact portion of the fourth connection pattern CM4 directly contacting the sixth connection pattern CM6.

Figure 29:
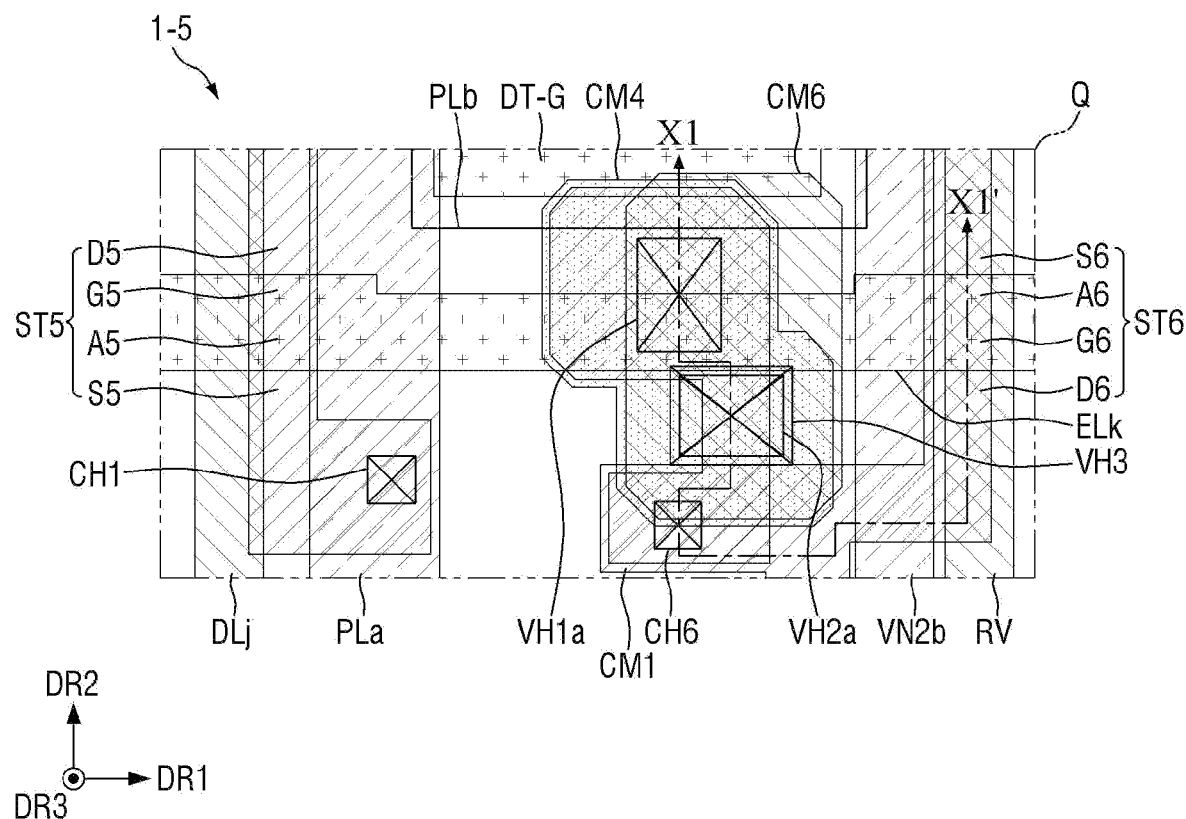
FIG. 29 is a schematic plan view illustrating still another modified example of the display device illustrated in FIG. 13.
Figure 30:
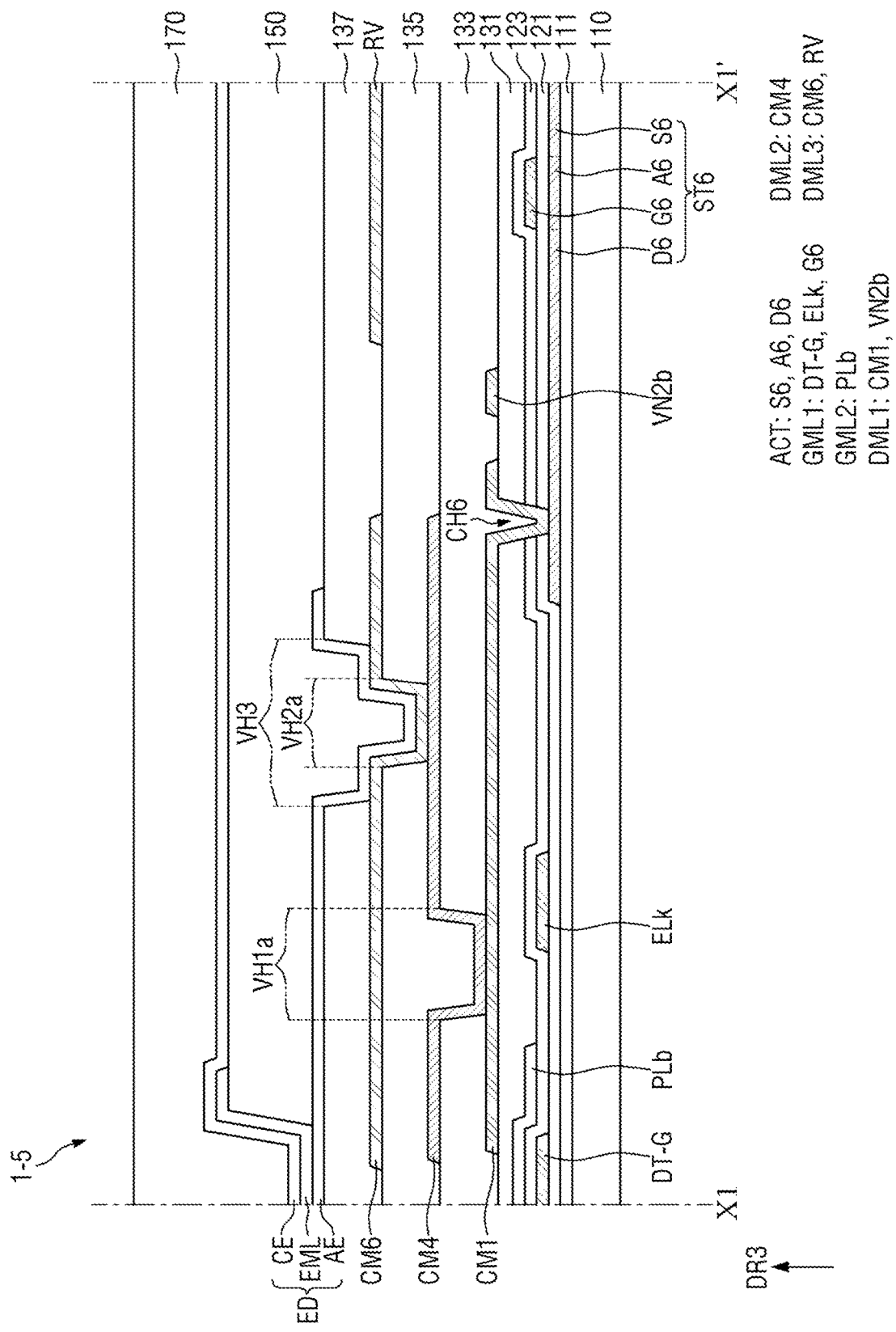
FIG. 30 is a schematic cross-sectional view taken along line X1-X1' of FIG. 29.

FIG. 29 is a schematic plan view illustrating still another modified example of the display device illustrated in FIG. 13, and FIG. 30 is a schematic cross-sectional view taken along line X1-X1' of FIG. 29.

Referring to FIGS. 29 and 30, in a display device 1-5 according to an embodiment, the first intermediate via hole VH2a and the upper via hole VH3 may overlap each other, and the first lower via hole VH1a may not overlap the first intermediate via hole VH2a and may also not overlap the upper via hole VH3.

In a plan view, the upper via hole VH3 may completely surround the first intermediate via hole VH2a. In some embodiments, in a plan view, an area of the first intermediate via hole VH2a may be smaller than an area of the upper via hole VH3.

In some embodiments, the first intermediate via hole VH2a may completely overlap the upper via hole VH3.

In some embodiments, the entirety of the second contact portion of the fourth connection pattern CM4 directly contacting the sixth connection pattern CM6 may completely overlap the third contact portion of the sixth connection pattern CM6 directly contacting the first electrode AE.

Figure 31:
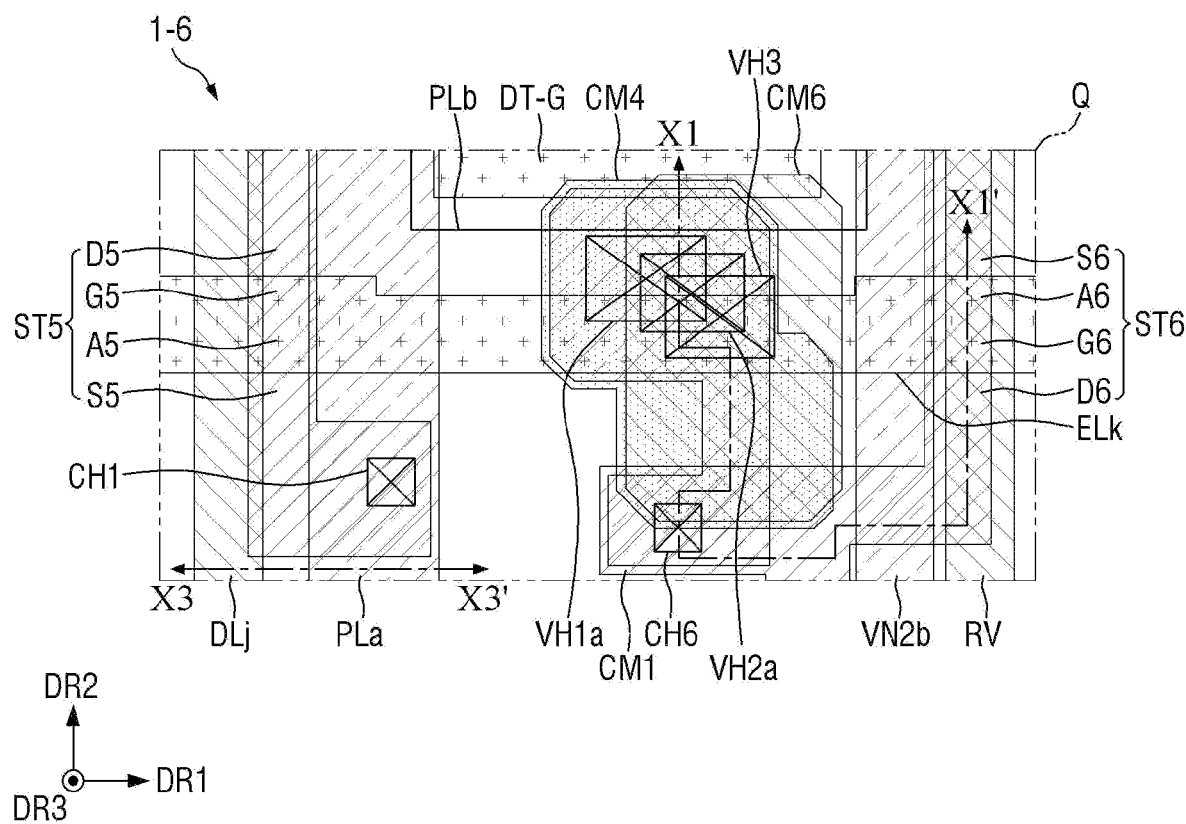
FIG. 31 is a schematic plan view illustrating still another modified example of the display device illustrated in FIG. 13.
Figure 32:
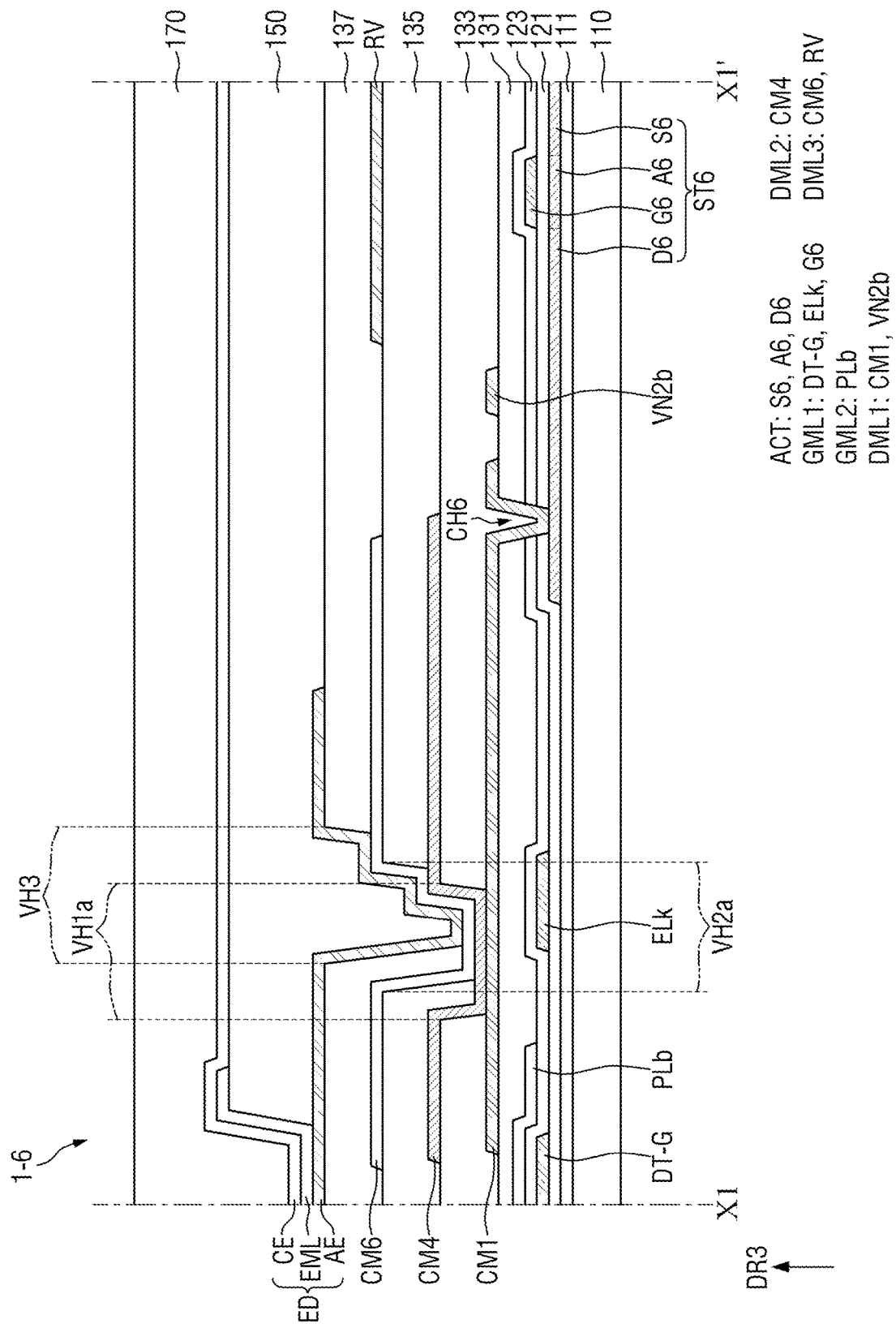
FIG. 32 is a schematic cross-sectional view taken along line X1-X1' of FIG. 21.

FIG. 31 is a schematic plan view illustrating still another modified example of the display device illustrated in FIG. 13, and FIG. 32 is a schematic cross-sectional view taken along line X1-X1' of FIG. 21.

Referring to FIGS. 31 and 32, in a display device 1-6 according to an embodiment, all of the first lower via hole VH1a, the first intermediate via hole VH2a, and the upper via hole VH3 may overlap each other.

In some embodiments, the first contact portion of the first connection pattern CM1 directly contacting the fourth connection pattern CM4, the second contact portion of the fourth connection pattern CM4 directly contacting the sixth connection pattern CM6, and the third contact portion of the sixth connection pattern CM6 directly contacting the first electrode AE may overlap each other.

A structure of the display device such as a structure in which the first lower via hole VH1a and the first intermediate via hole VH2a overlap each other and the upper via hole VH3 does not overlap the first lower via hole VH1a and the first intermediate via hole VH2a may be variously modified.

Figure 33:
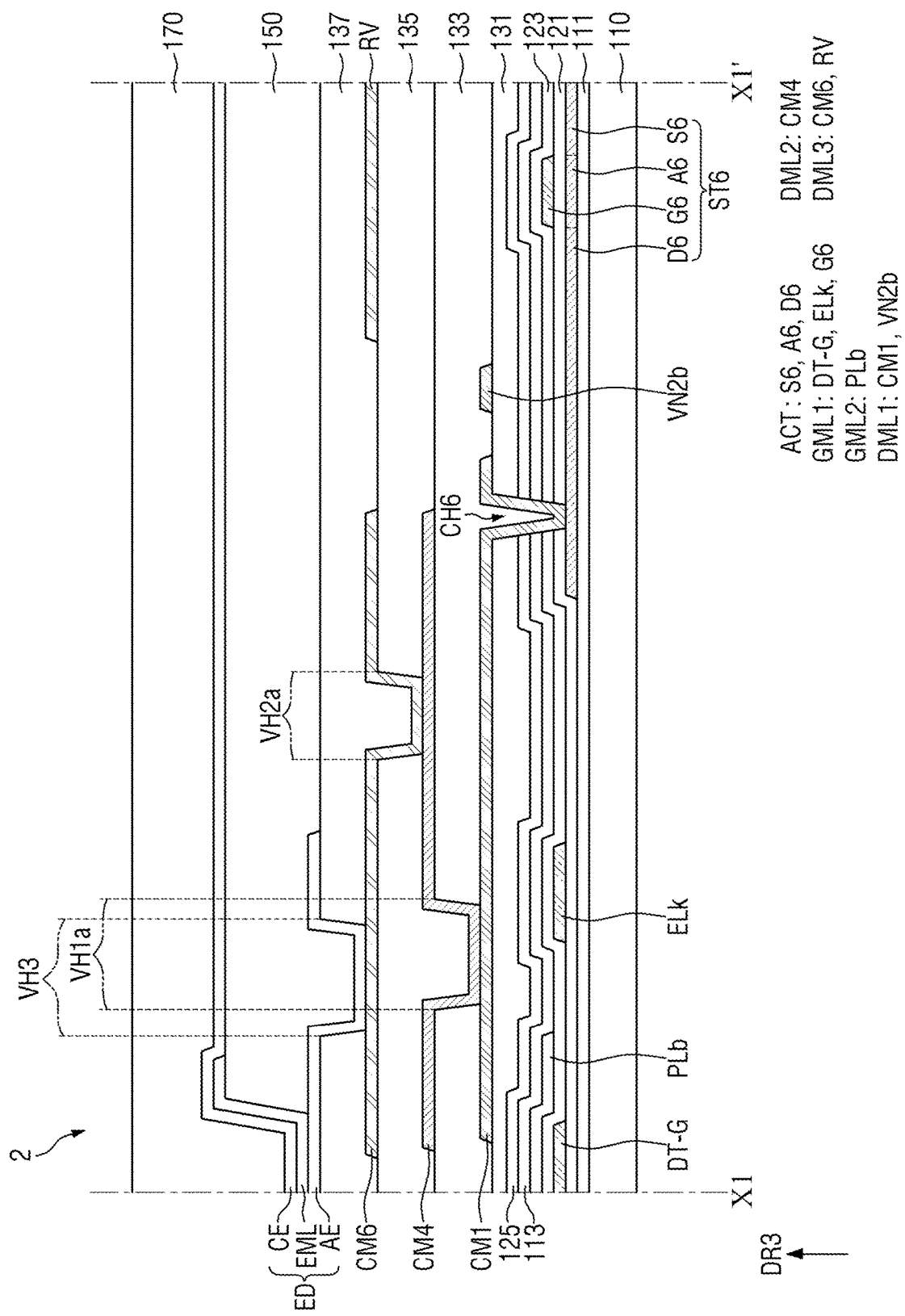
FIGS. 33 and 34 are schematic cross-sectional views illustrating still another modified example of the display device illustrated in FIGS. 14 and 17, respectively.
Figure 34:
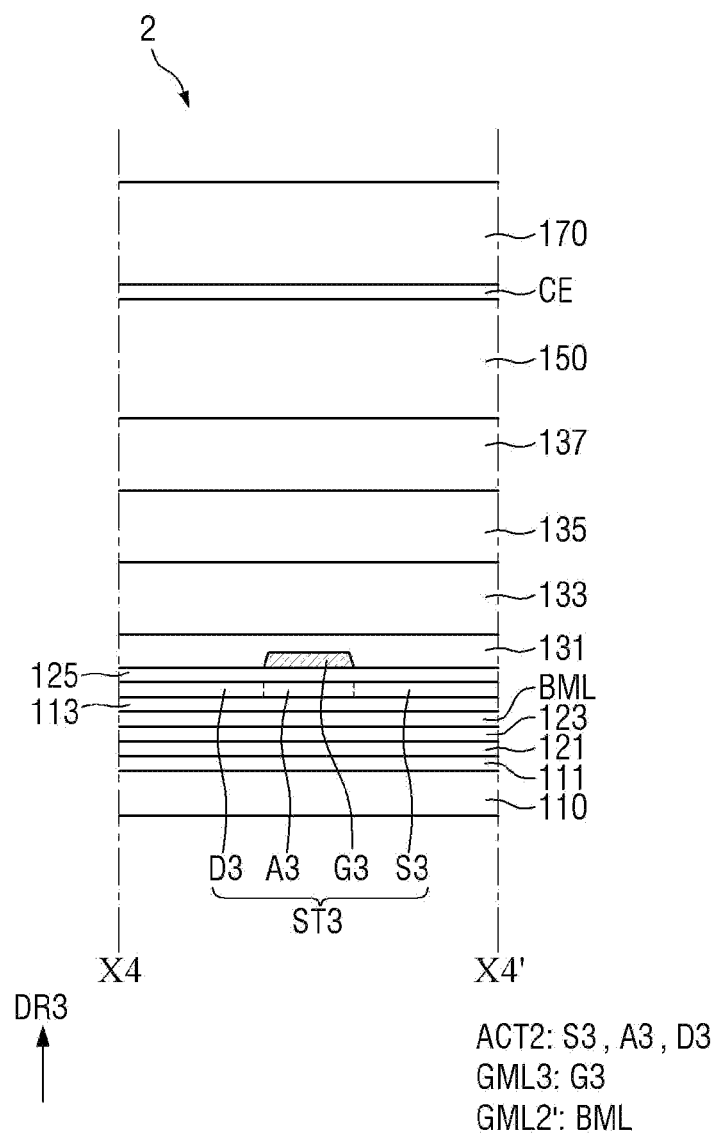

FIGS. 33 and 34 are schematic cross-sectional views illustrating still another modified example of the display device illustrated in FIGS. 14 and 17, respectively.

Referring to FIGS. 33 and 34, a display device 2 according to an embodiment has the greatest difference from the display device described above with reference to FIGS. 1 to 17 in that some of the transistors illustrated in FIG. 5 include an active layer made of polycrystalline silicon and others of the transistors include an active layer made of an oxide semiconductor. For example, in the display device 2 according to the embodiment, each of the first transistor ST1 (see FIG. 5) and the third transistor ST3 (see FIG. 5) of the transistors illustrated in FIG. 5 is not a dual transistor, and may include an active layer made of an oxide semiconductor. The other transistors may include an active layer made of polycrystalline silicon.

The polycrystalline silicon has high reliability, and thus, control may be performed so that an accurately intended current flows. Accordingly, a display device having high resolution may be provided by causing the driving transistor DT (see FIG. 5) directly affecting brightness of the display device to include an active layer made of polycrystalline silicon having high reliability. On the other hand, the oxide semiconductor has high carrier mobility and a low leakage current, and thus, a voltage drop is not large even though a driving time is long. For example, in a case of the oxide semiconductor, even at the time of driving at a low frequency, a color change of an image according to a voltage drop is not large, and thus, driving at a low frequency is possible. Accordingly, a display device with reduced power consumption while preventing generation of a leakage current may be provided by causing the first transistor ST1 (see FIG. 5) and the third transistor ST3 (see FIG. 5) to include the oxide semiconductor.

In some embodiments, in case that the first transistor ST1 (see FIG. 5) and the third transistor ST3 (see FIG. 5) include an oxide semiconductor, the first transistor ST1 (see FIG. 5) and the third transistor ST3 (see FIG. 5) may be n-type thin-film transistors.

Describing the stacked structure, in the display device 2, a buffer layer 113 is further positioned on a second gate insulating layer 123, a semiconductor layer ACT2 made of an oxide semiconductor is further positioned on the buffer layer 113, a third gate insulating film 125 is positioned on the semiconductor layer ACT2, and a third gate conductive layer GML3 including a gate electrode G3 of the third transistor ST3 is positioned on the third gate insulating film 125. A light blocking metal BML, blocking an electrostatic potential from affecting the semiconductor layer ACT2 may be further positioned between the semiconductor layer ACT2 made of an oxide semiconductor and the second gate insulating layer 123. In some embodiments, the light blocking metal BML may be included in a second gate conductive layer GML2'.

In the display device 2 according to the embodiment, a relationship between a first lower via hole VH1a, a first intermediate via hole VH2a, and an upper via hole VH3 may be the same as described above with reference to FIGS. 1 to 17. In the display device 2, the relationship between the first lower via hole VH1a, the first intermediate via hole VH2a, and the upper via hole VH3 may be modified into the structures described above with reference to FIGS. 18 to 32.

Figure 35:
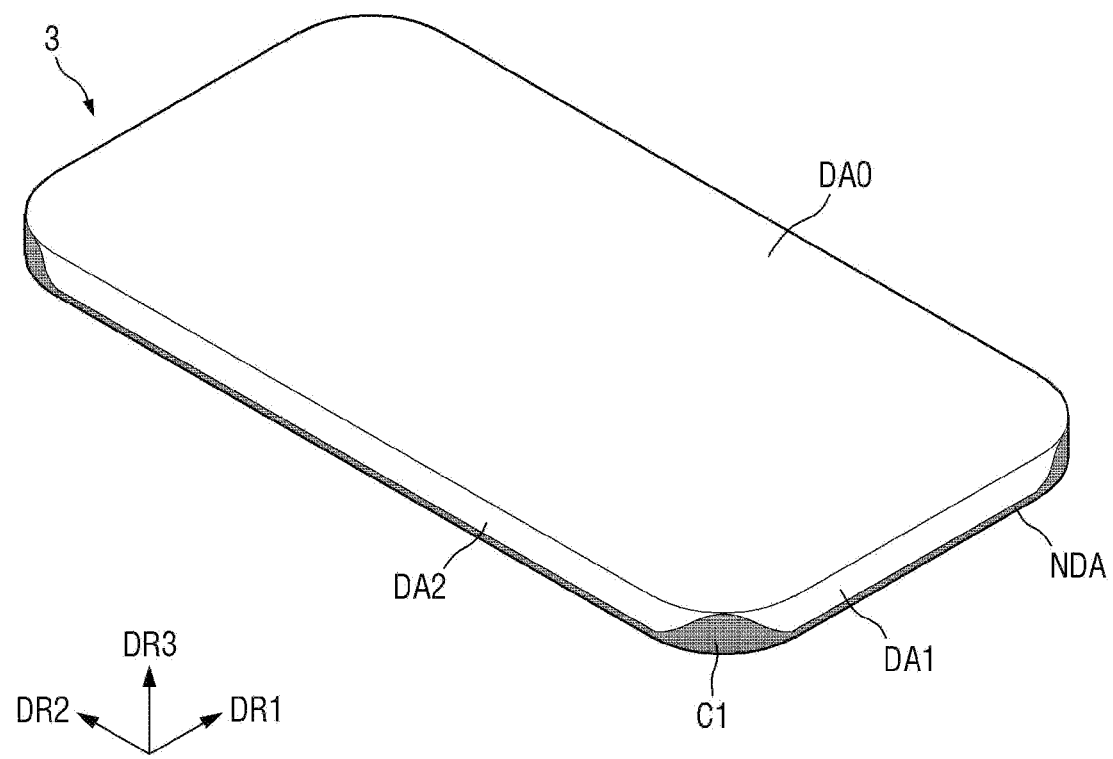
FIG. 35 is a schematic perspective view of a display device according to another embodiment.
Figure 36:
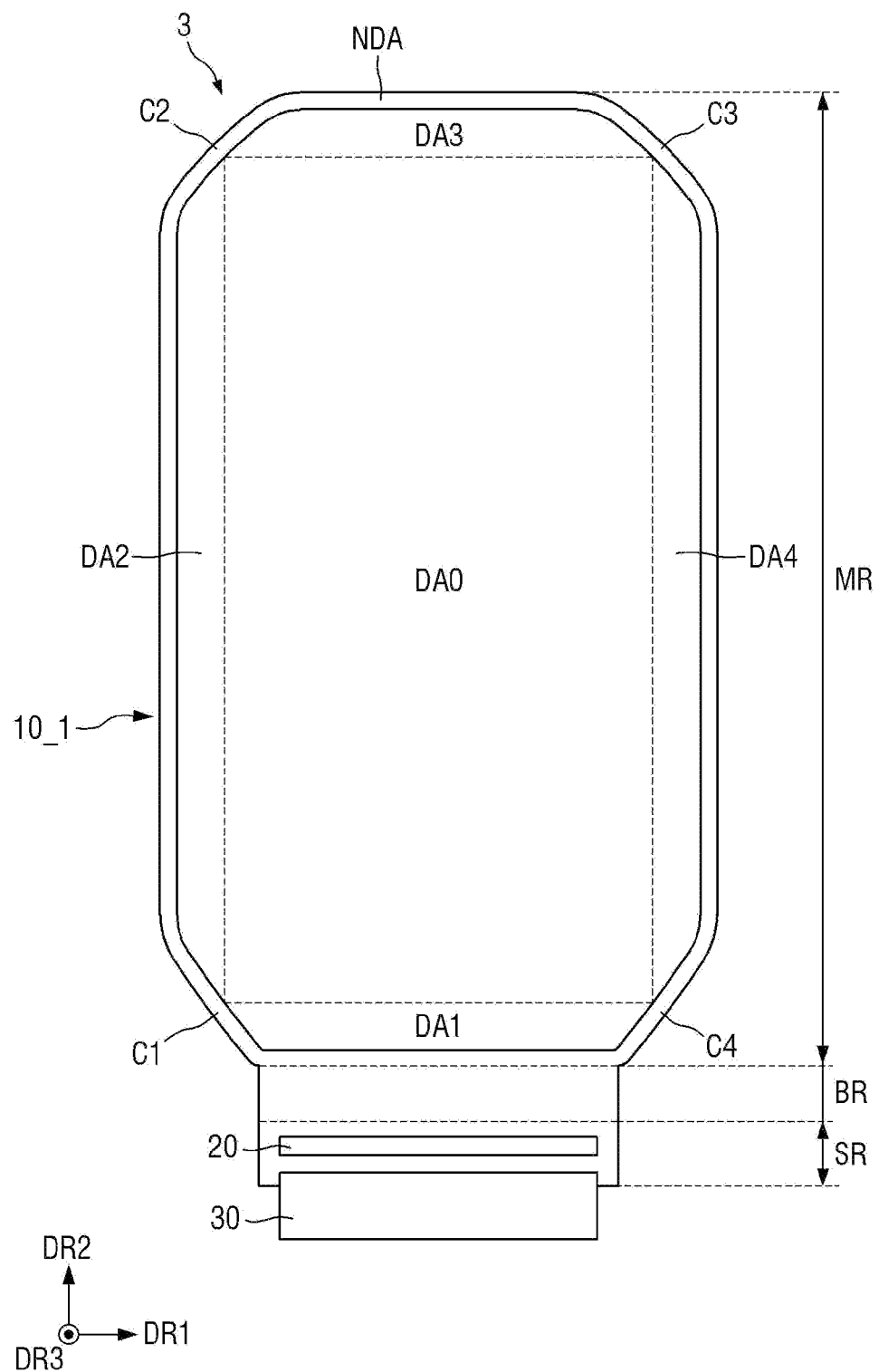
FIG. 36 is a schematic plan view illustrating the display device of FIG. 35 in a developed state.

FIG. 35 is a schematic perspective view of a display device according to another embodiment, and FIG. 36 is a schematic plan view illustrating the display device of FIG. 35 in an unfolded state.

Referring to FIGS. 35 and 36, a display device 3 according to an embodiment is different from the display device according to the embodiment described above with reference to FIGS. 1 to 17 in that a main region MR includes a front surface display area DA0, side surface display areas DA1, DA2, DA3, and DA4, and corner areas C1, C2, C3, and C4.

The front surface display area DA0 and the side surface display areas DA1, DA2, DA3, and DA4 may be a display area DA displaying an image. The corner areas C1, C2, C3, and C4 may be a non-display area NDA that does not display an image, and may provide spaces in which lines, circuits, and the like, are disposed.

The front surface display area DA0 may have a rectangular shape including two short sides extending in the first direction DR1 and two long sides extending in the second direction DR2. However, the disclosure is not limited thereto, and the front surface display area DA0 may also have a polygonal shape in which corners where the short sides and the long sides meet are rounded.

The side surface display areas DA1, DA2, DA3, and DA4 may include a first side surface display area DA1, a second side surface display area DA2, a third side surface display area DA3, and a fourth side surface display area DA4.

The first side surface display area DA1 may extend from an edge of the front surface display area DA0 in a direction opposite to the second direction DR2, the second side surface display area DA2 may extend from an edge of the front surface display area DA0 in a direction opposite to the first direction DR1, the third side surface display area DA3 may extend from an edge of the front surface display area DA0 in the second direction DR2, and the fourth side surface display area DA4 may extend from an edge of the front surface display area DA0 in the first direction DR1.

The first to fourth side surface display areas DA1, DA2, DA3, and DA4 may have substantially a same function or configuration except for positions thereof. Hereinafter, common features of the first to fourth side surface display areas DA1, DA2, DA3, and DA4 will be described on the basis of the first side surface display area DA1, and an overlapping description will be omitted.

The first side surface display area DA1 may extend outward from the edge of the front surface display area DA0 and be bent at a predetermined angle. For example, the first side surface display area DA1 may be bent at an angle of about 90° or more to about 150° or less with respect to the front surface display area DA0.

The first side surface display area DA1 may be connected to the bending region BR. As illustrated in FIG. 35, in case that the first side surface display area DA1 is disposed to be vertically curved or bent with respect to the front surface display area DA0, the bending region BR is vertically curved or bent once more with respect to the first side surface display area DA1 (for example, the bending region BR is curved or bent at an angle of about 180° with respect to the front surface display area DA0), such that the sub-region SR positioned at a side of the bending region BR may be disposed below the front surface display area DA0 in a thickness direction of the front surface display area DA0. The sub-region SR may overlap the front surface display area DA0 and may be disposed parallel to the front surface display area DA0.

The corner areas C1, C2, C3, and C4 may be positioned between the side surface display areas DA1, DA2, DA3, and DA4. The corner areas C1, C2, C3, and C4 may include first to fourth corner areas C1, C2, C3, and C4 each positioned between the first to fourth side surface display areas DA1, DA2, DA3, and DA4. The first to fourth corner areas C1, C2, C3, and C4 may be disposed adjacent, respectively, to four corners where the long sides and the short sides of the front surface display area DA0 meet. The first to fourth corner areas C1, C2, C3, and C4 may have substantially a same function or configuration except for positions thereof. Hereinafter, common features of the first to fourth corner areas C1, C2, C3, and C4 will be described on the basis of the first corner area C1, and an overlapping description will be omitted.

The first corner area C1 may be positioned between the first side surface display area DA1 and the second side surface display area DA2. One end (or first end) of the first corner area C1 may contact the first side surface display area DA1, and the other end (or second end) of the first corner area C1 may contact the second side surface display area DA2.

The first corner area C1 may extend from the front surface display area DA0 and be rounded with a predetermined curvature. A curvature of the first corner area C1 with respect to the front surface display area DA0 may be greater than a curvature of the first side surface display area DA1 and the second side surface display area DA2 with respect to the front surface display area DA0.

In some embodiments, data voltages may be provided to data lines positioned in the second side surface display area DA2 or the fourth side surface display area DA4, through the connection lines (the horizontal connection line and the vertical connection line) described above with respect to FIG. 4. In some embodiments, connections between the connection lines and the data lines positioned in the second side surface display area DA2 or the fourth side surface display area DA4 may be made within the display area as illustrated in FIG. 4. As another example, in some other embodiments, connections between the connection lines and the data lines may be made within the first corner area C1.

Although the embodiments of the disclosure have been disclosed for illustrative purposes, those skilled in the art will appreciate that various modifications, additions and substitutions are possible, without departing from the scope and spirit of the disclosure.

What is claimed is:

1. A display device comprising:
  a driving transistor disposed on a surface of a substrate;
  a transistor disposed on the surface of the substrate and electrically connected to the driving transistor;
  a first insulating layer disposed on a gate electrode of the driving transistor and a gate electrode of the transistor;
  a first data conductive layer disposed on the first insulating layer and including a first connection pattern electrically connected to the transistor;
  a second insulating layer disposed on the first data conductive layer and including a lower via hole which exposes the first connection pattern;
  a second data conductive layer disposed on the second insulating layer, the second data conductive layer including a second connection pattern electrically connected to the first connection pattern through the lower via hole and a first conductive line extending in a first direction;
  a third insulating layer disposed on the second data conductive layer and including an intermediate via hole which exposes the second connection pattern;
  a third data conductive layer disposed on the third insulating layer, the third data conductive layer including:
    a third connection pattern electrically connected to the second connection pattern through the intermediate via hole;
    a second conductive line extending in a second direction intersecting the first direction; and
    a first data line which extends in the second direction and to which a data voltage provided to the gate electrode of the driving transistor is applied;
  a fourth insulating layer disposed on the third data conductive layer and including an upper via hole which exposes the third connection pattern; and
  a light emitting element disposed on the fourth insulating layer, the light emitting element including a first electrode electrically connected to the third connection pattern through the upper via hole,
  wherein at least two of the lower via hole, the intermediate via hole, and the upper via hole overlap each other in a third direction perpendicular to the surface of the substrate.

2. The display device of claim 1, wherein
  the lower via hole and the upper via hole overlap each other in the third direction, and
  the intermediate via hole does not overlap the lower via hole and the upper via hole in the third direction.

3. The display device of claim 2, wherein a portion of the first connection pattern electrically contacting the second connection pattern overlaps a portion of the third connection pattern electrically contacting the first electrode of the light emitting element in the third direction.

4. The display device of claim 2, wherein one of the lower via hole and the upper via hole completely surrounds the other of the lower via hole and the upper via hole in a plan view.

5. The display device of claim 2, wherein
  the intermediate via hole and the upper via hole overlap each other in the third direction, and
  the lower via hole does not overlap the intermediate via hole and the upper via hole in the third direction.

6. The display device of claim 5, wherein a portion of the second connection pattern electrically contacting the third connection pattern overlaps a portion of the third connection pattern electrically contacting the first electrode of the light emitting element in the third direction.

7. The display device of claim 5, wherein one of the intermediate via hole and the upper via hole completely surrounds the other of the intermediate via hole and the upper via hole in a plan view.

8. The display device of claim 1, wherein the lower via hole, the intermediate via hole, and the upper via hole overlap each other in the third direction.

9. The display device of claim 1, wherein
the first data conductive layer further includes a first voltage line which extends in the second direction and to which a first driving voltage provided to the driving transistor is applied, and
the first data line includes a portion spaced apart from the first voltage line by a first distance in the first direction in a plan view.

10. The display device of claim 9, wherein the first distance is about 1 μm to about 4 μm.

11. The display device of claim 1, further comprising:
an initialization voltage line which is disposed between the substrate and the first insulating layer and to which an initialization voltage is applied, wherein
the initialization voltage line extends in the first direction, and
the first conductive line overlaps the initialization voltage line in the third direction.

12. The display device of claim 11, wherein the first conductive line completely overlaps the initialization voltage line in a plan view.

13. The display device of claim 1, wherein
one of the first conductive line and the second conductive line is electrically connected to a second data line, and
a data voltage provided to the second data line is applied to the one of the first conductive line and the second conductive line.

14. The display device of claim 13, wherein the other one of the first conductive line and the second conductive line is a dummy line.

15. The display device of claim 13, wherein the first conductive line and the second conductive line are electrically connected to each other.

16. A display device comprising:
a driving transistor disposed on a surface of a substrate;
a transistor disposed on the surface of the substrate and electrically connected to the driving transistor;
a first data conductive layer disposed on a gate electrode of the transistor and including a first connection pattern electrically connected to the transistor;
a second data conductive layer disposed on the first data conductive layer, the second data conductive layer including a second connection pattern electrically connected to the first connection pattern and a first conductive line which extends in a first direction and is insulated from the first data conductive layer;
a third data conductive layer disposed on the second data conductive layer, the third data conductive layer including a third connection pattern electrically connected to the second connection pattern, a second conductive line extending in a second direction intersecting the first direction, and a first data line which extends in the second direction and to which a data voltage provided to a gate electrode of the driving transistor is applied; and
a light emitting element disposed on the third data conductive layer and including a first electrode electrically connected to the third connection pattern,
wherein at least two of a first contact portion of the first connection pattern electrically contacting the second connection pattern, a second contact portion of the second connection pattern electrically contacting the third connection pattern, and a third contact portion of the third connection pattern electrically contacting the first electrode of the light emitting element overlap each other in a third direction perpendicular to the surface of the substrate.

17. The display device of claim 16, wherein
the first contact portion and the third contact portion overlap each other in the third direction, and
the second contact portion does not overlap the first contact portion and the third contact portion in the third direction.

18. The display device of claim 17, wherein one of the first contact portion and the third contact portion completely overlaps the other of the first contact portion and the third contact portion in the third direction.

19. The display device of claim 16, wherein the second contact portion and the third contact portion overlap each other in the third direction.

20. The display device of claim 19, wherein all of the first contact portion, the second contact portion, and the third contact portion overlap each other in the third direction.

* * * * *